US010223960B2

(12) United States Patent
Inoue et al.

(10) Patent No.: US 10,223,960 B2
(45) Date of Patent: Mar. 5, 2019

(54) RECEIVER FOR RECEIVING DIFFERENTIAL SIGNAL, IC INCLUDING RECEIVER, AND DISPLAY DEVICE

(71) Applicant: Semiconductor Energy Laboratory Co., Ltd., Atsugi-shi, Kanagawa-ken (JP)

(72) Inventors: Hiroki Inoue, Kanagawa (JP); Kei Takahashi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/684,085

(22) Filed: Aug. 23, 2017

(65) Prior Publication Data

US 2018/0061307 A1 Mar. 1, 2018

(30) Foreign Application Priority Data

Aug. 30, 2016 (JP) ................................. 2016-167915

(51) Int. Cl.
*G09G 3/36* (2006.01)
*G09G 3/20* (2006.01)
(Continued)

(52) U.S. Cl.
CPC ......... *G09G 3/2096* (2013.01); *G09G 3/3275* (2013.01); *G09G 3/3648* (2013.01);
(Continued)

(58) Field of Classification Search
CPC ............ H04L 25/0278; H04L 25/0298; G09G 3/2096; G09G 3/3677; G09G 2300/0408;
(Continued)

(56) References Cited

U.S. PATENT DOCUMENTS 7,167,027 B2  1/2007  Matsuo et al.
7,315,185 B2  1/2008  Yu et al.
(Continued)

FOREIGN PATENT DOCUMENTS

JP    2003-157026 A    5/2003
JP    2003-318726 A    11/2003
(Continued)

OTHER PUBLICATIONS

International Search Report (Application No. PCT/IB2017/055070) dated Nov. 28, 2017.
(Continued)

*Primary Examiner* — Nelson Rosario
(74) *Attorney, Agent, or Firm* — Fish & Richardson P.C.

(57) ABSTRACT

The transmission delay time of a receiver for receiving a differential signal is reduced. A first amplifier circuit is provided in an input stage of the receiver, and a second amplifier circuit is provided in an output stage of the receiver. The first amplifier circuit is a differential input, differential output amplifier circuit. The second amplifier circuit is a differential input, single-ended output amplifier circuit. A first power supply voltage and a second power supply voltage are input as a high-level power supply voltage and a low-level power supply voltage to the first amplifier circuit and the second amplifier circuit, respectively. The withstand voltage of transistors of a differential pair of the first amplifier circuit is higher than the withstand voltage of another transistor included in the first amplifier circuit and a transistor included in the second amplifier circuit.

20 Claims, 34 Drawing Sheets

(51) Int. Cl.
| | |
|---|---|
| *H01L 27/32* | (2006.01) |
| *H03F 3/45* | (2006.01) |
| *G09G 3/3275* | (2016.01) |
| *H03F 3/195* | (2006.01) |
| *H03F 3/30* | (2006.01) |
| *H03F 3/68* | (2006.01) |
| *H01L 27/12* | (2006.01) |
| *G09G 5/02* | (2006.01) |

(52) U.S. Cl.
CPC ......... *G09G 3/3677* (2013.01); *G09G 3/3688* (2013.01); *H01L 27/3211* (2013.01); *H01L 27/3244* (2013.01); *H03F 3/195* (2013.01); *H03F 3/3022* (2013.01); *H03F 3/45183* (2013.01); *H03F 3/45192* (2013.01); *H03F 3/45219* (2013.01); *H03F 3/45475* (2013.01); *H03F 3/68* (2013.01); *G09G 5/026* (2013.01); *G09G 2300/046* (2013.01); *G09G 2300/0408* (2013.01); *G09G 2300/0871* (2013.01); *G09G 2310/0286* (2013.01); *G09G 2310/0291* (2013.01); *G09G 2320/0666* (2013.01); *G09G 2330/06* (2013.01); *G09G 2340/02* (2013.01); *G09G 2360/121* (2013.01); *G09G 2360/144* (2013.01); *G09G 2360/18* (2013.01); *G09G 2370/08* (2013.01); *G09G 2370/14* (2013.01); *H01L 27/1225* (2013.01); *H03F 2203/45652* (2013.01)

(58) Field of Classification Search
CPC .... G09G 2300/0871; G09G 2310/0291; H01L 27/3211; H01L 27/3244; H01L 27/1225; H03F 3/195; H03F 3/3022; H03F 3/45183; H03F 3/45192; H03F 3/45219; H03F 3/45475; H03F 3/68
See application file for complete search history.

(56) References Cited

U.S. PATENT DOCUMENTS

| | | | |
|---|---|---|---|
| 8,295,424 | B2* | 10/2012 | Choi ................ G09G 3/20 327/108 |
| 2003/0052869 | A1 | 3/2003 | Fujii et al. |
| 2003/0201800 | A1 | 10/2003 | Matsuo et al. |
| 2006/0072047 | A1 | 4/2006 | Sekiguchi |
| 2007/0018686 | A1 | 1/2007 | Yu et al. |
| 2007/0075935 | A1 | 4/2007 | Mesmer et al. |
| 2007/0182690 | A1* | 8/2007 | Lin ................ G09G 3/3611 345/100 |
| 2011/0291760 | A1 | 12/2011 | Maruyama |
| 2016/0070386 | A1 | 3/2016 | Yamamoto et al. |

FOREIGN PATENT DOCUMENTS

| | | |
|---|---|---|
| JP | 2004-112424 A | 4/2004 |
| JP | 2007-028600 A | 2/2007 |
| JP | 2015-185940 A | 10/2015 |
| KR | 2007-0008245 A | 1/2007 |
| WO | WO-2004/053819 | 6/2004 |
| WO | WO-2007/041150 | 4/2007 |

OTHER PUBLICATIONS

Written Opinion (Application No. PCT/IB2017/055070) dated Nov. 28, 2017.

Boni.A et al., "LVDS I/O Interface for Gb/s-per-Pin Operation in 0.35-μm CMOS", IEEE Journal of Solid-State Circuits, Apr. 1, 2001, vol. 36, No. 4, pp. 706-711.

Fei.Z et al., "A LVDS Transceiver Chip Design in 0.5um CMOS Technology", CISP '08 (Congress on Image and Signal Processing 2008), May 27, 2008, pp. 124-127.

* cited by examiner

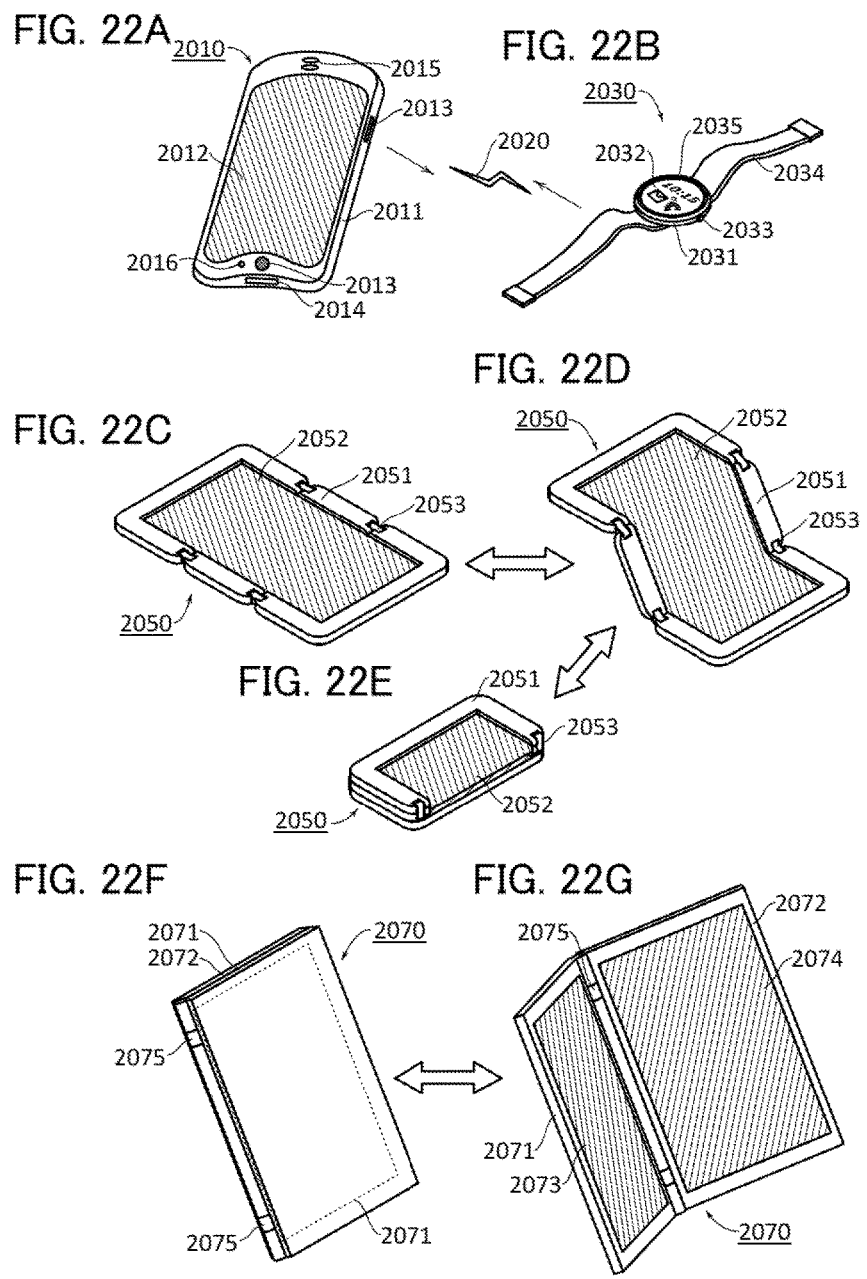

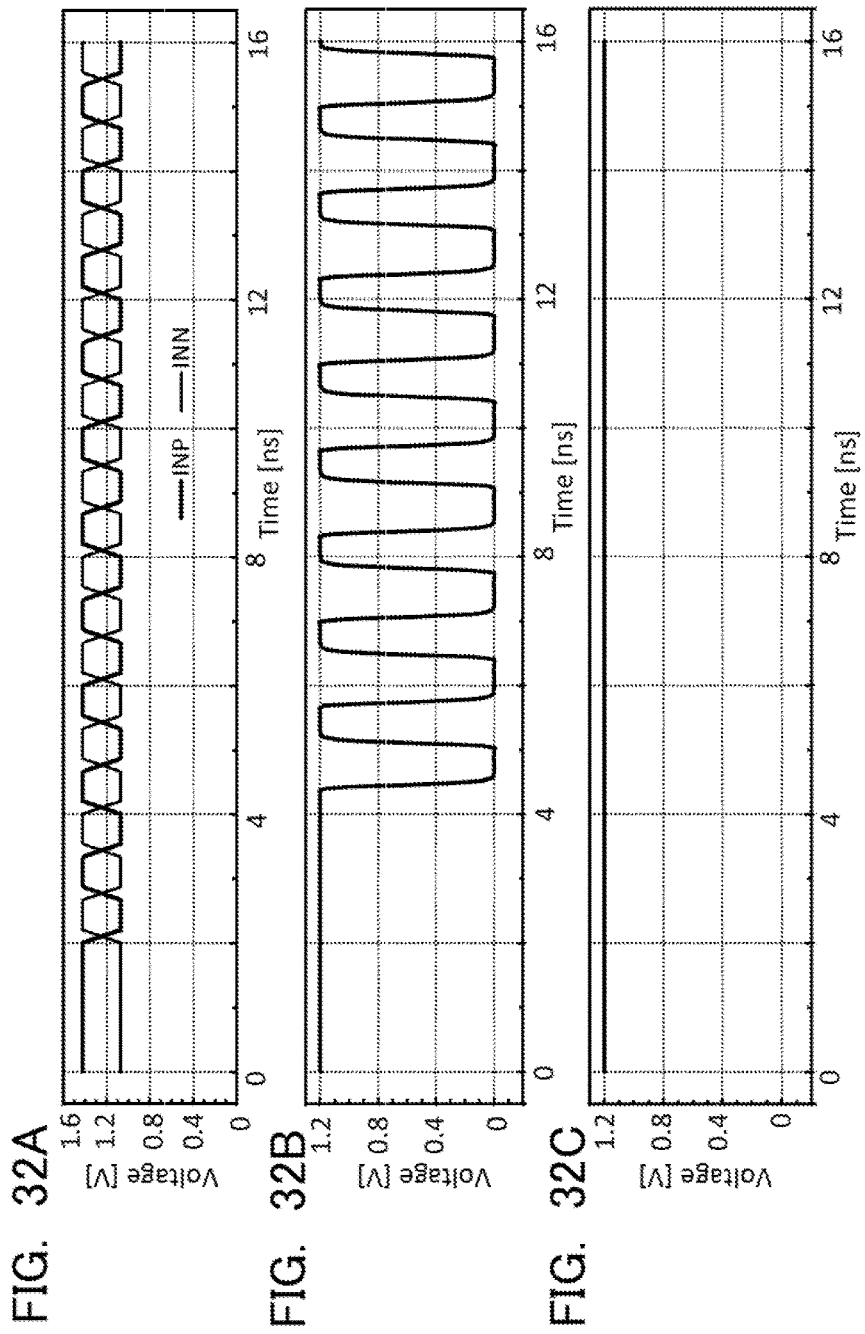

RECEIVER FOR RECEIVING DIFFERENTIAL SIGNAL, IC INCLUDING RECEIVER, AND DISPLAY DEVICE

TECHNICAL FIELD

The specification, drawings, and claims of this application (hereinafter referred to as "this specification and the like") relate to a semiconductor device, an electronic component, an electronic device, operating methods thereof, and manufacturing methods thereof. Examples of a technical field of one embodiment of the present invention include a semiconductor device, a memory device, a processing device, a switch circuit (e.g., a power switch and a wiring switch), a display device, a liquid crystal display device, a light-emitting device, a lighting device, a power storage device, an input device, an imaging device, driving methods thereof, and manufacturing methods thereof.

BACKGROUND ART (1) A differential transmission method is a method for transmitting data. As a typical differential transmission method, low-voltage differential signaling (LVDS) is known (see Non-Patent Documents 1 and 2). For example, Patent Document 1 discloses a technique that enables a receiver compatible with LVDS standard (hereinafter referred to as "LVDS receiver") to output a received signal to an internal circuit with a different power supply voltage without using a level-shift circuit.

The resolution of a display device has been increased. An increase in resolution of a display device causes an increase in the number of wirings for transmitting an image signal to the display device, an increase in power consumption, or the like in many cases. In addition, the high-resolution display device is likely to be influenced by noise, for example, electromagnetic interference (EMI), which often reduces display quality. To overcome such problems, an LVDS receiver is often employed as an interface circuit for receiving an image signal.

(2) A hybrid display device where a liquid crystal element and a light-emitting element are provided in one subpixel has been suggested (e.g., see Patent Documents 2 to 4).

REFERENCES

Patent Documents

[Patent Document 1] Japanese Published Patent Application No. 2004-112424
[Patent Document 2] Japanese Published Patent Application No. 2003-157026
[Patent Document 3] PCT International Publication No. 2004/053819
[Patent Document 4] PCT International Publication No. 2007/041150

Non-Patent Documents

[Non-Patent Document 1] Andrea Boni et al., "LVDS I/O Interface for Gb/s-per-Pin Operation in 0.35-μm CMOS," IEEE J. Solid-State Circuits, 2001, vol. 36, no. 4, pp. 706-711
[Non-Patent Document 2] Fei Zhao et al., "A LVDS Transceiver Chip Design in 0.5 um CMOS Technology," Congress on Image and Signal Processing, 2008 (CISP'08), vol. 1, pp. 124-127

DISCLOSURE OF INVENTION

An object of one embodiment of the present invention is to increase the operating frequency of a receiver, reduce the transmission delay time of a receiver, provide a receiver which does not require a level shifter, provide a receiver capable of operating with the same power supply voltage as an internal circuit which transmits a signal, or reduce the power consumption of a receiver, for example.

Note that the description of a plurality of objects does not preclude the existence of each object. One embodiment of the present invention does not necessarily achieve all the objects listed above. Objects other than those listed above are apparent from the description of the specification, drawings, claims, and the like, and such objects could be objects of one embodiment of the present invention.

(1) One embodiment of the present invention is a receiver configured to receive a first differential signal and output a first single-ended signal. The receiver includes a first input terminal, a second input terminal, a first output terminal, a first amplifier circuit, and a second amplifier circuit. The first input terminal and the second input terminal are input terminals for the first differential signal. The first output terminal is an output terminal for the first single-ended signal. The first amplifier circuit is a differential input, differential output amplifier circuit. The second amplifier circuit is a differential input, single-ended output amplifier circuit. One of two input terminals of the first amplifier circuit is electrically connected to the first input terminal, and the other is electrically connected to the second input terminal. One of two output terminals of the first amplifier circuit is electrically connected to one of two input terminals of the second amplifier circuit, and the other is electrically connected to the other input terminal of the second amplifier circuit. An output terminal of the second amplifier circuit is electrically connected to the first output terminal. A first power supply voltage and a second power supply voltage are supplied to the first amplifier circuit and the second amplifier circuit, respectively. The first power supply voltage is a high-level power supply voltage. The second power supply voltage is a low-level power supply voltage. A differential pair of the first amplifier circuit includes a first transistor and a second transistor. The withstand voltage of the first transistor and the second transistor is higher than the withstand voltage of another transistor included in the first amplifier circuit and a transistor included in the second amplifier circuit.

(2) One embodiment of the present invention is an IC capable of receiving a differential signal. The IC includes the receiver of the above embodiment (1).

(3) One embodiment of the present invention is a display controller IC for controlling a display device. The display controller IC includes an interface circuit having a function of receiving an image signal. The interface circuit includes the receiver of the above embodiment (1).

(4) One embodiment of the present invention is a driver IC having a function of driving a source line of a display device. The driver IC includes an interface circuit having a function of receiving an image signal. The interface circuit includes the receiver of the above embodiment (1).

In this specification and the like, ordinal numbers such as "first," "second," and "third" are used to show the order in some cases. Alternatively, ordinal numbers are used to avoid confusion among components in some cases, and do not limit the number or order of the components. For example, it is possible to replace the term "first" with the term "second" or "third" in describing one embodiment of the present invention.

In this specification and the like, a semiconductor device refers to a device that utilizes semiconductor characteristics, and means a circuit including a semiconductor element (e.g., a transistor, a diode, or a photodiode), a device including the circuit, and the like. The semiconductor device also means any device that can function by utilizing semiconductor characteristics. For example, an integrated circuit, a chip including an integrated circuit, and an electronic component including a chip in a package are examples of the semiconductor device. Moreover, a storage device, a display device, a light-emitting device, a lighting device, an electronic device, and the like themselves might be semiconductor devices, or might each include a semiconductor device.

In this specification and the like, a description "X and Y are connected" means that X and Y are electrically connected, X and Y are functionally connected, and X and Y are directly connected. Accordingly, without being limited to a predetermined connection relation, for example, a connection relation shown in drawings or text, another connection relation is included in the drawings or the text. Here, X and Y each denote an object (e.g., a device, an element, a circuit, a wiring, an electrode, a terminal, a conductive film, or a layer).

A transistor has three terminals: a gate, a source, and a drain. A gate functions as a control terminal that controls the conduction state of a transistor. Depending on the channel type of the transistor or levels of potentials applied to the terminals, one of two input/output terminals functions as a source and the other functions as a drain. Therefore, the terms "source" and "drain" can be interchanged in this specification and the like. In this specification and the like, the two terminals other than the gate may be referred to as a first terminal and a second terminal.

A node can be referred to as a terminal, a wiring, an electrode, a conductive layer, a conductor, an impurity region, or the like depending on a circuit configuration, a device structure, and the like. Furthermore, a terminal, a wiring, or the like can be referred to as a node.

A voltage usually refers to a potential difference between a given potential and a reference potential (e.g., a ground potential (GND) or a source potential). Thus, a voltage can be referred to as a potential. Note that a potential has a relative value; therefore, GND does not necessarily mean 0 V.

In this specification and the like, the terms "film" and "layer" can be interchanged with each other depending on the case or circumstances. For example, the term "conductive layer" can be changed into the term "conductive film" in some cases. For example, the term "insulating film" can be changed into the term "insulating layer" in some cases.

One embodiment of the present invention makes it possible to increase the operating frequency of a receiver, reduce the transmission delay time of a receiver, provide a receiver which does not require a level shifter, provide a receiver capable of operating with the same power supply voltage as an internal circuit which transmits a signal, or reduce the power consumption of a receiver, for example.

The description of a plurality of effects does not preclude the existence of other effects. One embodiment of the present invention does not necessarily achieve all the effects listed above. In one embodiment of the present invention, an object other than the above objects, an effect other than the above effects, and a novel feature will be apparent from the description of the specification and the drawings.

BRIEF DESCRIPTION OF DRAWINGS

FIGS. 22A to 22G illustrate structural examples of electronic devices.

FIG. 31A shows the waveforms of input differential clock signals; FIG. 31B shows the waveform of an output signal of the receiver in FIG. 3; and FIG. 31C shows the waveform of an output signal of a receiver in FIG. 34.

FIGS. 32A to 32C show simulation results: FIG. 32A shows the waveforms of input differential clock signals; FIG. 32B shows the waveform of an output signal of the receiver in FIG. 3; and FIG. 32C shows the waveform of an output signal of the receiver in FIG. 34.

BEST MODE FOR CARRYING OUT THE INVENTION

Figure 1A:
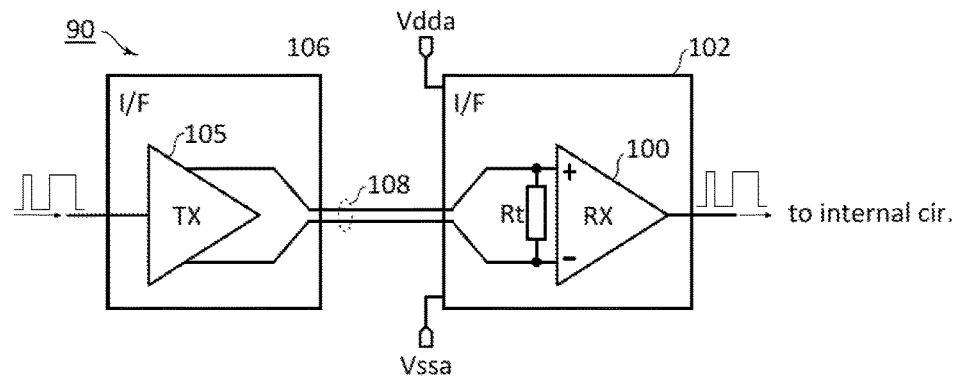
FIG. 1A illustrates an overview of a signal transmission system using a differential signaling method.

Embodiments and examples of the present invention will be described below. Note that one embodiment of the present invention is not limited to the following description, and it will be easily understood by those skilled in the art that various changes and modifications can be made without departing from the spirit and scope of the present invention. Therefore, one embodiment of the present invention should not be construed as being limited to the description in the following embodiments and examples.

Any of the embodiments and examples described below can be combined as appropriate. In the case where some structural examples (including a manufacturing method example, an operating method example, and the like) are given in one embodiment or example, any of the structural examples can be combined with each other as appropriate or combined with one or more structural examples described in the other embodiments and examples as appropriate.

The same components or components having similar functions, components formed using the same material, components formed at the same time, or the like in the drawings are denoted by the same reference numerals in some cases, and the description thereof is not repeated in some cases.

In this specification, a high power supply potential VDD may be abbreviated to "potential VDD," "VDD," or the like. The same applies to other components (e.g., a signal, a voltage, a circuit, an element, an electrode, and a wiring).

When a plurality of components denoted by the same reference numerals need to be distinguished from each other, "_1", "_2", "<j>," "[i, j]", or the like is sometimes added to the reference numerals. For example, one of a plurality of wirings GLL may be distinguishably referred to as a wiring GLL<2> or the like, and a given wiring among the wirings is referred to as a wiring GLL.

Embodiment 1

FIG. 1A illustrates an overview of a system for transmitting a digital signal using a differential signal (a differential transmission system). An example in which LVDS is a differential transmission method is described here. In a differential transmission system 90 illustrated in FIG. 1A, an interface (I/F) circuit 102 at the receiving end includes a receiver (RX) 100, and an interface circuit 106 at the transmitting end includes a transmitter (TX) 105. The transmitter 105 converts a single-ended signal into a differential signal. The differential signal is transmitted to the receiver 100 via a transmission medium 108.

The transmitter 105 has a function of converting a single-ended digital signal into a differential signal. The differential signal that is output from the transmitter 105 is input to the receiver 100 via the transmission medium 108. The transmission medium 108 includes two wirings. A resistor Rt is a termination resistor at the receiving end and has a resistance matched to the characteristic impedance of the transmission medium 108. According to LVDS standard, the resistor Rt is a resistor of 100Ω. Specifically, the transmitter 105 transmits a differential current signal of ±3.5 mA to the transmission medium 108. When the differential current signal flows across the resistor Rt of 100Ω, differential voltage signals with a voltage difference of 350 mV (1.075 V to 1.425 V) are input to the receiver 100. The receiver 100 detects and converts the differential voltage signal into a single-ended signal. The single-ended signal generated by the receiver 100 is input to an internal circuit at the receiving end.

<<Receiver 100>>

Figure 1B:
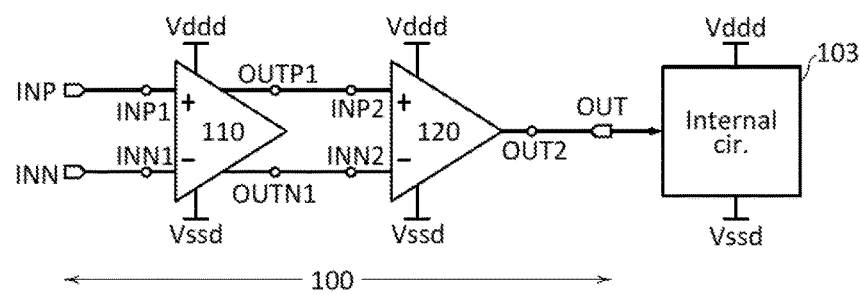
FIGS. 1B and 1C are circuit diagrams each illustrating a configuration example of a receiver.

FIG. 1B illustrates a configuration example of the receiver 100. The receiver 100 includes terminals INP, INN, and OUT. An amplifier circuit 110 is provided in an input stage of the receiver 100, and an amplifier circuit 120 is provided in an output stage of the receiver 100.

The terminals INP and INN are input terminals for the differential signals and are electrically connected to the transmission medium 108. A signal input to the terminal INN is an inverted signal of a signal input to the terminal INP and has a phase difference of 180°. The terminal OUT is an output terminal for the single-ended signal and is electrically connected to an internal circuit 103 at the receiving end.

Power supply voltages Vddd and Vssd are input to the amplifier circuits 110 and 120. Vddd is a high-level power supply voltage, and Vssd is a low-level power supply voltage. The power supply voltages Vddd and Vssd can be the same as high-level and low-level power supply voltages for the internal circuit 103 that is connected to a stage subsequent to the receiver 100. The power supply voltage Vddd represents data "1", and the power supply voltage Vssd represents data "0".

The amplifier circuit 110 is a differential input, differential output amplifier circuit and includes terminals INP1, INN1, OUTP1, and OUTN1. The amplifier circuit 120 is a differential input, single-ended output amplifier circuit and includes terminals INP2, INN2, and OUT2. The terminals INP1 and INN1 are electrically connected to the terminals INP and INN, respectively. The terminals INP2 and INN2 are electrically connected to the terminals OUTP1 and OUTN1, respectively. The terminal OUT2 is electrically connected to the terminal OUT.

The amplifier circuit 110 amplifies differential signals which are input to the terminals INP and INN, and generates differential signals. The generated differential signals are output from the terminals OUTP1 and OUTN1. The amplifier circuit 120 has a function of converting the differential signals input to the terminals INP2 and INN2 into a single-ended signal. The single-ended signal generated by the amplifier circuit 120 is output from the terminal OUT through the terminal OUT2. The amplifier circuit 120 has a function of a comparator circuit and outputs a high-level voltage signal or a low-level voltage signal depending on the voltages of the terminals INP2 and INN2.

Figure 1C:
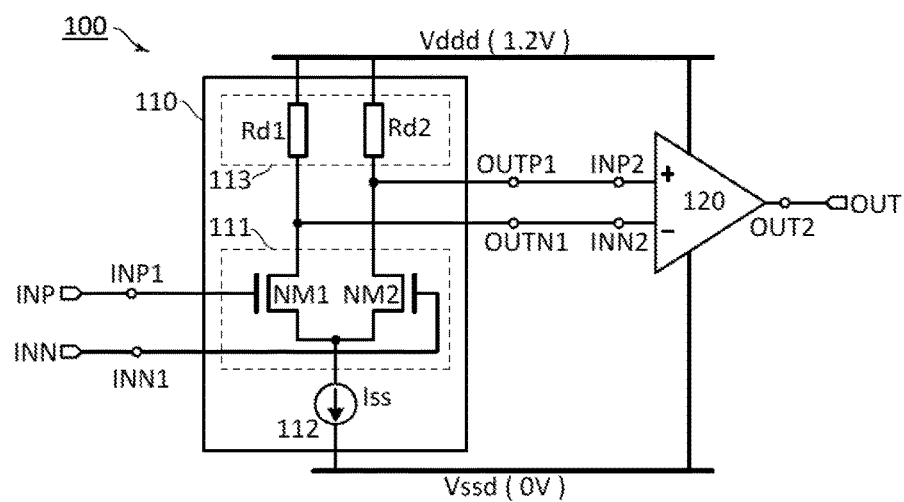

FIG. 1C illustrates a circuit configuration example of the amplifier circuit 110. The amplifier circuit 110 includes transistors NM1 and NM2, a current source 112, and a load circuit 113. The transistors NM1 and NM2 constitute a differential pair 111 of the amplifier circuit 110. Each of the transistors NM1 and NM2 is an n-channel transistor (hereinafter referred to as "NMOS"). The current source 112 is a constant current source for supplying a bias current Iss to the differential pair 111. For example, the current source 112 includes an NMOS. The load circuit 113 places loads Rd1 and Rd2 on the transistors NM1 and NM2. For example, the load circuit 113 includes resistors or transistors.

A comparison between the receiver 100 and a receiver of a comparative example is described below in order to facilitate the understanding of the configuration, the effect, or the like of the receiver of this embodiment.

Figure 33:
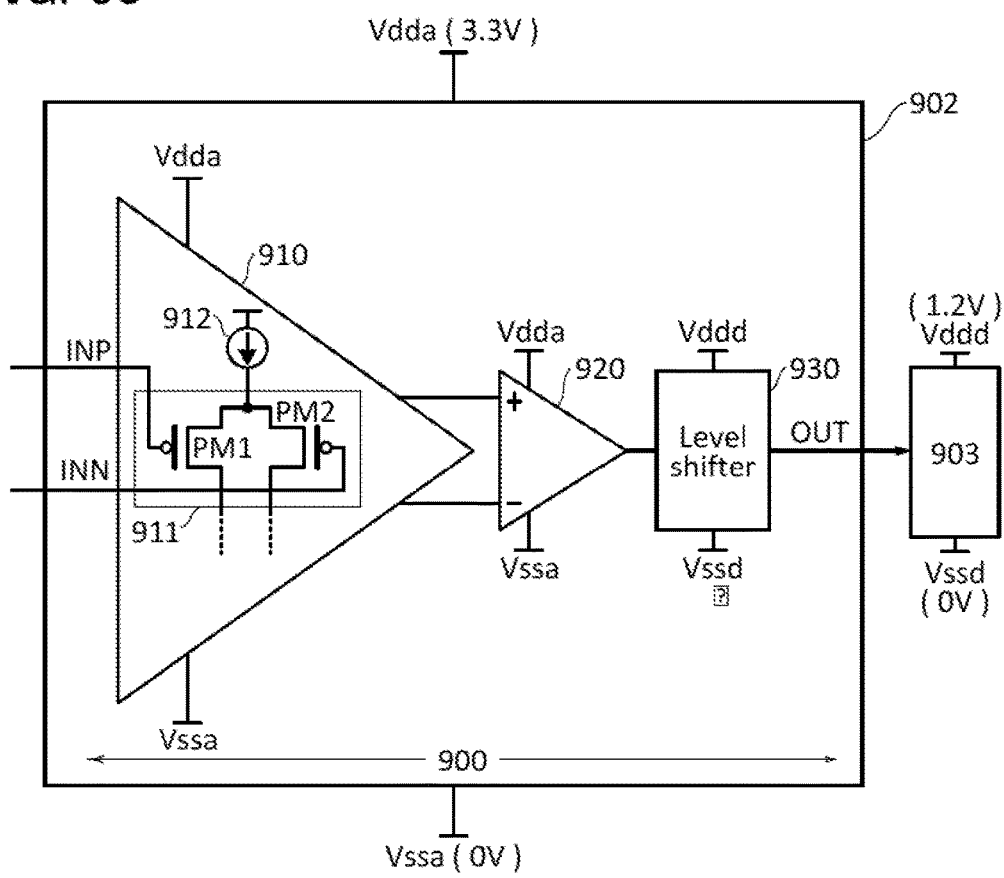
FIG. 33 is a circuit diagram illustrating a configuration example of a receiver of a comparative example.

FIG. 33 illustrates a receiver of a comparative example. A receiver 900 illustrated in FIG. 33 is provided in an interface circuit 902. A single-ended signal generated by the receiver 900 is input to an internal circuit 903. In the example given here, power supply voltages Vdda and Vssa for each of the interface circuits 102 and 902 are 3.3 V and 0 V, respectively, and power supply voltages Vddd and Vssd of each of the internal circuits 103 and 903 are 1.2 V and 0 V, respectively.

The receiver 900 includes terminals INP, INN, and OUT, amplifier circuits 910 and 920, and a level shifter 930. A differential pair 911 of the amplifier circuit 910 includes transistors PM1 and PM2. Each of the transistors PM1 and PM2 is a p-channel transistor (hereinafter referred to as "PMOS"). The same power supply voltages Vdda and Vssa as those for the interface circuit 902 are input to the amplifier circuits 910 and 920, Transistors included in the receivers 100 and 900 and the internal circuits 103 and 903 each have a withstand voltage sufficient for an operating voltage. In this specification, the withstand voltage of a transistor refers to a maximum voltage that can be applied between a gate and a source and between a drain and the source, unless otherwise specified.

Here, for convenience, a transistor which operates with the power supply voltage Vddd (=1.2 V) is referred to as a low-voltage (LV) device, and a transistor which operates with the power supply voltage Vdda (=3.3 V) is referred to as a middle-voltage (MV) device. In other words, the MV device has a higher withstand voltage than the LV device. In addition, in some cases, a voltage level at Vddd and a voltage level at Vdda may be referred to an LV level and an MV level, respectively.

The withstand voltage of the transistor can be increased by increasing the thickness of a gate insulating layer or increasing a channel length, for example. MV and LV devices can be distinguished from each other by the amount of Cox (gate capacitance per unit area). A transistor with a large Cox is an LV device, and a transistor with a small Cox is an MV device.

The amplifier circuits 910 and 920 include MV devices and are supplied with the power supply voltages Vdda and Vssa. The amplifier circuit 910 amplifies a differential signal with an amplitude of 350 mV, thereby generating an MV-level differential signal. The amplifier circuit 910 includes the differential pair 911 and a current source 912. The differential pair 911 is constituted by two PMOSs. The current source 912 is a source of a bias current for the differential pair 911 and includes a PMOS, for example. The amplifier circuit 920 converts an input differential signal into a single-ended signal. The voltages of the input signal and the output signal of the amplifier circuit 920 are at the MV level.

The internal circuit 903 includes an LV device. The level shifter 930 is provided to decrease the voltage level of the output signal of the receiver 900 from the MV level to the LV level. For this purpose, the level shifter 930 includes an MV device in an input stage and an LV device in an output stage. The input stage generates an LV-level signal by decreasing the level of an MV-level signal. The output stage shapes the waveform of the LV-level signal.

The maximum operating frequency of the MV device is lower than that of the LV device because the on-state resistance of a transistor is inversely proportional to Cox. Therefore, the maximum operating frequency and the transmission delay time of the receiver 900 depend on the frequency characteristics of the MV devices included in the receiver 900. Specifically, driving the MV device of the level shifter 930 at 1.2 V is one major factor that interferes with an increase in the maximum operating frequency and a reduction in the transmission delay time.

Thus, an object of this embodiment is to provide a receiver which does not require a level shifter in an output stage. The receiver 100 illustrated in FIGS. 1B and 1C is one example of such a receiver.

It is assumed here that the power supply voltages Vdda and Vssa for the interface circuit 102 are 3.3 V and 0 V, respectively, and the power supply voltages Vddd and Vssd for the internal circuit 103 are 1.2 V and 0 V, respectively. The high-level and low-level power supply voltages for the amplifier circuits 110 and 120 are the power supply voltages Vddd and Vssd, respectively, which are the same as those for the internal circuit 103. Therefore, the output levels of the amplifier circuits 110 and 120 do not exceed the power supply voltage Vddd.

In the amplifier circuit 110, the transistors NM1 and NM2 of the differential pair 111 are MV devices, and the other transistors are LV devices. The differential pair 111 is constituted by the MV devices because the maximum voltage of the differential signals which are input to the terminals INP and INN is 1.425 V, which is higher than the power supply voltage Vddd, and because the power supply voltage for the interface circuit 102 is Vdda and the voltage Vdda may therefore be applied to the differential pair 111.

The voltages of the differential signals input to the differential pair 111 are in the range from 1.075 V to 1.425 V, and the power supply voltage Vddd is 1.2 V. Thus, the transistors NM1 and NM2 are NMOSs. This is because when the differential pair 111 is constituted by PMOSs, the differential pair 111 cannot operate normally in the entire range of input voltages. For a similar reason, the differential pair 911 of the amplifier circuit 910 is constituted by PMOSs. Since the differential pair 111 of the amplifier circuit 110 is constituted by NMOSs, a differential pair of the amplifier circuit 120 is constituted by PMOSs.

In the amplifier circuit 110, the transistors other than the transistors NM1 and NM2 are LV devices because a voltage higher than 1.2 V is not applied thereto. The output of the amplifier circuit 110 can be at a level where the output can be input to an LV device; thus, all transistors of the amplifier circuit 120 can be LV devices. Accordingly, the output of the amplifier circuit 120 can also be set at a voltage level where the output can be input to an LV device; thus, there is no need to provide a level shifter for decreasing the level of an output signal of the amplifier circuit 120.

In addition, only the differential pair 111 of the amplifier circuit 110 is constituted by the MV devices; thus, the amplifier circuit 110 and the amplifier circuit 120 can be driven with a single power supply voltage.

In the receiver 100, the differential pair 111 receives the differential signals which are transmitted from the transmitter 105. Thus, the transistors NM1 and NM2 can be MV devices so as to have a high withstand voltage, and the other transistors can be LV devices, which have more excellent frequency characteristics. Therefore, the operating frequency of the receiver 100 can be increased, and the transmission delay time thereof can be reduced. No need to provide a level shifter in the output stage of the receiver 100 significantly contributes to the increase in the operating frequency and the reduction in the transmission delay time. The receiver 100 mostly constituted by LV devices can have advantageous effects such as reductions in circuit area and power consumption.

The amplifier circuits 110 and 120 can each be a single-power-supply amplifier circuit. The amplifier circuit 110 preferably has high input/output linearity. The amplifier circuit 120 preferably has rail-to-rail output capability.

Some specific circuit configuration examples of receivers are described below.

<<Receiver 140>>

Figure 2:
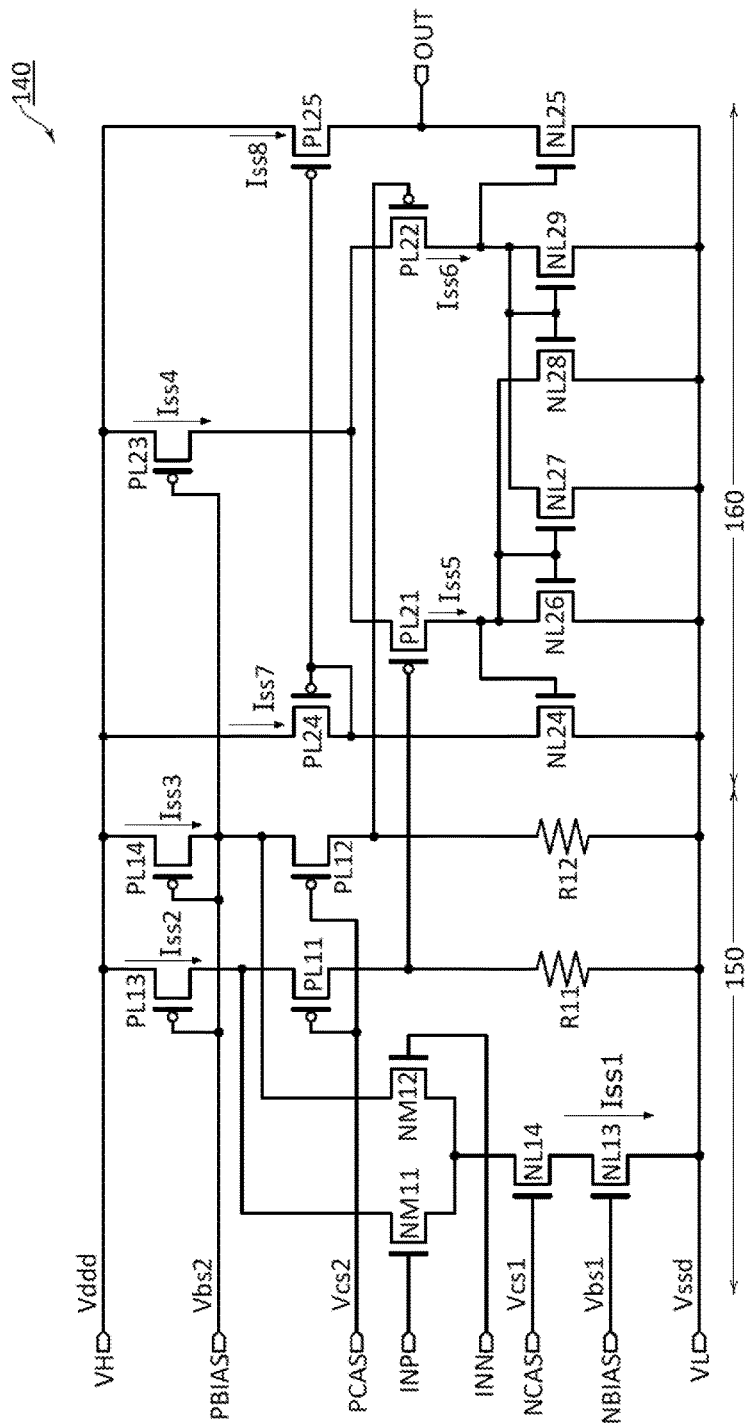
FIG. 2 is a circuit diagram illustrating a configuration example of a receiver.

FIG. 2 illustrates a configuration example of a receiver. The receiver 140 includes amplifier circuits 150 and 160 and terminals INP, INN, OUT, VH, VL, NCAS, PCAS, NBIAS, and PBIAS.

The amplifier circuit 150 is a folded cascode operational amplifier. The amplifier circuit 160 is a buffer operational amplifier.

The terminals INP and INN are input terminals for differential signals, and the terminal OUT is an output terminal for a single-ended signal. The terminal VH is an input terminal for a power supply voltage Vddd, and the terminal VL is an input terminal for a power supply voltage Vssd. Each of the terminals NCAS, PCAS, NBIAS, and PBIAS is an input terminal for a bias voltage. Voltages Vcs1, Vcs2, Vbs1, and Vbs2 are input to the terminals NCAS, PCAS, NBIAS, and PBIAS, respectively.

<Amplifier Circuit 150>

The amplifier circuit 150 includes transistors NM11, NM12, NL13, NL14, and PL11 to PL14 and resistors R11 and R12. The transistors NM11 and NM12 are MV devices, and the transistors NL13, NL14, and PL11 to PL14 are LV devices.

The transistors NM11 and NM12 constitute a differential pair. Here, the differential pair constituted by the transistors NM11 and NM12 is referred to as a differential pair (NM11, NM12). The same applies to other components.

The transistor NL13 constitutes a current source for supplying a bias current Iss1 to the differential pair (NM11, NM12). The transistor NL14 is a cascode transistor. In some cases, the transistor NL14 is not necessarily provided.

The transistors PL11 and PL12 are cascode transistors. The transistor PL13 is a current source for generating a bias current Iss2, and the transistor PL14 is a current source for generating a bias current Iss3. Here, the transistors PL13 and PL14 function as load current sources for supplying the bias currents to the differential pair (NM11, NM12) and the transistors PL11 and PL12.

The resistors R11 and R12 function as load resistors for the transistors PL11 and PL12. Note that the resistor R11 can be replaced with a load current source including one or more NMOSs. The same applies to the resistor R12. When loads for the transistors PL11 and PL12 are constituted by linear elements as illustrated in FIG. 2, the linearity of the amplifier circuit 150 can be improved.

<Amplifier Circuit 160>

The amplifier circuit 160 includes transistors PL21 to PL25 and NL24 to NL29. The transistors PL21 to PL25 and NL24 to NL29 are LV devices. The amplifier circuit 160 is a two-stage operational amplifier. An amplifier circuit in an input stage is a differential input, differential output amplifier circuit and includes the transistors PL21 to PL23 and NL26 to NL29. An amplifier circuit in an output stage is a differential input, single-ended output amplifier circuit and includes the transistors PL24, PL25, NL24, and NL25.

(Input stage) The transistors PL21 and PL22 constitute a differential pair in the input stage. The transistor PL23 constitutes a current source for supplying a bias current Iss4 to the differential pair (PL21, PL22). The transistors NL26 and NL27 constitute a current mirror circuit, and the transistors NL28 and NL29 constitute a current mirror circuit. The current mirror circuits (NL26, NL27) and (NL28, NL29) function as current loads for supplying bias currents Iss5 and Iss6 to the differential pair (PL21, PL22), respectively.

(Output stage) The transistors NL24 and NL25 constitute a current mirror circuit, and the transistors PL24 and PL25 constitute a current mirror circuit. The current mirror circuit (PL24, PL25) has a function of supplying bias currents Iss7 and Iss8 to the differential pair (NL24, NL25).

The input stage of the receiver 140 is a folded cascode operational amplifier. The folded cascode operational amplifier has highly linear but low gain. Therefore, a buffer operational amplifier is provided in the output stage of the receiver 140 to enable the voltage amplitude of the terminal OUT to be |Vddd−Vssd|, which is required of the output of the receiver 140.

The amplifier circuit 150 in the input stage linearly amplifies differential signals which are input to the terminals INP and INN, and outputs the amplified signals. That is, the amplifier circuit 150 has a function of linearly amplifying differential signals to amplitudes detectable with the amplifier circuit 160. The amplifier circuit 160 in the output stage has a function of converting input differential signals into a single-ended signal, and preferably has a function of rapidly amplifying the voltage levels of the input differential signals to the voltage level of a power supply rail.

<<Receiver 141>>

Figure 3:
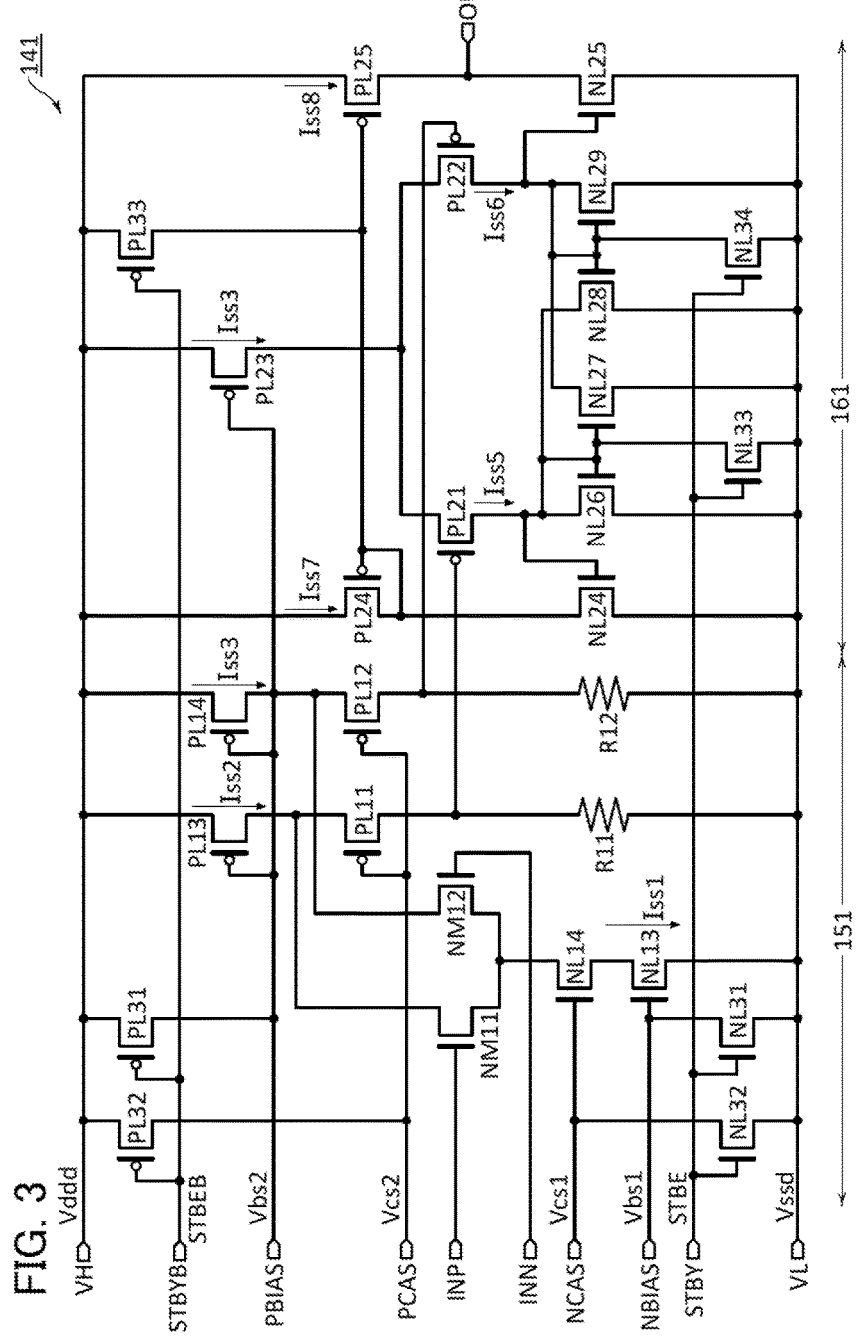
FIG. 3 is a circuit diagram illustrating a configuration example of a receiver.

FIG. 3 illustrates a configuration example of a receiver. The receiver 141 includes amplifier circuits 151 and 161 and terminals INP, INN, OUT, VH, VL, NCAS, PCAS, NBIAS, PBIAS, STBY, and STBYB. The receiver 141 is a modification example of the receiver 140, and has a standby mode as an operation mode. Differences of the receiver 141 from the receiver 140 are mainly described below.

The terminals STBY and STBYB are input terminals for signals STBE and STBEB. The signals STBE and STBEB are standby enable signals. The signal STBEB is an inverted signal of the signal STBE. When the signal STBE of "H" is input, the receiver 141 enters the standby mode.

The receiver 141 includes transistors NL31 to NL34 and PL31 to PL33. Each of these transistors is an LV device and functions as a switch for turning off a transistor which constitutes a current source in the receiver 141. Specifically, the transistor PL31 controls electrical connection between a power supply line for the power supply voltage Vddd and gates of the transistors PL13, PL14, and PL23. The transistor NL33 controls electrical connection between a power supply line for the power supply voltage Vssd and gates of the transistors NL26 and NL27. Other transistors have a similar function.

The amplifier circuit 151 is a modification example of the amplifier circuit 150 and is a circuit including the transistors NL31, NL32, PL31, and PL32 in addition to the components of the amplifier circuit 150. The amplifier circuit 161 is a modification example of the amplifier circuit 160 and is a circuit including the transistors NL33, NL34, and PL33 in addition to the components of the amplifier circuit 160.

(Standby Mode)

When the signal STBE is "H" (and the signal STBEB is "L"), three cascode transistors (the transistors NL14, PL11, and PL12) in the amplifier circuit 151 are turned off, and three current sources (the transistors NL13, PL13, and PL14) therein are turned off. Current sources (the transistor PL23 and the current mirror circuits (NL26, NL27), (NL28, NL29), (NL24, NL25), and (PL24, PL25)) in the amplifier circuit 161 are turned off.

Accordingly, all current sources in the receiver 141 are stopped in the standby mode; thus, the current consumption of the receiver 141 can be reduced effectively. For example, when the power supply voltage Vddd is 1.2 V and Vssd is 0 V, the current consumption of the receiver 141 is several milliamperes to several tens of milliamperes in an active mode, which can be reduced to several nanoamperes to several tens of nanoamperes in the standby mode.

The standby mode can be achieved by selecting which of the transistors NL31 to NL34 and PL31 to PL33 are provided as appropriate. For example, only the transistors NL31 and PL31 may be provided. In that case, the current source (NL31) of the bias current Iss1 and the current source (PL23) of the bias current Iss3 can be stopped in the standby mode; thus, the amplifier circuits 151 and 161 can be stopped.

Figure 4:
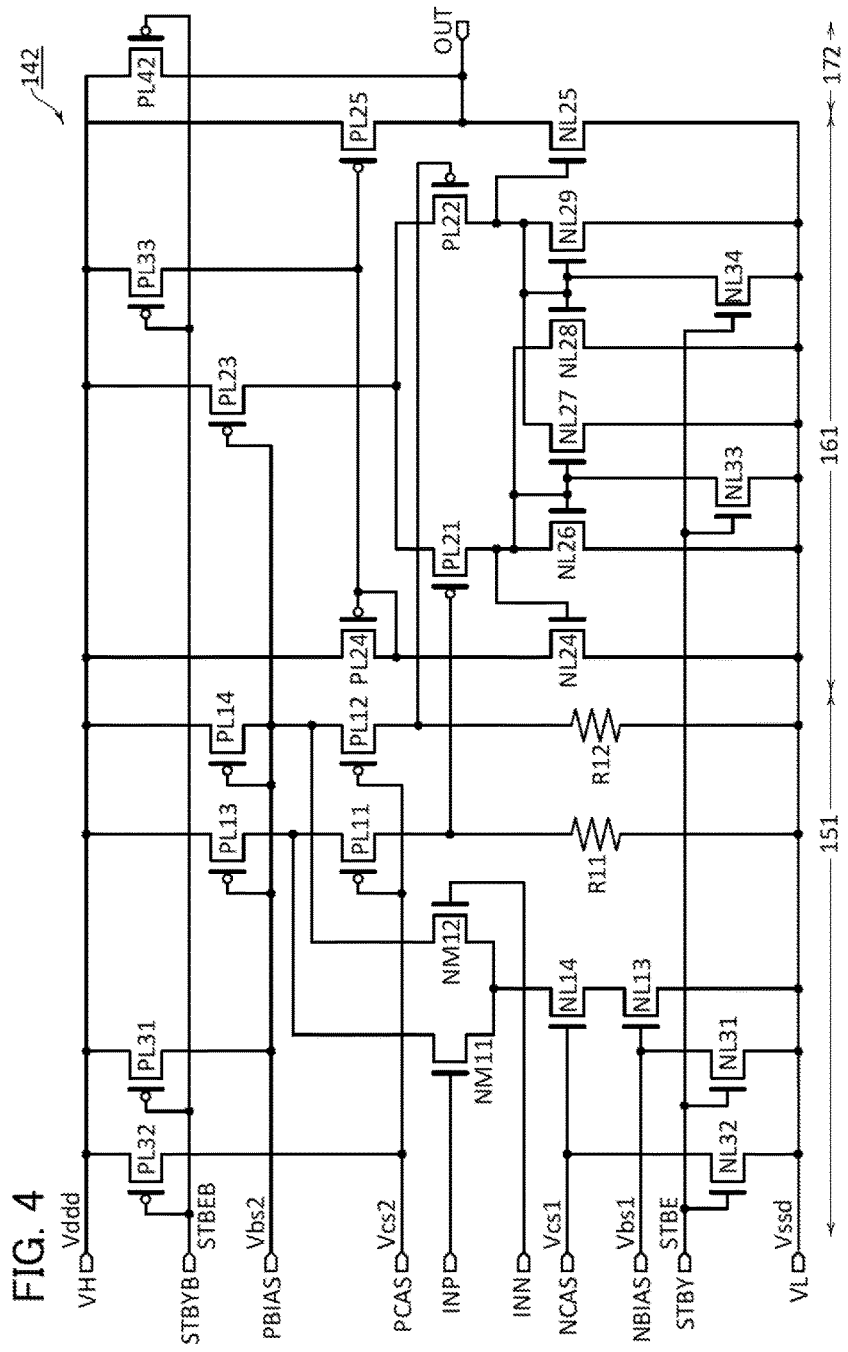
FIG. 4 is a circuit diagram illustrating a configuration example of a receiver.
Figure 5:
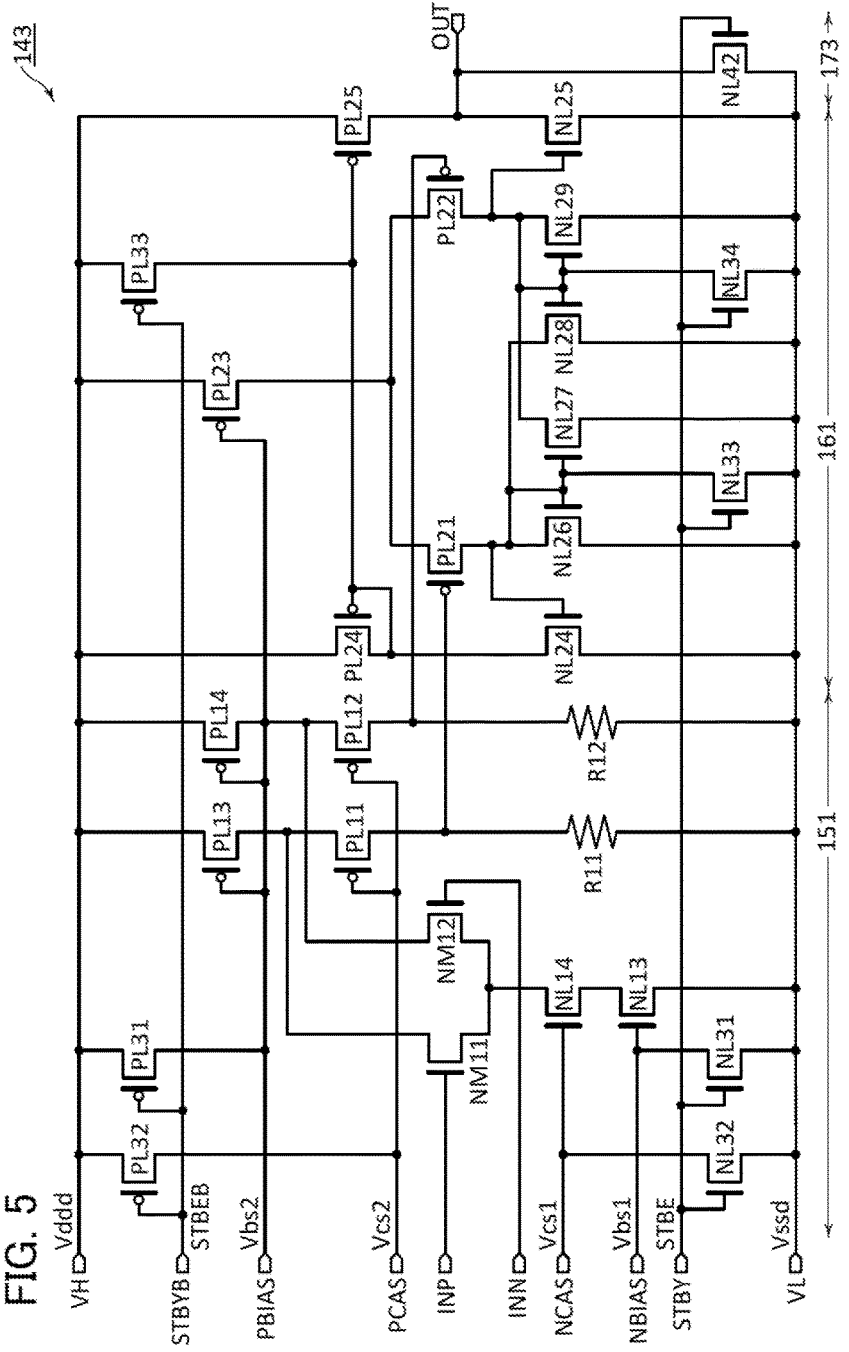
FIG. 5 is a circuit diagram illustrating a configuration example of a receiver.
Figure 6:
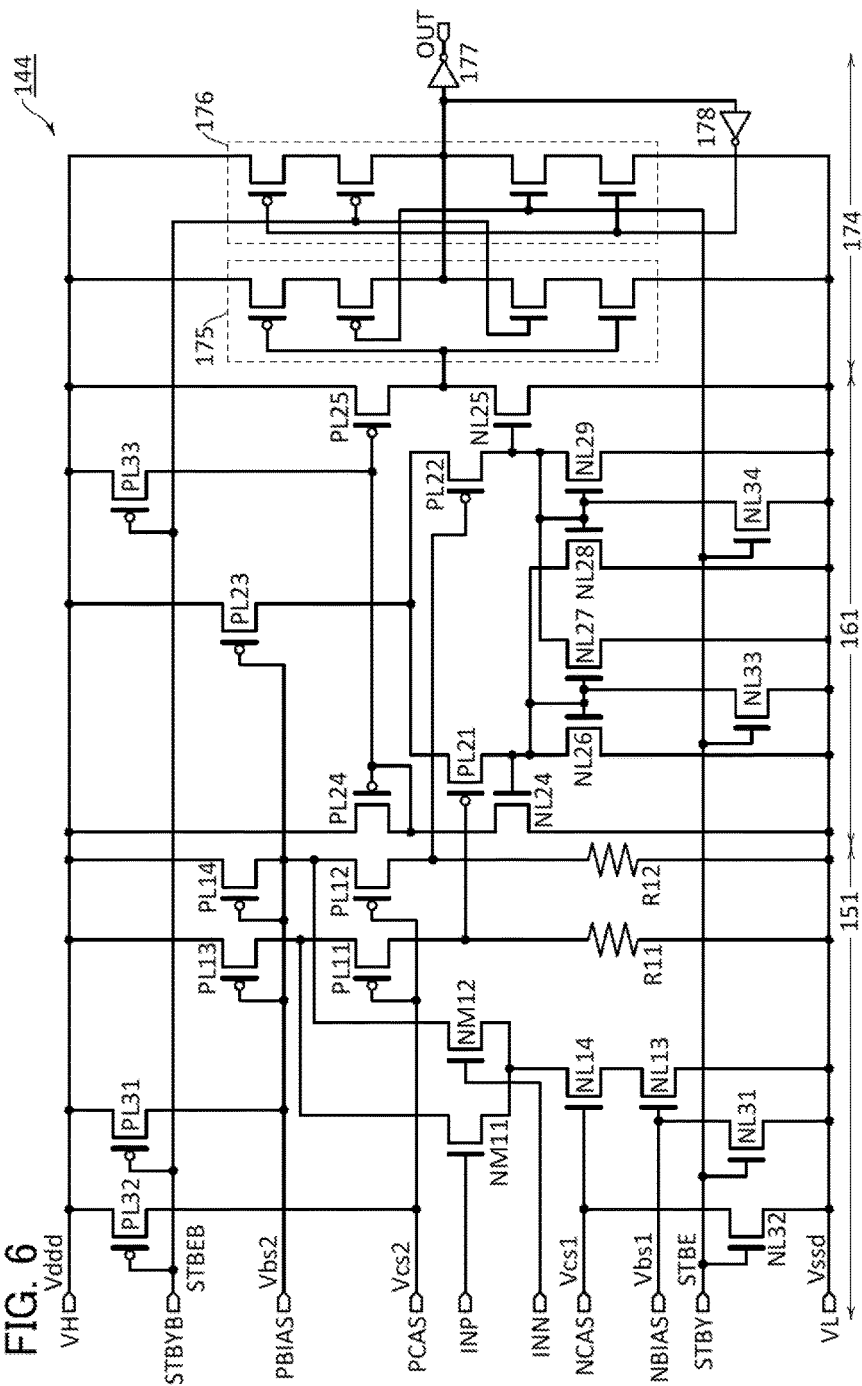
FIG. 6 is a circuit diagram illustrating a configuration example of a receiver.

In the standby mode, the logic of the terminal OUT of the receiver 141 is undefined. If necessary, a circuit for fixing the logic of the terminal OUT in the standby mode may be provided in the receiver 141. FIGS. 4 to 6 illustrate examples of such a configuration.

<<Receiver 142>>

The receiver 142 illustrated in FIG. 4 includes a pull-up circuit 172 in an output stage in addition to the components of the receiver 141. The pull-up circuit 172 includes a transistor PL42. The transistor PL42 is an LV device. Since the transistor PL42 is turned on in the standby mode, the voltage level of the terminal OUT can be fixed to the power supply voltage Vddd.

<<Receiver 143>>

The receiver 143 illustrated in FIG. 5 includes a pull-down circuit 173 in an output stage in addition to the components of the receiver 141. The pull-down circuit 173 includes a transistor NL42. The transistor NL42 is an LV device. Since the transistor NL42 is turned on in the standby mode, the voltage level of the terminal OUT can be fixed to the power supply voltage Vssd.

<<Receiver 144>>

The receiver 144 illustrated in FIG. 6 includes a latch circuit 174 in an output stage in addition to the components of the receiver 141. The latch circuit 174 is constituted by LV devices. The latch circuit 174 includes clocked inverters 175 and 176 and inverters 177 and 178. When the signal STBE is "L", the clocked inverter 175 is active, and when the signal STBE is "H", the clocked inverter 176 is active.

When the receiver 144 is in the active mode (and the signal STBE is "L"), the output of the amplifier circuit 161 is output from the terminal OUT through the clocked inverter 175 and the inverter 177. At that time, the latch circuit 174 functions as a buffer circuit which is constituted by two stages of inverters.

When the receiver 144 is in the standby mode (and the signal STBE is "H"), the latch circuit 174 is active. When the signal STBE is "H", the clocked inverter 175 is inactive, and the output terminal of the amplifier circuit 161 and the terminal OUT are not electrically connected to each other. The clocked inverter 176 is active, and the clocked inverter 176 and the inverter 178 constitute a latch circuit. This latch circuit retains a signal which is input to the inverter 177 shortly before the standby mode. Accordingly, in the standby mode, the logic of the terminal OUT of the receiver 144 is fixed to the same logic as that of the terminal OUT shortly before the standby mode.

The pull-up circuit 172, the pull-down circuit 173, or the latch circuit 174 may be provided in the output stage of the receiver 140 illustrated in FIG. 2.

<<Bias Voltage Generation Circuit 180>>

A bias voltage generation circuit for supplying the bias voltages Vbs1, Vbs2, Vcs1, and Vcs2 to the receiver 140 is described here. The bias voltage generation circuit 180 illustrated in FIG. 7 has a standby mode as an operation mode.

The power supply voltages Vddd and Vssd, a reference current Iref, and the signals STBE and STBEB are input to the bias voltage generation circuit 180. The bias voltage generation circuit 180 generates the bias voltages Vbs1, Vcs1, Vbs2, and Vcs2 based on the reference current Iref. For example, the reference current Iref is generated by a bandgap reference circuit.

Figure 7:
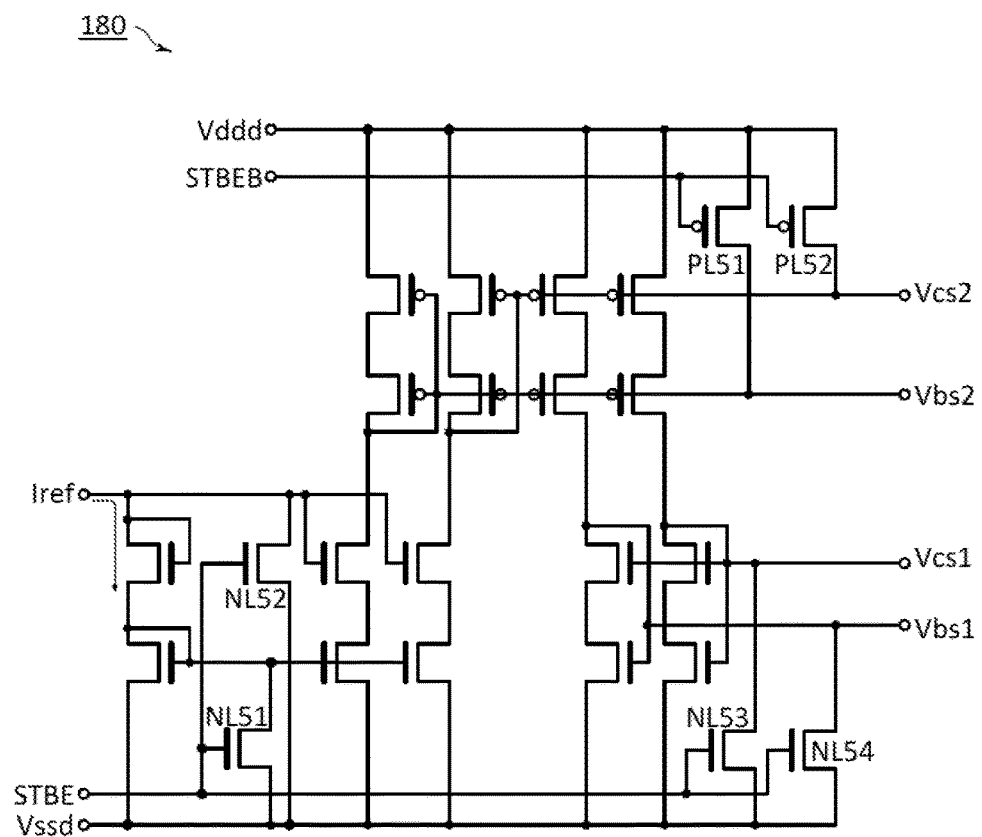
FIG. 7 is a circuit diagram illustrating a configuration example of a bias voltage generation circuit.

Transistors in the bias voltage generation circuit 180 are LV devices. In FIG. 7, transistors NL51 to NL54, PL51, and PL52 are provided to achieve the standby mode. When the signal STBE is "H" (and the signal STBEB is "L"), the bias voltage generation circuit 180 outputs the voltage Vssd as the bias voltages Vbs1 and Vcs1 and outputs the voltage Vddd as the bias voltages Vbs2 and Vcs2, regardless of the reference current Iref.

With the use of the bias voltage generation circuit 180, in the standby mode, all the current sources and all the cascode transistors in the amplifier circuit 150 of the receiver 140 can be turned off, and the transistor PL23 of the amplifier circuit 161 can be turned off. That is, the power consumption of the receiver 140 in the standby mode can be reduced.

The bias voltage generation circuit 180 can be used as a bias voltage generation circuit for the receiver 141. In that case, the transistors NL31, NL32, PL31, and PL32 are not necessarily provided in the receiver 141. The same applies to the receivers 142 to 144.

According to this embodiment, a receiver which does not require a level shifter can be provided. In the receiver of this embodiment, only the differential pair for receiving differential signals transmitted from the transmitter is constituted by MV devices, and the other transistors can be LV devices. As a result, according to this embodiment, an increase in operating frequency, a reduction in transmission delay time, a reduction in circuit area, a reduction in power consumption during normal operation, or the like can be achieved. When the receiver is configured to support the standby mode, current consumption during standby can be reduced.

<<LVDS Receiver IC>>

Configuration examples of LVDS receiver ICs are described below.

Configuration Example 1

Figure 8:
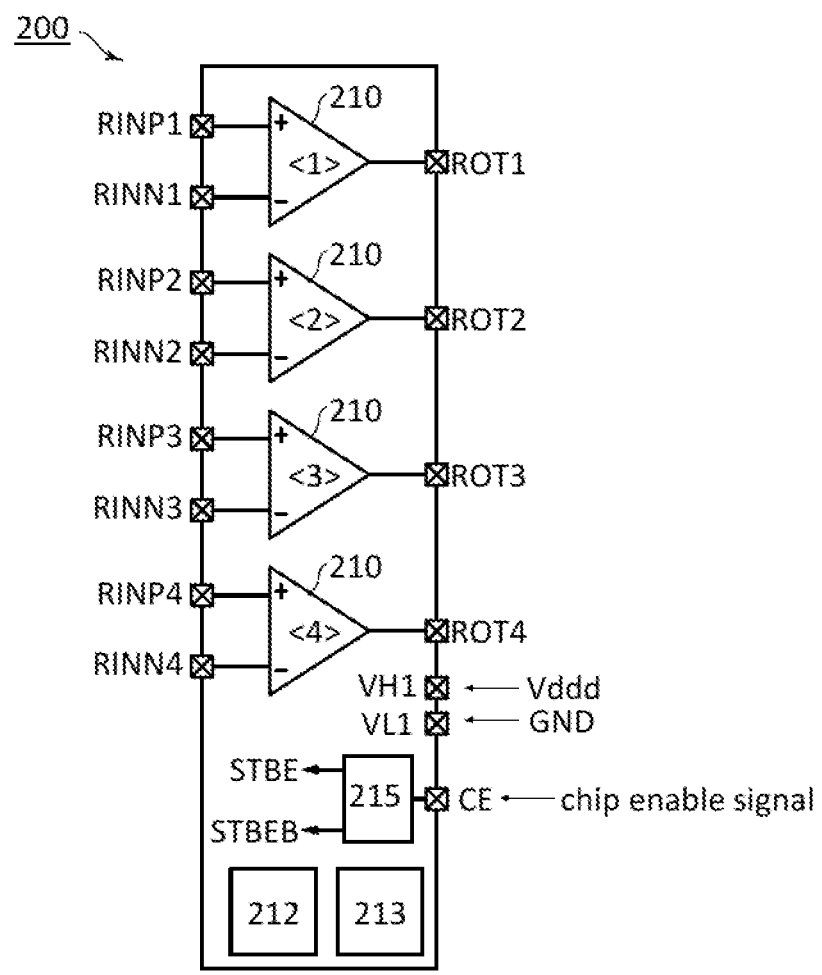
FIG. 8 is a block diagram illustrating a configuration example of an LVDS receiver IC.

FIG. 8 illustrates a configuration example of an LVDS receiver IC with four input channels. An LVDS receiver IC 200 includes receivers 210<1> to 210<4>, a bias voltage generation circuit 212, a reference current generation circuit 213, a logic circuit 215, and pins RINP1 to RINP4, RINN1 to RINN4, ROT1 to ROT4, VH1, VL1, and CE.

The pins RINP1 to RINP4 and RINN1 to RINN4 are input pins for differential signals. In the LVDS receiver IC 200, a resistor for terminating the pin RINP1 and the pin RINN1 is provided. The other input pins for differential signals are also terminated similarly.

The pins ROT1 to ROT4 are output pins for single-ended signals. The pins VH1 and VL1 are input pins for power supply voltages; for example, the power supply voltage Vddd is input to the pin VH1 and a ground voltage (GND) is input to the pin VL1. The pin CE is an input pin for a chip enable signal.

The logic circuit 215 generates the signals STBE and STBEB based on the chip enable signal. When the chip enable signal is "H", the signal STBE is "L" (and the signal STBEB is "H"), and when the chip enable signal is "L", the signal STBE is "H" (and the signal STBEB is "L"). The signals STBE and STBEB are input to the receiver 210. As the receiver 210, a receiver having a standby function is used, and the receiver 143 (FIG. 5) is used here. While the chip enable signal is "L", the receiver 210 is in a standby state.

The bias voltage generation circuit 212 supplies a bias voltage to the receiver 210. A reference current generated by the reference current generation circuit 213 is supplied to the bias voltage generation circuit 212. As the bias voltage generation circuit 212, the bias voltage generation circuit 180 having a standby function may be used. In that case, when the receiver 210 is constituted by, for example, the receiver 140 (FIG. 2) and the pull-down circuit 173 (FIG. 5), the receiver 210 can be brought into a standby state by bringing the bias voltage generation circuit 212 into a standby state.

Configuration Example 2

Figure 9:
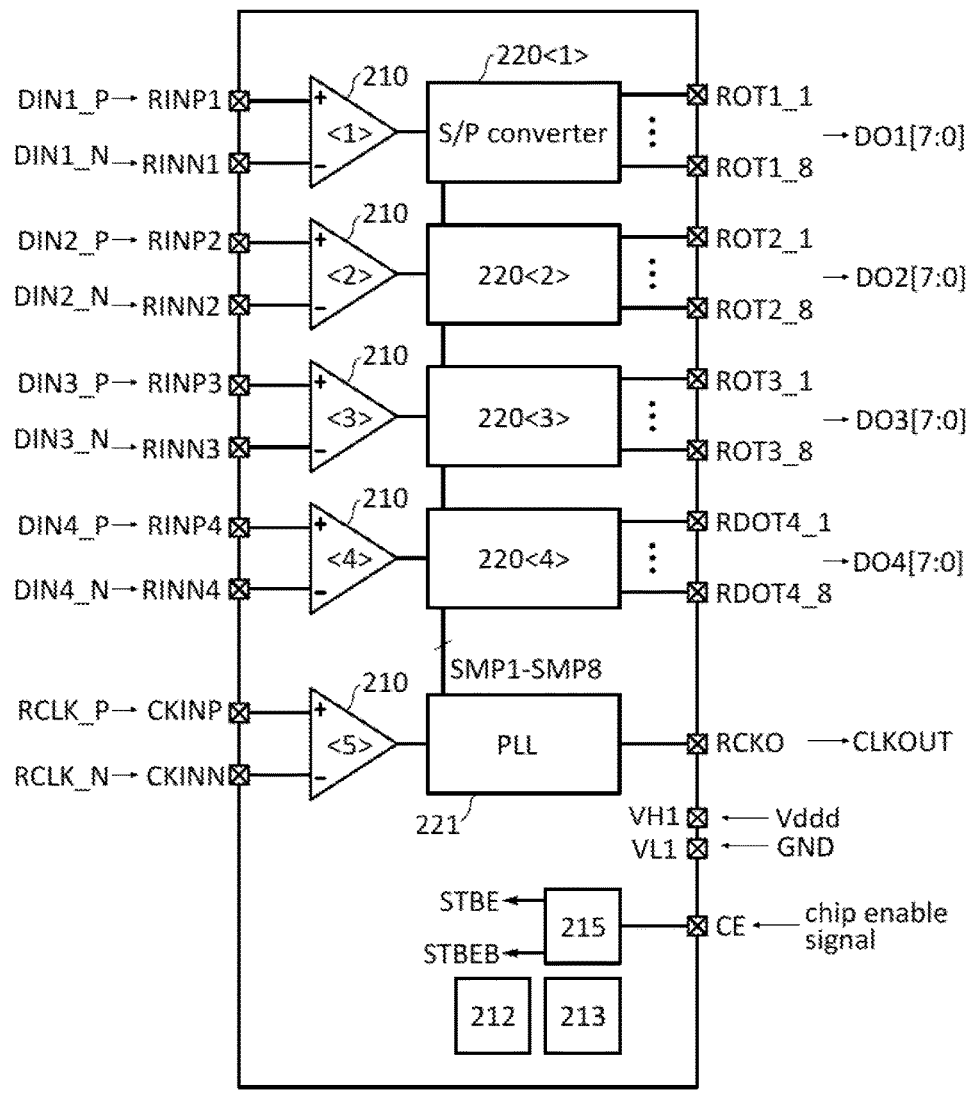
FIG. 9 is a block diagram illustrating a configuration example of an LVDS receiver IC.

FIG. 9 illustrates a configuration example of an LVDS receiver IC. An LVDS receiver IC 201 has four input channels and has a function of outputting a 32 (4×8) bit parallel data signal. The LVDS receiver IC 201 has a function of a deserializer. The LVDS receiver IC 201 includes receivers 210<1> to 210<5>, serial-parallel (S/P) converter circuits 220<1> to 220<4>, a phase locked loop (PLL) circuit 221, a bias voltage generation circuit 212, a reference current generation circuit 213, a logic circuit 215, and pins RINP1 to RINP4, RINN1 to RINN4, CKINP, CKINN, ROT1_1 to ROT1_8, ROT2_1 to ROT2_8, ROT3_1 to ROT3_8, ROT4_1 to ROT4_8, RCKO, VH1, VL1, and CE.

The LVDS receiver IC 201 includes four data lanes and one clock lane. Differential clock signals RCLK_P and RCLK_N are input to the clock lane from the pins CKINP and CKINN. The receiver 210<5> converts the differential clock signals RCLK_P and RCLK_N into a single-ended clock signal. The PLL circuit 221 generates a clock signal CLKOUT and sampling signals SMP1 to SMP8 from the single-ended clock signal. The sampling signals SMP1 to SMP8 are input to the serial-parallel converter circuits 220<1> to 220<4>. The clock signal CLKOUT is output from the pin RCKO.

In the j-th data lane (j is an integer of 1 to 4), differential data signals DINj_P and DINj_N are input from the pins RINPj and RINNj. The receiver 210<j> converts the differential data signals DINj_P and DINj_N into a single-ended data signal. The serial-parallel converter circuit 220<j> converts an output signal of the receiver 210<j> into an 8-bit data signal (data signals DOj[7:0]) by sampling in accordance with the sampling signals SMP1 to SMP8. The data signals DOj[7:0] are output from the pins ROTj_1 to ROTj_8.

The receiver of this embodiment is not limited to the LVDS receiver and can be used as a variety of receivers for receiving differential signals.

Embodiment 2

In this embodiment, a display system, a touch panel system, and the like are described as examples of semiconductor devices including an LVDS transmission system.

<<Display System 240>>

Figure 10A:
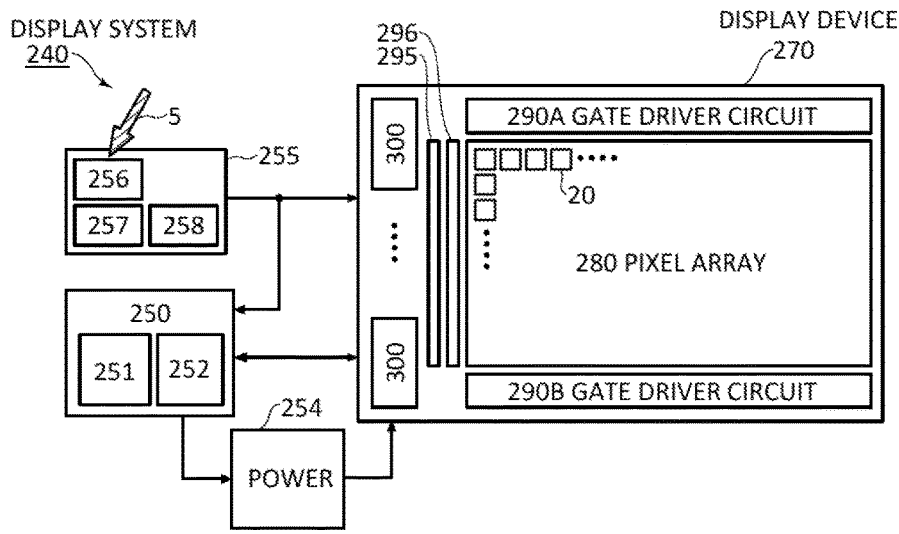
FIG. 10A is a block diagram illustrating a configuration example of a display system.

FIG. 10A is a block diagram illustrating a configuration example of a display system. The display system 240 includes a processing unit 250, a power supply circuit 254, and a display device 270. The display device 270 includes a pixel array 280, gate driver circuits 290A and 290B, switch arrays 295 and 296, and a display controller IC 300.

The processing unit 250 includes an execution unit 251 and a memory device 252. The execution unit 251 has a function of executing a program. For example, the execution unit 251 is an arithmetic logic unit (ALU), and the memory device 252 is a cache memory. Alternatively, the execution unit 251 can be any of various kinds of processing device such as a central processing unit (CPU), a microprocessor unit (MPU), and a programmable logic device (e.g., FPGA). In that case, the memory device 252 can be a main memory or a cache memory of the processing device. In the case where the display device 270 is incorporated into an electronic device as an electronic component, the processing unit 250 may be a processing device of the electronic device (host device).

The processing unit 250 is a circuit for executing an instruction and controlling the display system 240 collectively. The processing unit 250 executes an instruction input from the outside and an instruction stored in the memory device 252. The processing unit 250 generates signals for controlling the power supply circuit 254 and the display device 270.

The display system 240 includes one or more sensor devices for sensing the usage environment or usage pattern. For example, the display system 240 includes an optical sensor device 256, a tilt sensor device 257, and an open/close sensor device 258. Note that these sensor devices 256 to 258 may be collectively referred to herein as a sensor unit 255 in some cases for convenience. A sensing signal from the sensor unit 255 is transmitted to the processing unit 250 and the display device 270.

The optical sensor device 256 has a function of measuring the illuminance of external light 5. The optical sensor device 256 may have a function of measuring the color temperature of the external light 5. The tilt sensor device 257 is a sensor device for sensing the tilt of a screen of the display device 270. The open/close sensor device 258 is a sensor device for sensing the open/close state of a housing in which the display device 270 is incorporated.

<Display Device 270>

An example where the display device 270 is a hybrid display device is described here. The display device 270 includes the pixel array 280, the gate driver circuits 290A and 290B, the switch arrays 295 and 296, and the display controller IC 300. The gate driver circuits 290A and 290B and the switch arrays 295 and 296 are circuits formed over the same substrate as the pixel array 280. Note that, in some cases, a substrate for supporting the pixel array 280 may be different from a substrate used for forming the pixel array 280.

One or more display controller ICs 300 are mounted on the display device 270. The number of display controller ICs 300 is determined in accordance with the number of pixels of the pixel array 280. Although the display controller IC 300 is mounted by a chip on glass (COG) method here, there is no particular limitation on the mounting method, and a chip on flexible (COF) method, a tape automated bonding (TAB) method, or the like may be employed. The display controller IC 300 has a function of controlling the operation of the display device 270 collectively in accordance with the control signal from the processing unit 250 and the sensing signal from the sensor unit 255.

(Pixel Array 280)

Figure 11A:
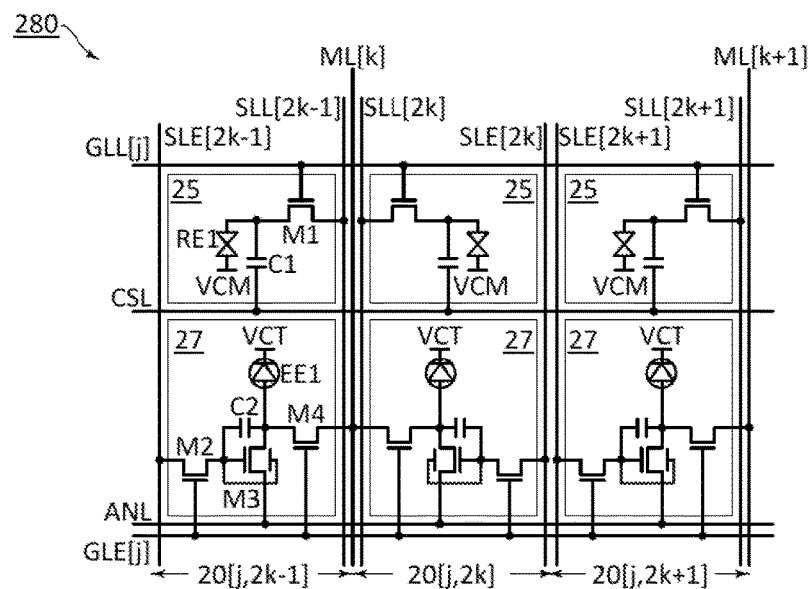
FIG. 11A is a circuit diagram illustrating a configuration example of a pixel array.

The pixel array 280 includes a plurality of subpixels 20 arranged in a matrix of rows and columns. The subpixels 20 are electrically connected to gate lines in corresponding rows and electrically connected to source lines in corresponding columns. FIG. 11A illustrates a configuration example of the pixel array 280.

FIG. 11A specifically illustrates three subpixels 20 arranged in one row and three columns. A subpixel 20[j, 2k] represents the subpixel 20 in the j-th row and the 2k-th column. A wiring GLL[j] represents the wiring GLL in the j-th row. A wiring SLE[k] represents the wiring SLE in the k-th column. Note that j and k are each an integer larger than 1.

The subpixel 20 includes subpixels 25 and 27. The subpixel 25 is electrically connected to the wirings GLL and SLL and a wiring CSL. The subpixel 27 is electrically connected to the wirings GLE and SLE, a wiring ML, and a wiring ANL.

The wirings GLL and GLE are gate lines. The wiring GLL is electrically connected to the gate driver circuit 290A, and the wiring GLE is electrically connected to the gate driver circuit 290B. Note that two gate driver circuits 290A may be provided in the display device 270; one is electrically connected to wirings GLL in odd-numbered rows and the other is electrically connected to wirings GLL in even-numbered rows. The same applies to the gate driver circuit 290B.

The wirings SLL and SLE are source lines. The wiring SLL[2k−1] and the wiring SLL[2k] are adjacently provided with the wiring ML[k] therebetween. The wiring SLE[2k] and the wiring SLE[2k+1] are adjacently provided.

The wirings SLL and SLE are electrically connected to the display controller IC 300 through the switch array 295. The switch array 295 has a function of selecting among the wirings SLL and SLE electrically connected to the display controller IC 300.

The subpixels 25 constitute a reflective display screen. The subpixels 27 constitute a light-emitting display screen.

(Subpixel 25)

The subpixel 25 includes a transistor M1, a capacitor C1, and a liquid crystal (LC) element RE1. The LC element RE1 includes a pixel electrode, a common electrode, and a liquid crystal layer. Here, the pixel electrode is a reflective electrode having a function of reflecting external light. A voltage VCM is input to the common electrode. The voltage VCM is a common voltage for the LC element RE1 and is supplied by the power supply circuit 254. The wiring CSL is a capacitor line for applying a voltage to the capacitor C1.

Although the configuration of the subpixel 25 is the same as that of a subpixel of a reflective liquid crystal display device, the configuration of the subpixel 25 is not limited thereto. It is acceptable as long as the subpixel 25 has a structure capable of performing display using external light. Examples of a display element used in the subpixel 25 include a MEMS element and a display element using any of electrophoresis, particle movement, and particle rotation.

(Subpixel 27)

The subpixel 27 includes transistors M2 to M4, a capacitor C2, and an electroluminescent (EL) element EE1. The EL element EE1 includes a pair of electrodes (an anode and a cathode) and an EL layer placed between the pair of electrodes. In the example of FIG. 11A, a pixel electrode of the EL element EE1 is the anode and a common electrode thereof is the cathode. The EL layer at least includes a layer containing a light-emitting material (light-emitting layer). Moreover, another functional layer such as a layer containing an electron-transport material (electron-transport layer) or a layer containing a hole-transport material (hole-transport layer) can be provided in the EL layer as appropriate. The EL element is referred to as an organic EL element when containing an organic light-emitting material, and is referred to as an inorganic EL element when containing an inorganic light-emitting material. It is acceptable as long as a display element in the subpixel 27 is a light-emitting element; the display element is not limited to the EL element. Examples of the light-emitting element include a light-emitting diode, a light-emitting transistor, and a quantum-dot light-emitting diode.

A voltage VCT which is input to the common electrode of the EL element EE1 is a common voltage for the EL element EE1. The wiring ANL is an anode line, to which a voltage higher than the voltage VCT is input.

The transistor M2 is a selection transistor, and the transistor M3 is a driving transistor. The capacitor C2 is provided to hold a gate voltage of the transistor M3.

The transistor M4 functions as a switch that controls electrical connection between the pixel electrode of the EL element EE1 and the wiring ML. The wiring ML is a monitor line for detecting a current flowing in the subpixel 27. In addition, the wiring ML has a function of a power supply line for supplying a constant voltage to the pixel electrode. The wiring ML is electrically connected to the display controller IC 300 through the switch array 296. The switch array 296 has a function of controlling electrical connection between the wiring ML and the display controller IC 300 and a function of inputting a constant voltage to the wiring ML. Here, one wiring ML is shared by an odd-numbered column and an even-numbered column.

In the subpixel 20, the transistor M3 has a back gate. The current driving capability of the transistor M3 is increased by electrical connection between the back gate and a gate of the transistor M3. The back gate of the transistor M3 may be electrically connected to a drain or a source thereof. The transistor M1 may have a back gate, and the back gate may be electrically connected to a gate, a drain, or a source thereof. The same applies to the transistors M1, M2, and M4.

When the display device 270 displays color images, one pixel is constituted by a plurality of subpixels 20 for expressing different display colors. For example, one pixel can be constituted by three subpixels 20 for expressing respective colors of red (R), green (G), and blue (B).

In this specification, to distinguish the components according to the color expressed by subpixels, an identification sign such as "R" or "_R" is added to reference numerals. For example, a subpixel 20R represents a subpixel 20 for expressing red. A wiring SLL_G[k] represents the k-th wiring SLL to which a data signal for green is input.

The configuration of the pixel is not limited to the above-described example. The pixel can be constituted by one subpixel 20R, one subpixel 20G, and two subpixels 20B, for example. A unit pixel can be constituted by four subpixels 20 that express different colors. Examples of a combination of four colors in this case include [R, G, B, W (white)], [R, G, B, Y (yellow)], and [R, G, B, and C (cyan)].

The size of the transistor in the subpixel 27 may differ depending on the color. For example, in the case where the pixel is constituted by three subpixels 20 for R, G, and B, the transistor M3 in the subpixel 27B has a smaller channel width than the transistors M3 in the subpixels 27R and 27G.

In the pixel array 280, the subpixels 25 constitute a reflective display screen, and the subpixels 27 constitute a light-emitting display screen. The display principles of the display device 270 are described with reference to FIG. 11B.

Figure 11B:
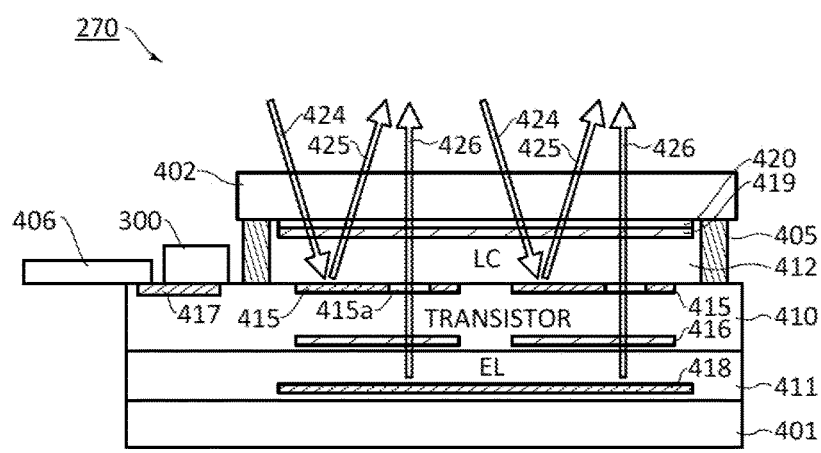
FIG. 11B is a schematic diagram illustrating display principles of a display device.

FIG. 11B schematically illustrates a stacked-layer structure of the display device 270. The display device 270 includes a transistor layer 410, an EL element layer 411, and an LC layer 412 between a substrate 401 and a substrate 402. The LC layer 412 exists in a gap formed by a sealant 405 between the substrate 402 and the transistor layer 410. In the example in FIG. 11B, the transistor layer 410 and the EL element layer 411 are attached to the substrate 401 after being separated from a support substrate used for manufacturing.

The transistor layer 410 is a layer where elements included in the pixel array 280, the gate driver circuits 290A and 290B, and the switch arrays 295 and 296 are provided. Examples of these elements are a transistor, a capacitor, a rectifier element, and a resistor. The transistor layer 410 may include two or more stacked transistor layers.

There is no particular limitation on device structures of various elements such as transistors and capacitors provided in the transistor layer 410. Device structures are selected to be suited for the functions of the pixel array 280, the gate driver circuits 290A and 290B, and the switch arrays 295 and 296. Examples of transistor structures classified by gate structure are a top-gate structure, a bottom-gate structure, a dual-gate structure provided with both a gate (front gate) and a bottom gate, and a multi-channel structure (also referred to as a multi-gate structure) including a plurality of channel formation regions. There is no particular limitation on types (e.g., a composition and a crystal structure) of a semiconductor contained in a channel formation region (semiconductor layer) of a transistor. A semiconductor used for the channel formation region is roughly divided into a single crystal semiconductor and a non-single-crystal semiconductor. Examples of the non-single-crystal semiconductor include a polycrystalline semiconductor, a microcrystalline semiconductor, and an amorphous semiconductor. Examples of semiconductor materials include a semiconductor containing one or more kinds of Group 14 elements such as Si, Ge, or C (e.g., silicon, silicon germanium, and silicon carbide), a metal oxide semiconductor, and a compound semiconductor such as gallium nitride.

In the transistor layer 410, a pixel electrode 415 of the LC element RE1, a pixel electrode 416 of the EL element EE1, and a terminal portion 417 are provided. The pixel electrode 415 is a reflective electrode, and the pixel electrode 416 is a transmissive electrode. The pixel electrode 415 has an opening 415a to extract light 426 from the EL element EE1. The display controller IC 300 and an FPC 406 are electrically connected to the terminal portion 417. The FPC 406 functions as a transmission path between the processing unit 250 and the display controller IC 300.

In the EL element layer 411, an EL layer and a common electrode 418 of the EL element EE1 are provided. The common electrode 418 is a reflective electrode. The substrate 402 is provided with a common electrode 419 of the LC element, a color filter 420, and the like. For the substrate 402, an optical film (e.g., a polarizing film, a retardation film, a prism sheet, or an anti-reflection film) or the like may be provided on a surface on which external light 424 is incident.

The display device 270 is a hybrid display device that has functions of both a reflective display device that performs display using external light and a light-emitting display device that performs display using light from light-emitting elements. The external light 424 enters through the substrate 402, is transmitted through the color filter 420, the common electrode 419, and the LC layer 412, and is reflected by the pixel electrode 415. Light 425 reflected by the pixel electrode 415 passes through the LC layer 412, the common electrode 419, and the color filter 420 and exits through the substrate 402. The luminance of the light 425 is determined by a potential difference between the pixel electrode 415 and the common electrode 419. The luminance of the light 426 is determined by a current flowing between the pixel electrode 416 and the common electrode 418. The light 426 is reflected by the common electrode 418, passes through the opening 415a in the pixel electrode 415, is transmitted through the LC layer 412, the common electrode 419, and the color filter 420, and is extracted through the substrate 402.

Figure 12:
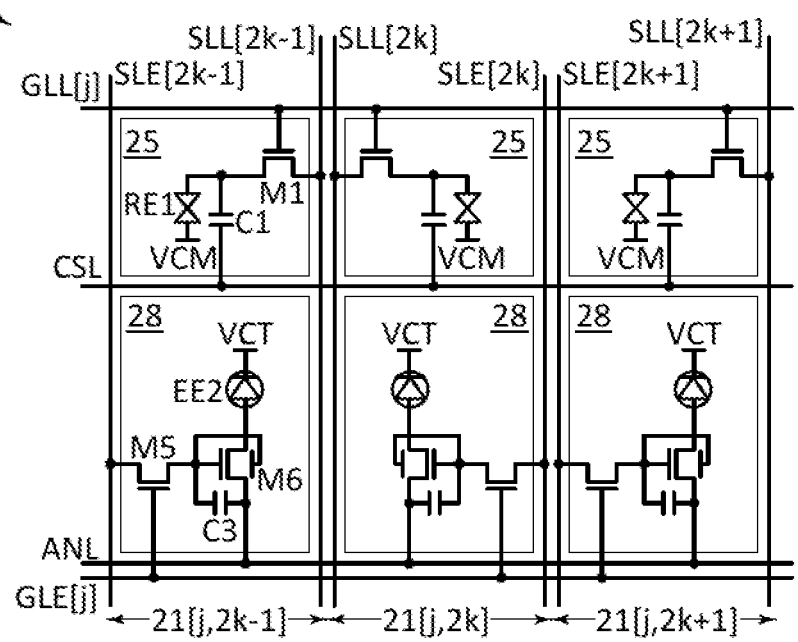
FIG. 12 is a circuit diagram illustrating a configuration example of a pixel array.
Figure 13A:
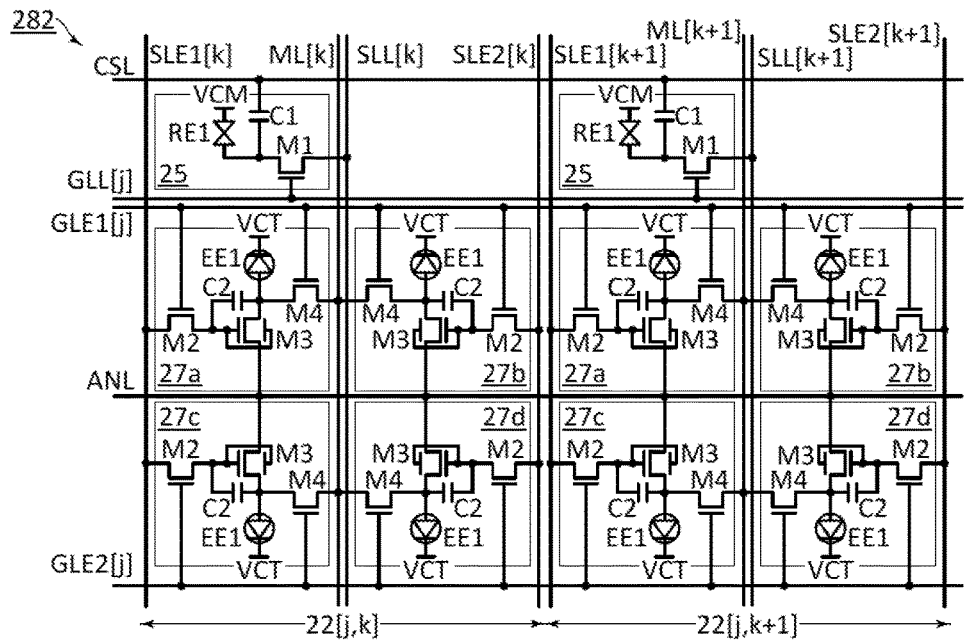
FIGS. 13A and 13B are circuit diagrams each illustrating a configuration example of a pixel array.
Figure 13B:
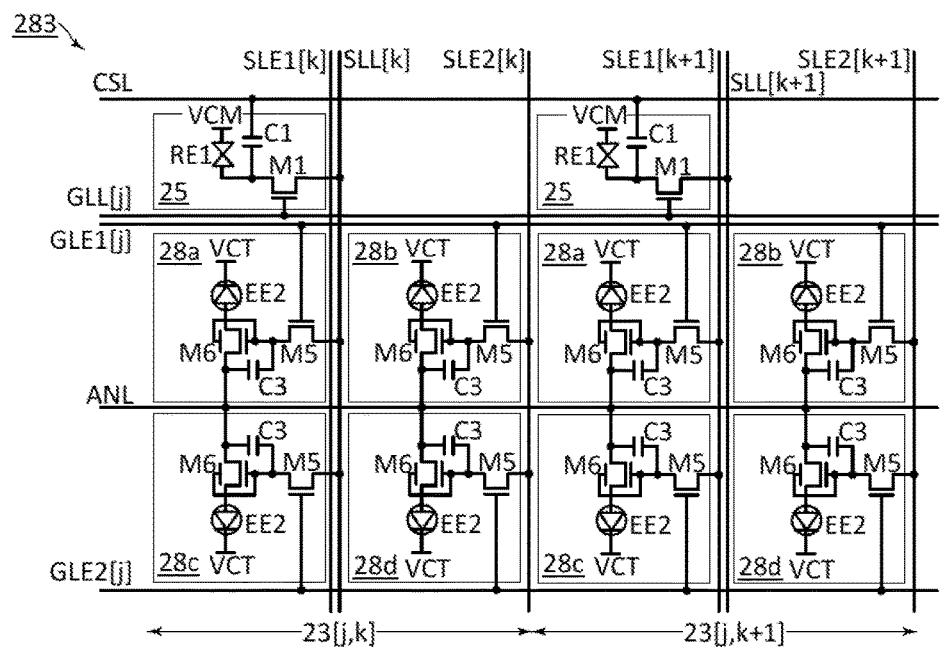

FIGS. 12, 13A, and 13B illustrate other configuration examples of pixel arrays in a hybrid display device.

<<Pixel Array 281>>

The pixel array 281 illustrated in FIG. 12 is a modification example of the pixel array 280 (see FIG. 11A). The pixel array 281 does not include the wirings ML. The pixel array 281 includes subpixels 21. The subpixels 21 each include the subpixel 25 and a subpixel 28. The subpixel 28 includes an EL element EE2, transistors M5 and M6, and a capacitor C3. In the subpixel 28, a storage capacitor for holding a voltage between a gate of the transistor M6 and a pixel electrode of the EL element EE2 may be provided, as in the subpixel 27.

<<Pixel Array 282>>

The pixel array 282 includes subpixels 22 and wirings GLL, GLE1, GLE2, SLL, SLE1, SLE2, CSL, and ANL. The subpixels 22 each include the subpixel 25 and subpixels 27a to 27d. The subpixels 27a to 27d have a configuration similar to that of the subpixel 27.

The wiring GLE1 is a gate line for selecting the subpixels 27a and 27b. The wiring GLE2 is a gate line for selecting the subpixels 27c and 27d. The wiring SLE1 is a source line for transmitting a data signal to the subpixels 27a and 27c. The wiring SLE2 is a source line for transmitting a data signal to the subpixels 27b and 27d.

In the example in FIG. 13A, one subpixel 22 can constitute a pixel. For example, the reflective subpixel 25 is used to display a monochrome image (black-and-white binary image or grayscale image), and the four light-emitting subpixels 27a to 27d are used to display a color image. In that case, colors expressed by the subpixels 27a to 27d may be R, G, B, and W, respectively, for example.

<<Pixel Array 283>>

The pixel array 283 illustrated in FIG. 13B is a modification example of the pixel array 282 and includes subpixels 23 instead of the subpixels 22. The pixel array 283 does not include the wirings ML. The subpixels 23 each include the subpixel 25 and subpixels 28a to 28d. The subpixels 28a to 28d have a configuration similar to that of the subpixel 28. Like the subpixel 22, one subpixel 23 can constitute a pixel.

In the display system of this embodiment, the display device is not limited to the hybrid display device. For example, a variety of display devices such as a liquid crystal display device, an EL display device, an electronic paper display device, and a quantum-dot display device can be used.

<<Display Controller IC 300>>

Figure 10B:
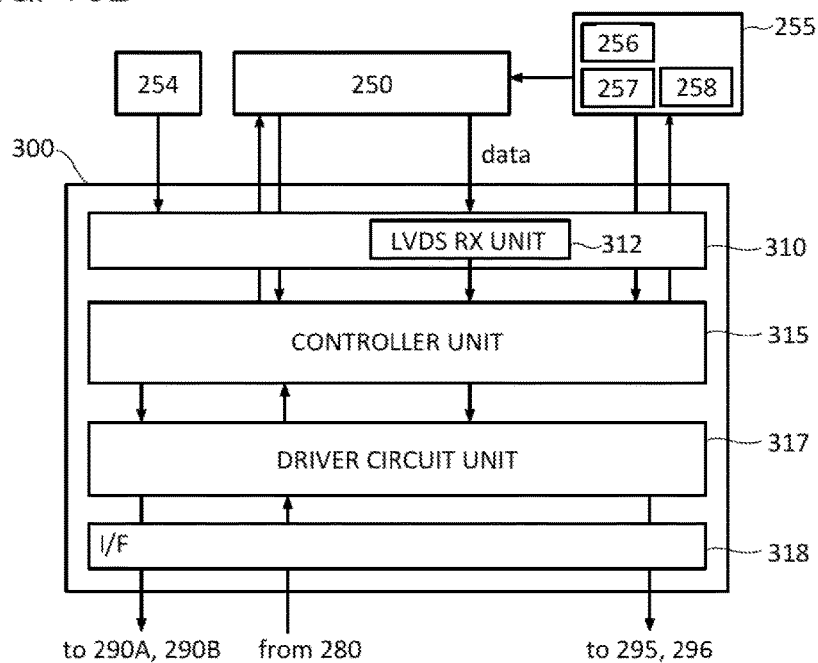
FIG. 10B is a block diagram illustrating a configuration example of a display controller IC.

FIG. 10B illustrates a configuration example of the display controller IC 300. The display controller IC 300 includes interface circuits 310 and 318, a controller unit 315, and a driver circuit unit 317.

The interface circuit 310 is an interface with the processing unit 250, the power supply circuit 254, and the sensor unit 255. An LVDS receiver unit 312 is included in order to receive a data signal transmitted from the processing unit 250. The data signal is a video grayscale data signal in digital format and represents a gray level. The data signal is converted into a differential signal by an LVDS transmitter unit of the processing unit 250. The LVDS receiver unit 312 converts the data signal into a single-ended signal and outputs it to the controller unit 315.

The controller unit 315 has a function of performing image processing on the received data signal in accordance with the control signal transmitted from the processing unit 250, the signal transmitted from the sensor unit 255, or the like. The controller unit 315 has a function of generating timing signals for the driver circuit unit 317 and the gate driver circuits 290A and 290B. The timing signal for the gate driver circuits 290A and 290B is output from the interface circuit 318 after level shifting by the driver circuit unit 317.

The driver circuit unit 317 converts the data signal processed by the controller unit 315 into an analog signal to generate an analog grayscale data signal. The analog grayscale data signal is input to the pixel array 280 through the interface circuit 318 and the switch array 295.

A current signal flowing through the wiring ML in the pixel array 280 is input to the driver circuit unit 317 through the switch array 296 and the interface circuit 318. The driver circuit unit 317 converts the current signal into a digital signal and outputs it to the controller unit 315. The controller unit 315 has a function of performing image processing in accordance with this signal.

<LVDS Receiver Unit 312>

Figure 14:
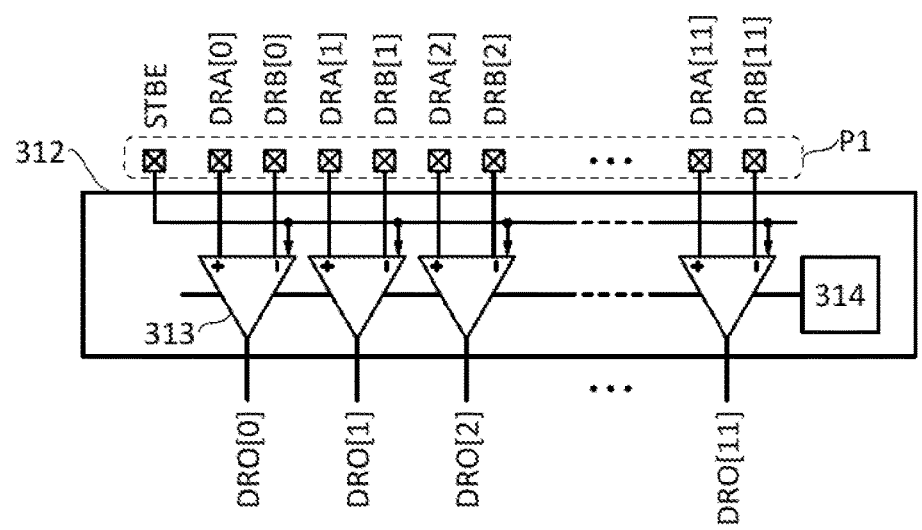
FIG. 14 is a block diagram illustrating a configuration example of an LVDS receiver unit.

FIG. 14 illustrates a configuration example of the LVDS receiver unit 312. The LVDS receiver unit 312 is electrically connected to pins P1 of the display controller IC 300.

Here, the data signal is a 12-bit grayscale data signal. The signal STBE and 12-bit data signals DRA[11:0] and DRB[11:0] which are transmitted from the processing unit 250 are input to the LVDS receiver unit 312 through the pins P1. The LVDS receiver unit 312 converts the data signals DRA[11:0] and DRB[11:0] into single-ended data signals DRO[11:0]. The data signals DRO[11:0] are input to the controller unit 315.

The LVDS receiver unit 312 includes 12 data lanes and a bias voltage generation circuit 314. A receiver 313 is provided in each lane. The bias voltage generation circuit 314 generates a bias voltage used by the receivers 313.

The receiver 313 is an LVDS receiver, whose pair of input terminals is terminated. As the receiver 313, the receiver in Embodiment 1 can be used. The receiver 313 preferably has a standby function; here, the receiver 143 (FIG. 5) is used as the receiver 313. For example, the signal STBE is transmitted from the processing unit 250. The bias voltage generation circuit and a bias current generation circuit for the receiver 313 are provided in the controller unit. The signal STBE is also input to the controller unit 315 and the driver circuit unit 317.

<<Controller Unit 315>>

Figure 15:
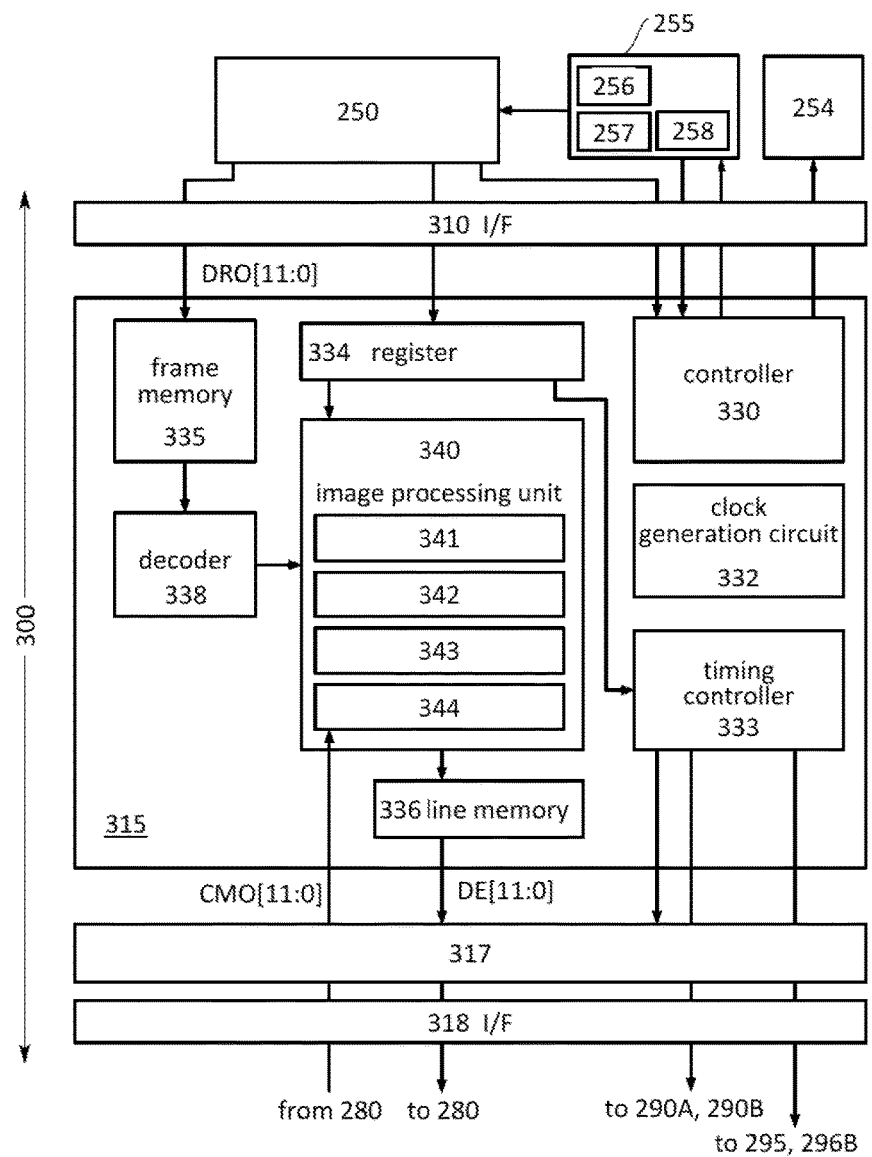
FIG. 15 is a block diagram illustrating a configuration example of a display controller IC.

FIG. 15 illustrates a configuration example of the controller unit 315. The controller unit 315 includes a controller 330, a clock generation circuit 332, a timing controller 333, a register 334, a frame memory 335, a line memory 336, a decoder 338, and an image processing unit 340. Circuits included in the controller unit 315 and functions thereof are selected as appropriate depending on the standard of the processing unit 250, the specifications of the display device 270, and the like.

The controller 330 controls the controller unit 315 collectively in accordance with the signals transmitted from the processing unit 250 and the sensor unit 255. The controller 330 has a function of controlling the sensor unit 255. The controller 330 may have a function of controlling the power supply circuit 254.

The clock generation circuit 332 generates a clock signal to be used in the display controller IC 300. The timing controller 333 has a function of generating timing signals (e.g., a start pulse signal and a clock signal) to be used in the driver circuit unit 317 and the gate driver circuits 290A and 290B. The register 334 stores data generated by the controller 330, the image processing unit 340, the processing unit 250, and the like. Examples of the data include a parameter used to perform correction processing in the image processing unit 340, parameters used to generate waveforms of a variety of timing signals in the timing controller 333, and the like.

The frame memory 335 is a memory for storing the data signals DRO[11:0]. The data signals read from the frame memory 335 are transmitted to the image processing unit 340 after decompression by the decoder 338. Alternatively, the data signals DRO[11:0] may be decompressed by the decoder 338, and the decompressed data signals may be stored in the frame memory 335. When decompression of the data signals is not needed, processing is not performed in the decoder 338.

The image processing unit 340 has a function of performing various kinds of image processing on the data signals. For example, the image processing unit 340 includes a gamma correction circuit 341, a dimming circuit 342, a toning circuit 343, and an EL correction circuit 344.

The EL correction circuit 344 is provided in the case where the driver circuit unit 317 is provided with a current detection circuit that detects current flowing through the subpixel 27. The EL correction circuit 344 has a function of adjusting the luminance of the EL element EE1 on the basis of signals CMO[11:0] transmitted from the current detection circuit of the driver circuit unit 317.

In the case where the pixel of the display device 270 is constituted by the subpixels 20R, 20G, 20B, and 20W, the image processing unit 340 preferably includes an RGB-RGBW conversion circuit. The RGB-RGBW conversion circuit has a function of converting RGB grayscale data into RGBW grayscale data. Display color conversion is not limited to RGB-RGBW conversion and may be RGB-RGBY conversion, grayscale conversion, or the like, for example.

Image correction processing such as gamma correction, dimming, or toning corresponds to processing of generating output correction data Y with respect to input grayscale data X. A parameter for converting the grayscale data X into the correction data Y is stored in the register 334. The controller 330 performs control for optimizing the correction processing in accordance with the signals transmitted from the processing unit 250 and the sensor unit 255.

Figure 16:
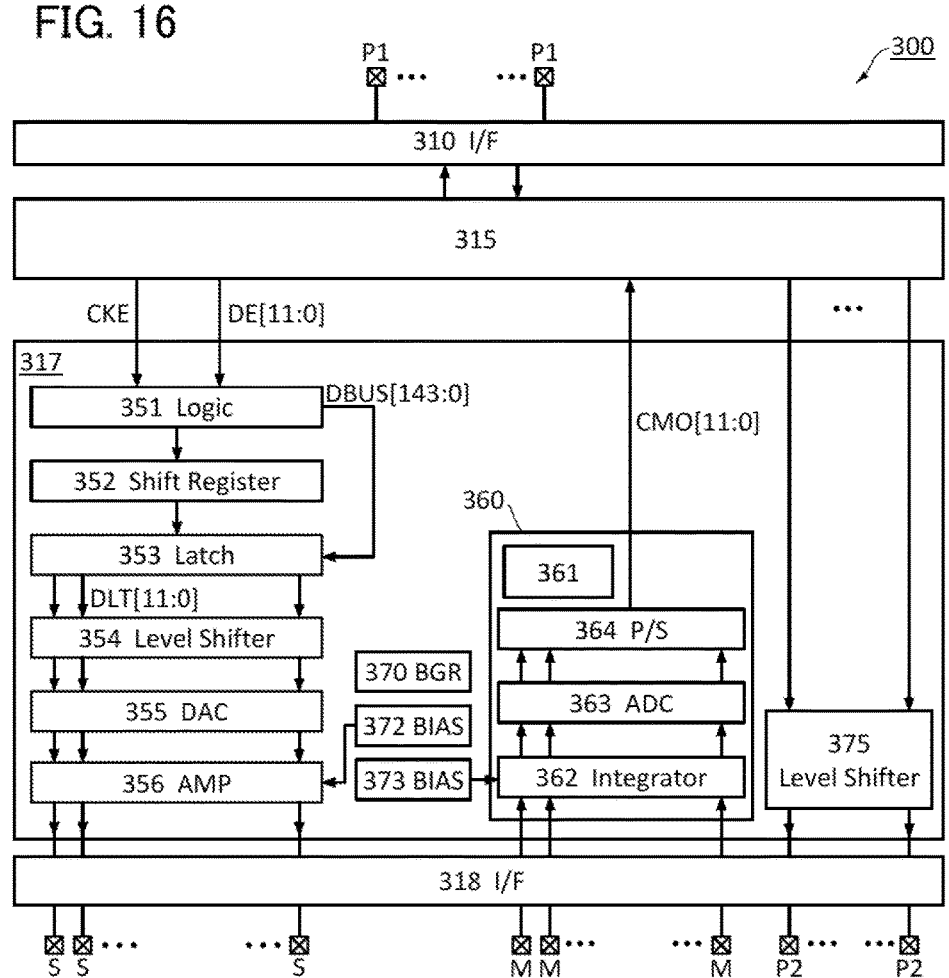
FIG. 16 is a block diagram illustrating a configuration example of a source driver circuit.

The data signals processed by the image processing unit 340 are temporarily stored in the line memory 336. Data signals DE[11:0] read from the line memory 336 are transmitted to the driver circuit unit 317. FIG. 16 illustrates a configuration example of the driver circuit unit 317.

<<Driver Circuit Unit 317>>

Pins S are output pins for the data signals. The pins S are each electrically connected to the wiring SLL or the wiring SLE through the switch array 295. Pins M are input pins for the current signals. The pins M are each electrically connected to the wiring ML through the switch array 296. Pins P2 are output pins for the control signals. The pins P2 are each electrically connected to any of the gate driver circuits 290A and 290B and the switch arrays 295 and 296.

The driver circuit unit 317 includes a control logic circuit 351, a shift register 352, a latch circuit 353, a level shifter 354, a digital-analog converter circuit (DAC) 355, an amplifier circuit (AMP) 356, a current detection circuit 360, a bandgap reference circuit (BGR) 370, bias voltage generation circuits (BIAS) 372 and 373, and a level shifter 375. The current detection circuit 360 includes a control logic circuit 361, an integrator circuit 362, an analog-digital converter circuit (ADC) 363, and a parallel-serial (P/S) converter circuit 364.

A clock signal CKE and the data signals DE[11:0] are input to the control logic circuit 351 from the controller unit 315. The control logic circuit 351 converts the data signals DE[11:0] into parallel signals by using the clock signal CKE to generate data signals DBUS[143:0]. The data signals DBUS[143:0] are transmitted to an internal bus. The control logic circuit 351 generates a clock signal and a start pulse signal used in the shift register 352, a latch control signal used in the latch circuit 353, and the like from the signals transmitted from the controller unit 315.

The shift register 352 generates a sampling signal for controlling the timing at which the latch circuit 353 stores the data signals DBUS[143:0].

The latch circuit 353 stores the data signals DBUS[143:0] in accordance with the sampling signal from the shift register 352. Each line of the latch circuit 353 stores a 12-bit data signal (data signals DLT[11:0]). In accordance with the latch control signal, every line of the latch circuit 353 outputs the data signals DLT[11:0] to the level shifter 354.

Each line of the level shifter 354 boosts the data signals DLT[11:0] that are output from the latch circuit 353, and then outputs the boosted data signals. Each line of the DAC 355 has a function of converting a 12-bit data signal into an analog data signal and a function of determining the polarity of the analog data signal. The analog data signal that is output from each line of the DAC 355 is amplified by the amplifier circuit 356 and output from the pin S through the interface circuit 318.

The current signal flowing through the pin M is converted into a voltage signal by the integrator circuit 362. The ADC 363 converts the voltage signal into a 12-bit digital signal. The parallel-serial converter circuit 364 converts the 12-bit parallel signal into a serial signal and outputs the serial signal. The signals CMO[11:0] are output signals of the parallel-serial converter circuit 364.

The bias voltage generation circuit 372 generates a bias voltage to be used in the amplifier circuit 356, and the bias voltage generation circuit 373 generates a bias voltage to be used in the integrator circuit 362. The BGR 370 is a circuit for generating a reference current to be used in the bias voltage generation circuits 372 and 373. The BGR 370 also generates a reference voltage to be used in the bias voltage generation circuit 314 of the LVDS receiver unit 312 (see FIG. 14).

The level shifter 375 is a circuit for boosting the control signals for the gate driver circuits 290A and 290B and the switch arrays 295 and 296 which are generated by the controller unit 315. The control signals boosted by the level shifter 375 are output from the pins P2 through the interface circuit 318.

<<Switch Array 295>>

Figure 17A:
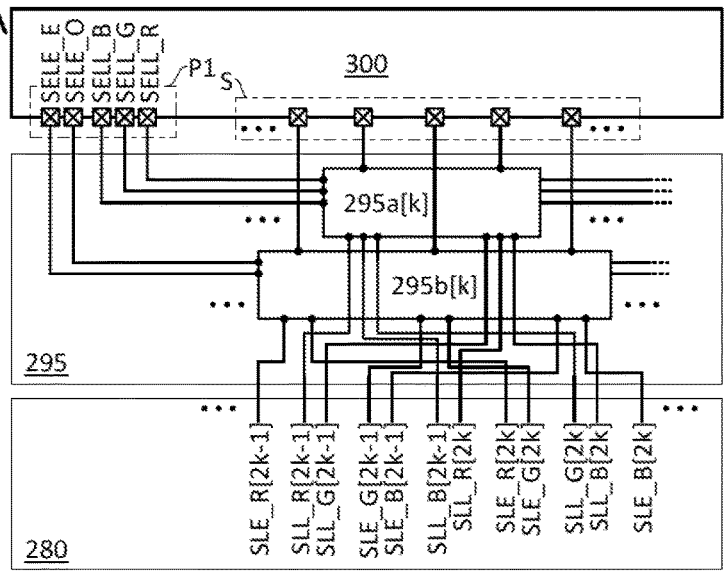
FIG. 17A is a block diagram illustrating a configuration example of a switch array.

FIG. 17A illustrates a configuration example of the switch array 295. The switch array 295 includes switch circuits 295*a* and 295*b* and is electrically connected to the pins S and the pins P1 of the display controller IC 300. The pins P1 are output pins for signals for selecting source lines (signals SELL_R, SELL_G, SELL_B, SELE_O, and SELE_E). Here, the pixel is constituted by three (RGB) subpixels 20.

The switch array 295 is provided to drive the source lines by time division. Providing the switch array 295 allows the number of pins S of the display controller IC 300 to be reduced. The switch array 295 is provided as appropriate in accordance with the number of pins S of the display controller IC 300 and the numbers of wirings SLE and SLL.

Figure 17B:
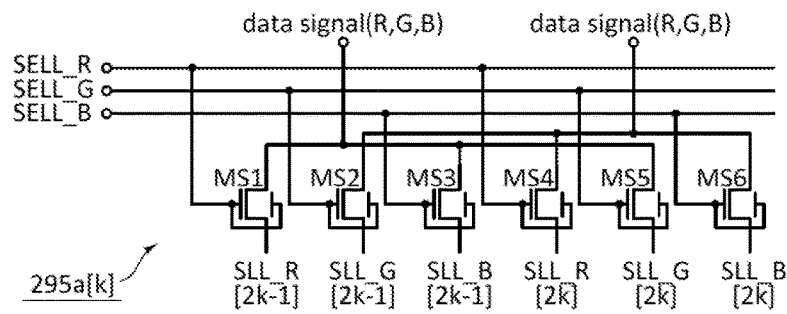
FIGS. 17B and 17C are circuit diagrams each illustrating a configuration example of a switch circuit.

The switch circuit 295*a* has a function of selecting a wiring SLL to which a data signal is to be input. FIG. 17B illustrates a configuration example of a switch circuit 295*a*[k]. The switch circuit 295*a*[k] is constituted by a two-input, six-output demultiplexer (DeMUX) and includes transistors MS1 to MS6. The switch circuit 295*a* has a function of dividing a data signal input from the display controller IC 300 into three (RGB). For example, in a period where the data signal output from the display controller IC 300 is a data signal for R, the signal SELL_R is "H" and the data signal is input to wirings SLL_R[2k−1] and SLL_R[2k].

Figure 17C:
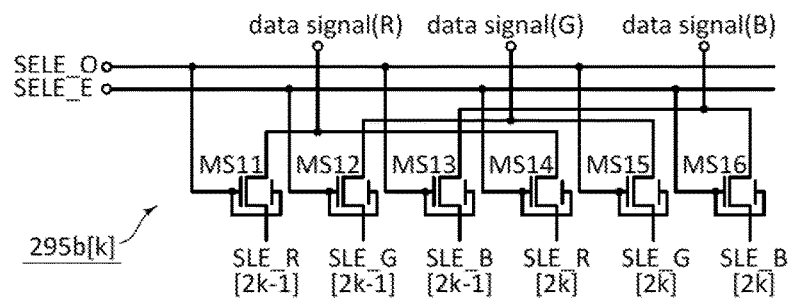

The switch circuit 295*b* has a function of selecting a wiring SLE to which a data signal is to be input. FIG. 17C illustrates a configuration example of a switch circuit 295*b*[k]. The switch circuit 295*b*[k] is constituted by a three-input, six-output demultiplexer (DeMUX) and includes transistors MS11 to MS16. The switch circuit 295*b* has a function of dividing each of the data signals for R, G, and B that are input from the display controller IC 300 into two. When the signal SELE_O is "H", the data signal is input to the wirings SLE_R, SLE_G, and SLE_B in the odd-numbered columns. When the signal SELE_E is "H", the data signal is input to the wirings SLE_R, SLE_G, and SLE_B in the even-numbered columns.

<<Switch Array 296>>

Figure 18A:
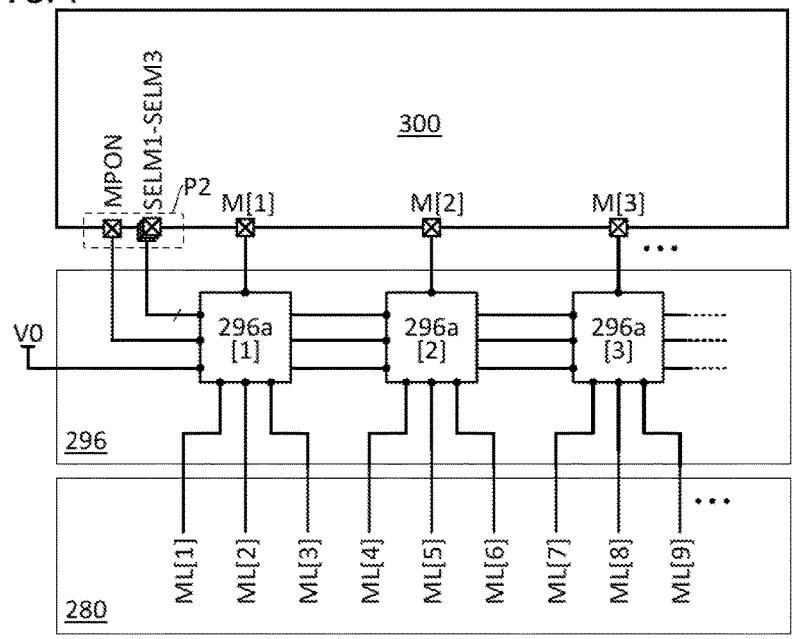
FIG. 18A is a block diagram illustrating a configuration example of a switch array.

FIG. 18A illustrates a configuration example of the switch array 296. The switch array 296 includes switch circuits 296*a* and is electrically connected to the pins M and the pins P2 of the display controller IC 300. The pins P2 are output pins for signals for selecting the wirings ML (signals SELM1 to SELM3) and a signal MPON. A voltage V0 is input to the switch array 296 from the power supply circuit 254.

Figure 18B:
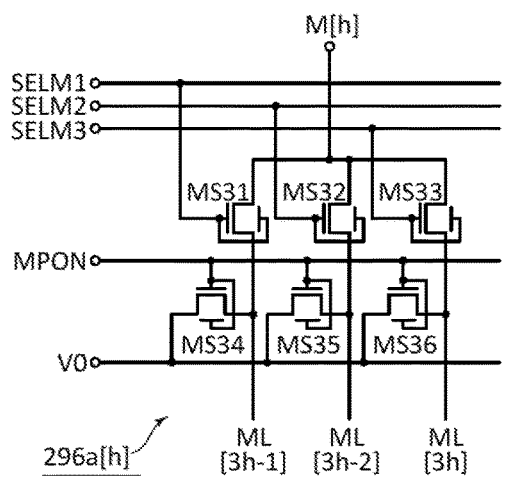
FIG. 18B is a circuit diagram illustrating a configuration example of a switch circuit.

FIG. 18B illustrates a configuration example of a switch circuit 296*a*[h] (h is an integer of 1 or more). The switch circuit 296*a*[h] includes transistors MS31 to MS36. The transistors MS31 to MS33 constitute a three-input, one-output multiplexer. Each of the transistors MS34 to MS36 functions as a power switch for supplying the voltage V0 to the wiring ML.

In the case of detecting a current flowing in the pixel array 280, the transistors MS34 to MS36 are turned off with the signal MPON. In accordance with the signals SELM1 to SELM3, the switch circuit 296*a*[k] selects one or more or all of the wirings ML[3h−2] to ML[3h] to electrically connect the selected wiring and the pin M[h] to each other.

In the case where the display system 240 displays an image, the voltages of the wirings ML[3h−2] to ML[3h] are fixed. For this purpose, the transistors MS31 to MS33 are turned off with the signals SELM1 to SELM3, and the transistors MS34 to MS36 are turned on with the signal MPON.

<<Operation Mode of Display System>>

An example of operation of the display system 240 is described below.

The display system 240 can have three display modes. The first display mode is a mode for performing display with both the LC element RE1 and the EL element EE1 (hybrid mode). The second display mode is a mode for performing display only with the LC element RE1 (LC mode). The third display mode is a mode for performing display only with the EL element EE1 (EL mode). According to the display principles of the display device 270 in FIG. 11B, the LC mode can be referred to as a reflective mode, and the EL mode as a light-emitting mode or a transmissive mode.

The display mode can be determined by the display controller IC 300. The controller 330 of the display controller IC 300 determines the display mode on the basis of a sensing signal from the sensor unit 255, an interrupt signal for the processing unit 250 based on the operation of a user or the like, etc. For example, the display mode is set to the LC mode in bright environment (e.g., outdoors in fine weather in the daytime) and set to the EL mode in dark environment (e.g., outdoors at night). The display mode is set to the hybrid mode in environment with low-illuminance external light (e.g., illuminated indoors and outdoors in cloudy day), that is, in environment where favorable display quality is not obtained by using only light reflected by the LC element RE1.

The controller 330 transmits a control signal to the image processing unit 340 so that the determined display mode is executed. In accordance with the control signal, the image processing unit 340 processes a grayscale data signal depending on the display mode and the structure of the display device 270.

Note that the processing unit 250 may determine the display mode and transmit a control signal to the display controller IC 300 so that the determined display mode is executed.

<Hybrid Mode>

In the hybrid mode, a data signal at a voltage level corresponding to a gray level is output from the display controller IC 300 to the wirings SLL and SLE.

In some cases, the hybrid mode is executed to correct color tones of the screen by combining display by the LC element RE1 with display by the EL element EE1. For such color tone correction, the optical sensor device 256 may have an additional function of measuring the color tones of the external light 5. For example, in the case where the display system is used in a reddish environment at evening, a blue (B) component is not sufficient only with the display by the LC element RE1; thus, the color tones of an image can be corrected by making the EL element EE1 emit light.

<EL Mode>

When the display mode is set to the EL mode, the subpixel 25 expresses black. Thus, the data signal with a gray level of 0 is output from the pin S for the wiring SLL.

<LC Mode>

When the display mode is set to the LC mode, the subpixel 27 expresses black. In other words, the EL element EE1 is not made to emit light. Thus, the data signal with a gray level of 0 is output from the pin S for the wiring SLE.

(IDS Driving)

For still images, data of an image signal for each frame is not changed, so that it is not necessary to rewrite data of the subpixel 20, particularly the subpixel 25 every frame. In view of this, to display still images in the LC mode, a driving method may be performed in which rewriting data of the subpixels 20 is temporarily stopped in a period longer than one frame period. Here, such a driving method is referred to as idling stop (IDS) driving.

The frequency of data rewriting is determined in consideration of the refresh rate or the like. The data retention period in IDS driving is determined in consideration of burn-in of liquid crystal and is, for example, one second at the longest, or approximately 0.5 seconds or less or 0.2 seconds or less.

In a period where data rewriting is stopped, circuits which do not need to operate, such as the LVDS receiver unit 312 and the gate driver circuits 290A and 290B, can be put in the standby mode. This enables the power consumption of the display device 270 to be reduced.

The amount of charge leakage from the capacitor C1 (see FIG. 11A) of the subpixel 25 is preferably reduced as much as possible so that the display quality in IDS driving is kept the same as in normal driving. This is because the charge leakage causes a change in voltage applied to the LC element RE1, thereby changing the transmittance of the subpixel 25. For this reason, the transistor M1 is preferably a transistor with low off-state current. An example of such a transistor is a transistor in which a channel is formed using a metal oxide semiconductor (hereinafter referred to as metal oxide transistor or OS transistor in some cases). The reason an OS transistor has lower off-state current than a Si transistor is that the bandgap of a semiconductor containing a metal oxide is wider than those of Si and Ge (is 3.0 eV or more).

As an oxide used in a channel formation region, a metal oxide such as In—Sn—Ga—Zn oxide, In—Ga—Zn oxide, In—Sn—Zn oxide, In—Al—Zn oxide, Sn—Ga—Zn oxide, Al—Ga—Zn oxide, Sn—Al—Zn oxide, In—Zn oxide, Sn—Zn oxide, Al—Zn oxide, Zn—Mg oxide, Sn—Mg oxide, In—Mg oxide, In—Ga oxide, In oxide, Sn oxide, or Zn oxide can be used. In addition, these metal oxides may contain another material, such as Sift. An oxide semiconductor for an OS transistor preferably contains at least one of In and Zn.

By reducing impurities serving as electron donors, such as moisture or hydrogen, and also reducing oxygen vacancies, an i-type (intrinsic) or a substantially i-type oxide semiconductor is obtained. Here, such an oxide semiconductor is referred to as a highly purified oxide semiconductor. By forming the channel using a highly purified oxide semiconductor, the off-state current of an OS transistor that is normalized by channel width can be as low as several yoctoamperes per micrometer to several zeptoamperes per micrometer.

The reason the off-state current of an OS transistor is extremely low is that the bandgap of a semiconductor containing a metal oxide is 3.0 eV or more. Since an OS transistor contains a metal oxide in its channel formation region, leakage current due to thermal excitation is low and the off-state current is extremely low.

An OS transistor has a high withstand voltage. This is because a semiconductor containing a metal oxide has a large effective mass of holes and electrons are less likely to be excited. Accordingly, avalanche breakdown or the like is less likely to occur in an OS transistor than in a general transistor including silicon or the like. Because hot-carrier degradation or the like due to the avalanche breakdown is inhibited, the OS transistor has a high drain withstand voltage and can be driven at high source-drain voltage. Hence, the OS transistor is suitable for the transistor in the subpixel 20.

With the use of the metal oxide as a semiconductor in a transistor, a transistor with high field-effect mobility and high switching characteristics can be provided. Therefore, the OS transistor is suitable for the transistors in the gate driver circuits 290A and 290B and the switch arrays 295 and 296. In addition, the OS transistor is not easily affected by a short-channel effect; thus, the gate driver circuits 290A and 290B and the switch arrays 295 and 296 including OS transistors with a short channel length enable the display device 270 to have a narrower bezel.

Favorable modes of the display system that displays still images with IDS driving are to read e-books, view photographs taken with a digital camera, display a home screen or wallpaper, and the like. That is, still images are preferably displayed with IDS driving in a situation where the same image is displayed for a relatively long time and images on the entire screen are switched by the operation of a user, for example.

IDS driving can be performed not only in the LC mode but also in the hybrid mode. When still images are displayed in the hybrid mode, data of the subpixel 25 can be rewritten with IDS driving while data of the subpixel 27 is rewritten every frame period.

In the display system 240, the display device 270 can be controlled in accordance with the sensing signal from the tilt sensor device 257 or the open/close sensor device 258. For example, using the sensing signal from the tilt sensor device 257, the orientation of the screen of the display device 270 is determined and grayscale data signals are rearranged in the processing unit 250 or the display controller IC 300. Accordingly, images can be rotated as the orientation of the screen changes.

For example, the open/close sensor device 258 is provided in the case where the display system 240 is used in a foldable electronic device (such as a cellular phone or a notebook personal computer). In accordance with the sensing signal from the open/close sensor device 258, the processing unit 250 or the display controller IC 300 performs control so as to stop display in the display device 270 when it determines that the electronic device is folded and placed in a state where a display portion thereof is not in use.

Since the display system 240 has three display modes (the reflective, transmissive, and hybrid modes) depending on the illuminance of usage environment, it can display images with high quality (high contrast and high color reproducibility) regardless of the weather (fine, rainy, or cloudy weather), time (day or night), or the like. The display system 240 is therefore suited for a display portion of a portable electronic device used at various places.

Needless to say, the display system can be applied to display portions of various electronic devices other than portable electronic devices.

Another configuration example of a display system is described below. The display system given below as an example has three display modes (hybrid, transmissive, and reflective modes), like the display system 240.

<<Display System 241>>

Figure 19:
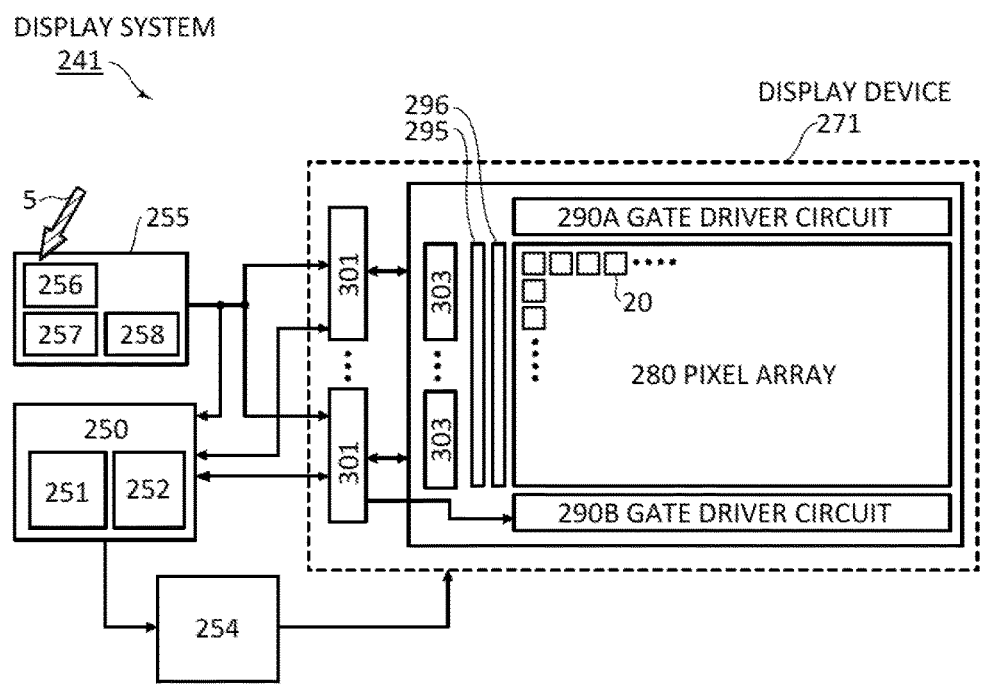
FIG. 19 is a block diagram illustrating a configuration example of a display system.

FIG. 19 illustrates a configuration example of a display system. The display system 241 in FIG. 19 is a modification example of the display system 240 illustrated in FIG. 10A and includes a display device 271 instead of the display device 270. The display device 271 is a modification example of the display device 270 and is mounted with a display controller IC 301 and a source driver IC 303 instead of the display controller IC 300.

Figure 20A:
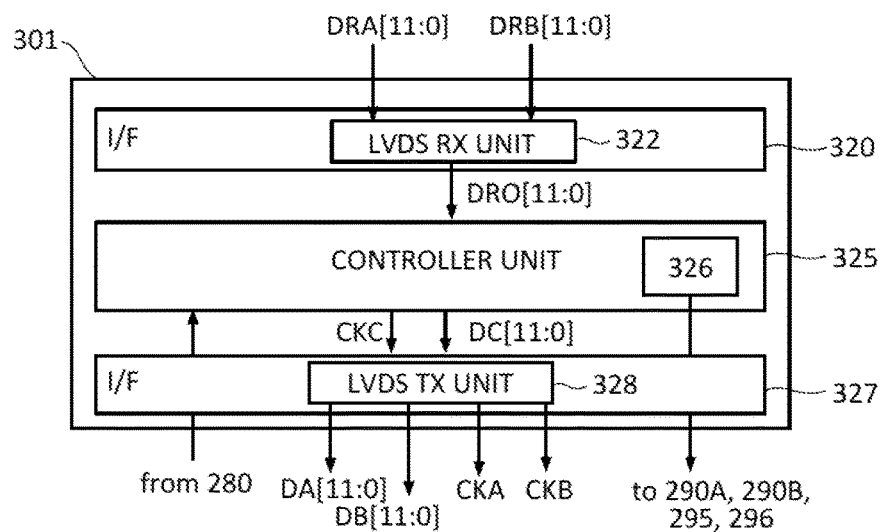
FIG. 20A is a block diagram illustrating a configuration example of a display controller IC.
Figure 20B:
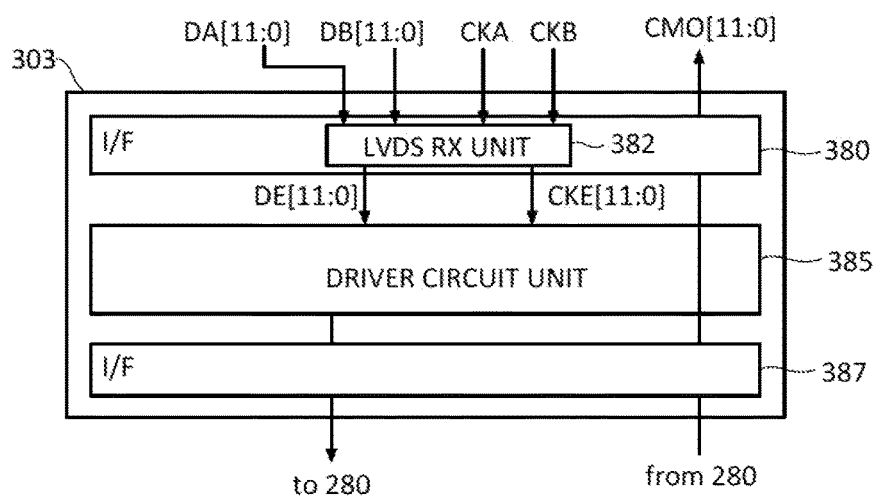
FIG. 20B is a block diagram illustrating a configuration example of a source driver IC.

In the example in FIG. 19, the source driver IC 303 is mounted by a COG method. For example, an FPC is used as a transmission path between the display controller IC 301 and the source driver IC. FIG. 20A illustrates a configuration example of the display controller IC 301, and FIG. 20B illustrates a configuration example of the source driver IC 303.

(Display Controller IC 301)

The display controller IC 301 includes interface circuits 320 and 327 and a controller unit 325. The display controller IC 301 corresponds to the display controller IC 300 excluding the driver circuit unit 317. The controller unit 325 has a circuit configuration similar to that of the controller unit 315. The controller unit 325 may be provided with the level shifter 375 for boosting the control signals for the gate driver circuits 290A and 290B and the switch arrays 295 and 296.

The interface circuit 320 includes an LVDS receiver unit 322. The LVDS receiver unit 322 receives the differential data signals DRA[11:0] and DRB[11:0] and outputs the single-ended data signals DRO[11:0]. The LVDS receiver unit 322 has a configuration similar to that of the LVDS receiver unit 312.

The interface circuit 327 includes an LVDS transceiver unit 328. The LVDS transceiver unit 328 is provided to transmit grayscale data signals to the source driver IC 303 by an LVDS method. The LVDS transceiver unit 328 converts data signals DC[11:0] and a clock signal CKC generated by the controller unit 325 into differential signals. The LVDS transceiver unit 328 outputs the data signals DA[11:0] and DB[11:0] and the clock signals CKA and CKB.

(Source Driver IC 303)

The source driver IC 303 includes interface circuits 380 and 387 and a driver circuit unit 385. The driver circuit unit 385 has a function and a circuit configuration similar to those of the driver circuit unit 317. The interface circuit 387 has a function and a configuration similar to those of the interface circuit 318.

The interface circuit 380 includes an LVDS receiver unit 382. The LVDS receiver unit 382 has a configuration similar to that of the LVDS receiver unit 312, and additionally includes clock lanes for receiving the clock signals CKA and CKB. The LVDS receiver unit 382 receives the data signals DA[11:0] and DB[11:0] and the clock signals CKA and CKB and converts the received data signals and clock signals into single-ended data signals DE[11:0] and clock signals CKE[11:0], respectively.

<<Modification Example of Display System>>

Figure 21A:
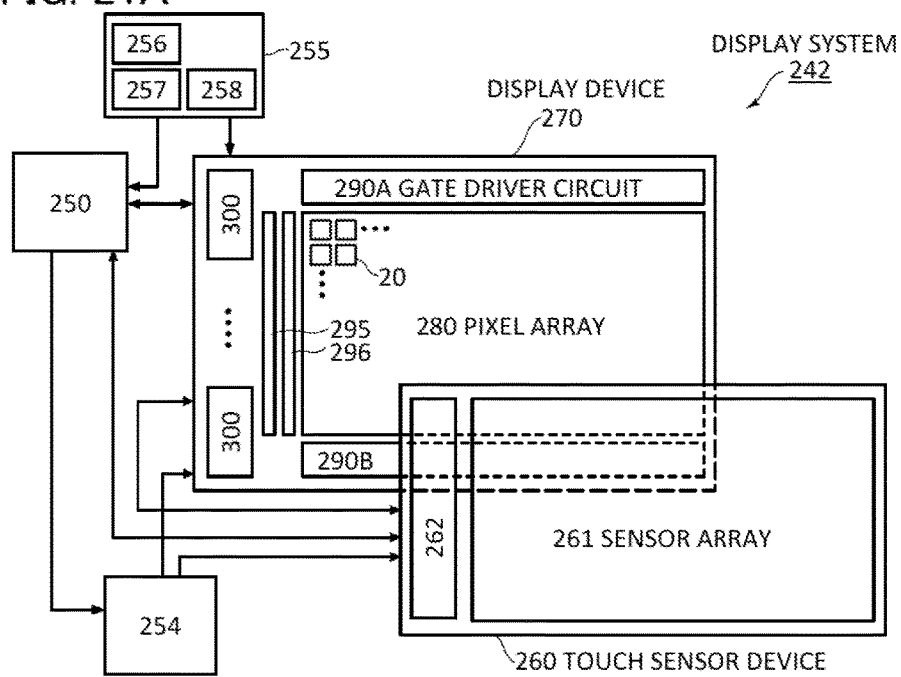
FIG. 21A is a block diagram illustrating a configuration example of a display system.

FIG. 21A illustrates another configuration example of a display system. A display system 242 illustrated in FIG. 21A is obtained by providing a touch sensor device 260 in the display system 241 illustrated in FIG. 19. The touch sensor device 260 includes a sensor array 261 and a touch sensor controller IC 262.

Figure 21B:
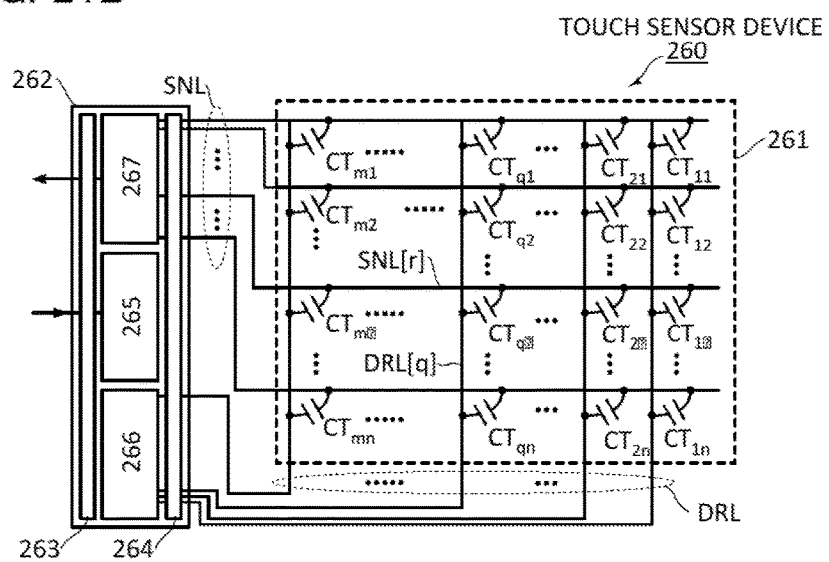
FIG. 21B is a block diagram illustrating a configuration example of a touch sensor device.

The power supply circuit 254 supplies a power supply voltage to the touch sensor device 260. The processing unit 250 has a function of controlling the touch sensor device 260. Data obtained by the touch sensor device 260 is transmitted to the processing unit 250. FIG. 21B illustrates a configuration example of the touch sensor device 260.

<Touch Sensor Unit>

FIG. 21B illustrates an example where the touch sensor device 260 is a mutual capacitive touch sensor unit. The touch sensor device 260 includes the sensor array 261 and the touch sensor controller IC 262. The touch sensor controller IC 262 includes interface circuits 263 and 264, a controller circuit unit 265, a driver circuit unit 266, and a sensing circuit unit 267.

The sensor array 261 includes m wirings DRL and n wirings SNL, where m is an integer greater than or equal to 1 and n is an integer greater than or equal to 1. The wiring DRL is a driving line, and the wiring SNL is a sensing line. A capacitor $CT_{qr}$ refers to a capacitor formed between the wiring DRL[q] and the wiring SNL[r].

The m wirings DRL are electrically connected to the driver circuit unit 266. The driver circuit unit 266 has a function of driving the wirings DRL. The n wirings SNL are electrically connected to the sensing circuit unit 267. The sensing circuit unit 267 has a function of sensing signals of the wirings SNL. A signal of the wiring SNL[r] at the time when the wiring DRL[q] is driven by the driver circuit unit 266 has information on the change amount of capacitance of the capacitor $CT_F$. The sensing circuit unit 267 has a function of performing digital conversion and serial-parallel conversion of the sensing signal. The data signal output from the sensing circuit unit 267 is transmitted to the processing unit 250 through the interface circuit 263.

The processing unit 250 generates image data reflecting the touch information and transmits the image data to the display controller IC 301. The display controller IC 301 may perform signal processing to reflect the touch information in the image data.

In general, the structure of a touch sensor device is roughly classified into an out-cell (external) type and a built-in type. Examples of the structure of a built-in touch sensor device are an on-cell type and an in-cell type. In addition, a hybrid in-cell type that is a hybrid of the in-cell type and the on-cell type is known. The touch sensor device 260 may have any of the structures, and the structure is determined depending on the structure of the pixel array 280 or the like.

In the touch sensor device 260 of the in-cell type or the hybrid in-cell type, a driver circuit for driving the wirings DRL, together with the gate driver circuits 290A and 290B, can be formed in the transistor layer 410. In such a configuration example, a touch sensor controller IC which does not include a built-in driver circuit unit can be used.

The display device in the display system of this embodiment can be any of a variety of display devices and is not limited to the hybrid display device. For example, a liquid crystal display device, an electronic paper display device, an organic EL (OLED) display device, a micro-LED display device, a quantum-dot display device, or the like can be used.

In the display system of this embodiment, the receiver in Embodiment 1 is used as a receiver for receiving grayscale data; thus, the current consumption of the display controller IC and the source driver IC can be reduced. In addition, the receiver can operate at high operating frequency; thus, the number of bits of grayscale data and the number of pixels can be easily increased. For example, a display system capable of performing display with 8K video signals (12 bits, 120 Hz) can be provided. Display of images with a large number of gray levels by a high-resolution display system enables a user to experience stronger senses of presence, reality, and depth.

The display system of this embodiment can be used in display portions of various electronic devices. Examples of electronic devices in which the above-described features can be utilized include a television receiver (TV), a virtual-reality (VR) head-mounted display, a medical display device (a display device of a diagnostic imaging device), and a simulator for simulating the operation of an aircraft, a ship, an automobile, a machine, or the like.

Some specific examples of electronic devices to which the display system of this embodiment can be applied are described below with reference to drawings.

Examples of electronic devices include a television set (also referred to as television or television receiver), a monitor of a computer or the like, a digital camera, a digital video camera, a digital photo frame, a mobile phone (also referred to as cellular phone or mobile phone device), a portable game machine, a portable information terminal, an audio reproducing device, and a large game machine such as a pinball machine. A flexible electronic device can be incorporated along a curved inside/outside wall surface of a construction such as a house or a building or a curved interior/exterior surface of a car. FIGS. 22A to 24C illustrate structural examples of electronic devices. For display portions of the electronic devices in FIGS. 22A to 24C, the display device of Embodiment 1 and a touch panel in which a touch sensor is provided in the display device of Embodiment 1 can be used.

An information terminal 2010 illustrated in FIG. 22A includes a display portion 2012 incorporated into a housing 2011, an operation button 2013, an external connection port 2014, a speaker 2015, and a microphone 2016. Here, a display region of the display portion 2012 is curved. The information terminal 2010 is a portable information terminal driven with a battery and can be used as a tablet information terminal or a smartphone. The information terminal 2010 has functions such as phone calls, e-mailing, an appointment organizer, Internet communication, and music reproduction. Information can be input by touching the display portion 2012 with a finger or the like. Operations such as making a call and inputting letters can be performed by touching the display portion 2012 with a finger or the like. The information terminal 2010 can be operated by inputting sound from the microphone 2016. Power on/off operation, screen switching of the display portion 2012, and the like can be performed by pressing the operation button 2013. For example, the screen can be switched from a mail creation screen to a main menu screen.

FIG. 22B illustrates an example of a wristwatch-type information terminal. An information terminal 2030 includes a housing 2031, a display portion 2032, a winding crown 2033, a belt 2034, and a sensing unit 2035. The information terminal 2030 can be operated by rotating the winding crown 2033. The display portion 2032 may include a touch panel, in which case the information terminal 2030 can be operated by touching the display portion 2032 with a finger or the like.

The sensing unit 2035 has a function of obtaining information on usage environment and user's biological information. The sensing unit 2035 at least includes an illumination sensor. Other than an illumination sensor, the sensing unit 2035 may be provided with a microphone, an imaging element, an acceleration sensor, a direction sensor, a pressure sensor, a temperature sensor, a humidity sensor, a positioning sensor (e.g., a global positioning system (GPS)), or the like.

Wireless communication devices with the same standard may be incorporated into the information terminal 2010 and the information terminal 2030 so that interactive communication is possible through a wireless signal 2020. Accordingly, when the information terminal 2010 receives an incoming e-mail or call, for example, information notifying the incoming e-mail or call can be displayed on the display portion 2032 of the information terminal 2030.

FIG. 22C illustrates a structural example of a foldable information terminal. An information terminal 2050 illustrated in FIG. 22C includes housings 2051, a display portion 2052, and hinges 2053. The information terminal 2050 is also a portable information terminal and has functions similar to those of the information terminal 2010. FIG. 22C illustrates the information terminal 2050 in an unfolded state. FIG. 22E illustrates the information terminal 2050 in a folded state. FIG. 22D illustrates the information terminal 2050 that is being opened or folded. The portability of the information terminal 2050 is increased in a folded state and a large display screen is obtained in an unfolded state, resulting in higher convenience of the information terminal 2050.

The display portion 2052 is supported by three housings 2051 joined together by the hinges 2053. By folding the information terminal 2050 at a connection portion between two housings 2051 with the hinges 2053, the information terminal 2050 can be reversibly changed in shape from an unfolded state to a folded state. The display portion 2052 can be bent with a radius of curvature of 1 mm to 150 mm, for example.

The information terminal 2050 may be provided with an open/close sensor which senses that the display portion 2052 is in a folded state (FIG. 22E) and supplies sensing data. Similarly, the sensor may sense that the display portion 2052 is in an unfolded state (FIG. 22C). When the sensor senses that the display portion 2052 is in a folded state, display on a folded portion (or a portion where a user cannot see because of a folded state) may be stopped, or sensing by a touch sensor may be stopped. Furthermore, display and sensing by a touch sensor may be controlled to be restarted when data indicating that the display portion 2052 is unfolded is obtained.

FIGS. 22F and 22G illustrate a structural example of a foldable information terminal. An information terminal 2070 includes a housing 2071, a housing 2072, a display portion 2073, a display portion 2074, and a hinge portion 2075. For example, the housings 2071 and 2072 may be provided with a power button, an operation button, an external connection port, a speaker, a microphone, and the like.

The housing 2071 and the housing 2072 are joined by the hinge portion 2075. Accordingly, a state where the display portions 2073 and 2074 are exposed (a state where the information terminal 2070 is unfolded as in FIG. 22G) can be changed to a state where the housings 2071 and 2072 overlap with each other (a state where the information terminal 2070 is folded as in FIG. 22F). In the information terminal 2070, as in the information terminal 2050, the display portions 2073 and 2074 may be controlled in accordance with sensing data from an open/close sensor.

Figure 23A:
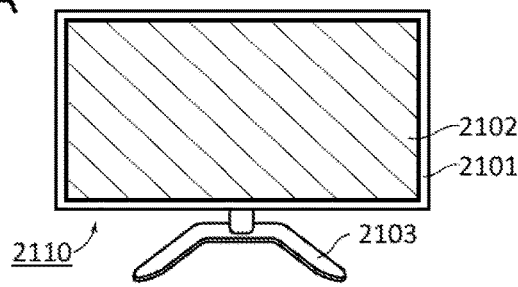
FIGS. 23A to 23E illustrate structural examples of electronic devices.

A display device 2110 illustrated in FIG. 23A includes a housing 2101, a display portion 2102, a support base 2103, and the like. The display device 2110 can be used as a monitor of a computer, a game machine, or the like. When a receiver for television broadcasting is incorporated into the display device 2110, the display device 2110 can be utilized as a television (TV) receiver.

Figure 23B:
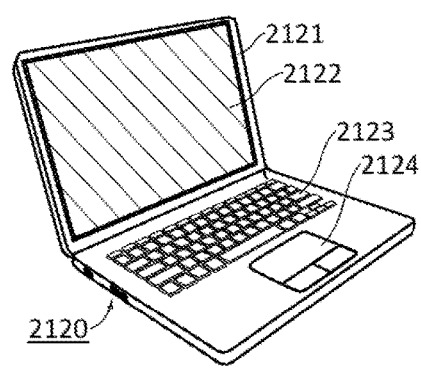

A notebook personal computer 2120 illustrated in FIG. 23B includes a housing 2121, a display portion 2122, a keyboard 2123, and a pointing device 2124.

Figure 23C:
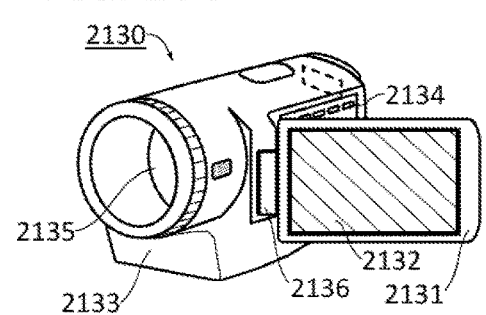

A video camera 2130 illustrated in FIG. 23C includes a housing 2131, a display portion 2132, a housing 2133, an operation key 2134, a lens 2135, and a joint 2136. The display portion 2132 is provided in the housing 2131. The operation key 2134 and the lens 2135 are provided in the housing 2133. The housing 2131 and the housing 2133 are connected to each other with the joint 2136, and the angle between the housing 2131 and the housing 2133 can be changed with the joint 2136. Images on the display portion 2132 may be switched in accordance with the angle between the housing 2131 and the housing 2133 at the joint 2136.

Figure 23D:
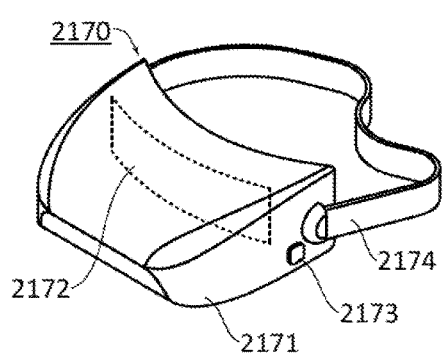
Figure 23E:
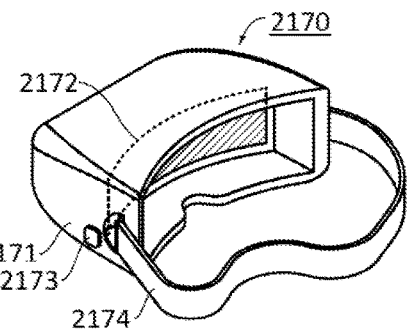

FIGS. 23D and 23E illustrate a structural example of a head-mounted display (HMD). An HMD 2170 includes a housing 2171, a display portion 2172, an operation button 2173, and a fixing band 2174. For example, the HMD 2170 can be used as a VR head-mounted display.

Figure 24A:
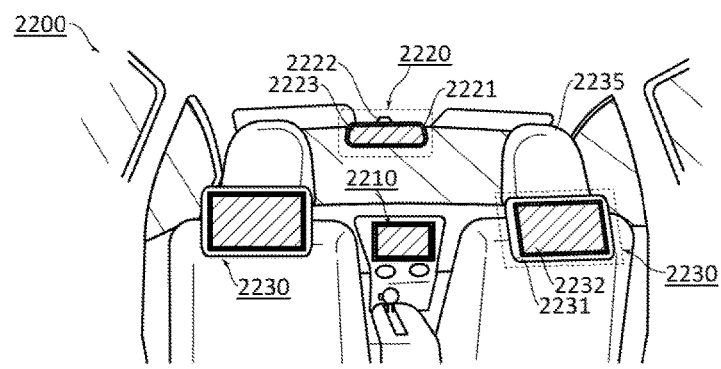
FIG. 24A illustrates structural examples of in-vehicle electronic devices.

FIG. 24A illustrates structural examples of in-vehicle electronic devices. For example, an automobile 2200 is provided with a navigation system 2210, a rearview monitor 2220, a rear seat monitor 2230, and the like. FIG. 24A schematically illustrates the inside of the automobile 2200 which is seen from a rear seat.

The rearview monitor 2220 functions as a rearview mirror (also referred to as inner rearview mirror). The rearview monitor 2220 includes a housing 2221, a joint 2222, and a display portion 2223. The display portion 2223 is installed in the automobile by the joint 2222 such that the screen orientation can be changed. The automobile 2200 is provided with a camera for taking an image of an area behind the automobile, and the image taken with the camera is displayed by the rearview monitor 2220 in real time. The navigation system 2210 may have a function of displaying an image from the camera when the automobile 2200 is moved backward.

The rear seat monitor 2230 includes a housing 2231 and a display portion 2232. The housing 2231 includes an installation portion for fixing to a shaft of a headrest 2235 of a front seat. The rear seat monitor 2230 displays, for example, an image on the navigation system 2210, a TV broadcast image, video content stored in a recording medium (such as a DVD or an SD card), or the like.

Figure 24B:
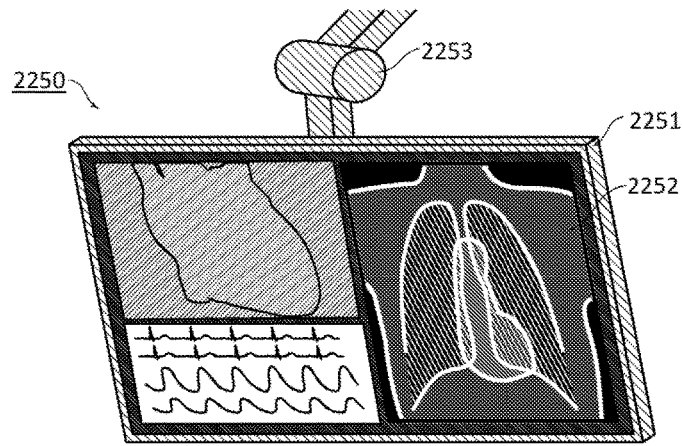
FIGS. 24B and 24C illustrate structural examples of medical display devices.
Figure 24C:
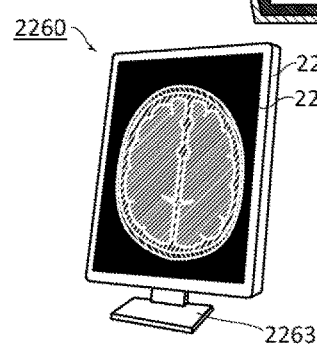

FIGS. 24B and 24C illustrate structural examples of medical display devices. A medical display device 2250 illustrated in FIG. 24B includes a housing 2251, a display portion 2252, and a support 2253. The support 2253 enables the medical display device 2250 to be fixed to a ceiling, a wall, or the like. For example, the medical display device 2250 is installed in an operating room, an intensive care unit, or the like. The display portion 2252 displays an image of a surgical field or an affected area, patient information (e.g., an electrocardiogram), or a medical image (e.g., an X-ray image or an MRI image).

A medical display device 2260 illustrated in FIG. 24C includes a housing 2261, a display portion 2262, and a support base 2263. The medical display device 2260 is a stationary display device and is used for medical image diagnosis, for example. The housing 2261 is rotatably attached to the support base 2263, and the display portion 2262 can be rotated to a horizontal (landscape) position or a vertical (portrait) position depending on an image to be displayed.

Embodiment 3

In this embodiment, the frame memory used in the display controller IC, the source driver IC, or the like is described.

A dynamic random access memory (DRAM) including memory cells of 1T1C (one transistor, one capacitor) type can be used as the frame memory, for example. A memory device in which OS transistors are used in memory cells (hereinafter referred to as an OS memory) can also be used.

Figure 25:
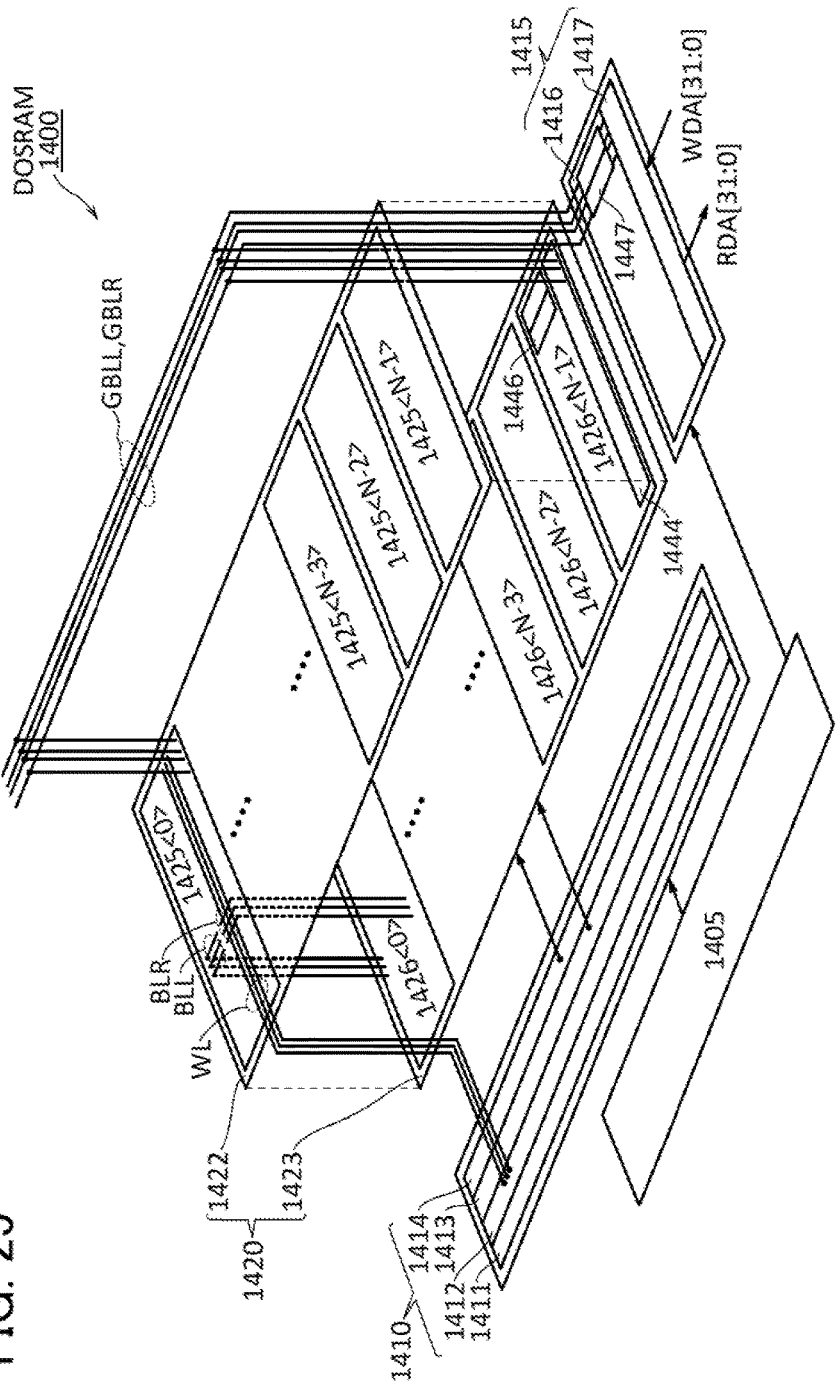
FIG. 25 is a block diagram illustrating a configuration example of a DOSRAM.

Here, a RAM including memory cells of 1T1C type is described as an example of the OS memory. Such a RAM is herein referred to as DOSRAM (registered trademark). DOSRAM is short for dynamic oxide semiconductor RAM. FIG. 25 illustrates a configuration example of a DOSRAM.

<<DOSRAM 1400>>

The DOSRAM 1400 includes a controller 1405, a row circuit 1410, a column circuit 1415, and a memory cell and sense amplifier array 1420 (hereinafter referred to as MC-SA array 1420).

The row circuit 1410 includes a decoder 1411, a word line driver circuit 1412, a column selector 1413, and a sense amplifier driver circuit 1414. The column circuit 1415 includes a global sense amplifier array 1416 and an input/output circuit 1417. The global sense amplifier array 1416 includes a plurality of global sense amplifiers 1447. The MC-SA array 1420 includes a memory cell array 1422, a sense amplifier array 1423, and global bit lines GBLL and GBLR.

(MC-SA Array 1420)

The MC-SA array 1420 has a stacked-layer structure where the memory cell array 1422 is stacked over the sense amplifier array 1423. The global bit lines GBLL and GBLR are stacked over the memory cell array 1422. The DOSRAM 1400 adopts a hierarchical bit line structure, where the bit lines are layered into local and global bit lines.

Figure 26A:
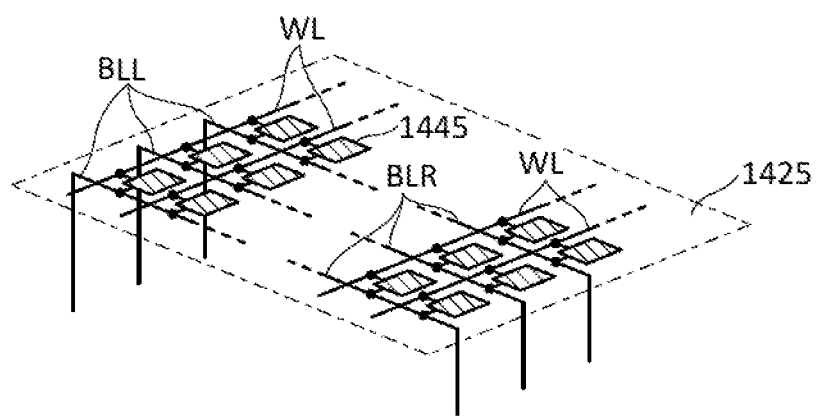
FIG. 26A is a block diagram illustrating a configuration example of a memory cell array.

The memory cell array 1422 includes N local memory cell arrays 1425<0> to 1425<N−1>, where N is an integer greater than or equal to 2. FIG. 26A illustrates a configuration example of the local memory cell array 1425. The local memory cell array 1425 includes a plurality of memory cells 1445, a plurality of word lines WL, and a plurality of bit lines BLL and BLR. In the example in FIG. 26A, the local memory cell array 1425 has an open bit-line architecture but may have a folded bit-line architecture.

Figure 26B:
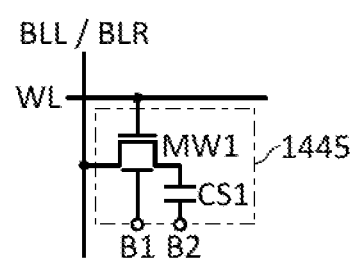
FIG. 26B is a circuit diagram illustrating a configuration example of a memory cell.

FIG. 26B illustrates a circuit configuration example of the memory cell 1445. The memory cell 1445 includes a transistor MW1, a capacitor CS1, and terminals B1 and B2. The transistor MW1 has a function of controlling the charging and discharging of the capacitor CS1. A gate of the transistor MW1 is electrically connected to the word line, a first terminal of the transistor MW1 is electrically connected to the bit line, and a second terminal of the transistor MW1 is electrically connected to a first terminal of the capacitor CS1. A second terminal of the capacitor CS1 is electrically connected to the terminal B2. A constant voltage (e.g., low power supply voltage) is input to the terminal B2.

The transistor MW1 includes a back gate, and the back gate is electrically connected to the terminal B1. This makes it possible to change the threshold voltage of the transistor MW1 with a voltage applied to the terminal B1. For example, a fixed voltage (e.g., negative constant voltage) may be applied to the terminal B1; alternatively, the voltage applied to the terminal B1 may be changed in response to the operation of the DOSRAM 1400.

The back gate of the transistor MW1 may be electrically connected to the gate, the source, or the drain of the transistor MW1. Alternatively, the transistor MW1 does not necessarily include the back gate.

The sense amplifier array 1423 includes N local sense amplifier arrays 1426<0> to 1426<N−1>. The local sense amplifier array 1426 includes one switch array 1444 and a plurality of sense amplifiers 1446. A bit line pair is electrically connected to the sense amplifier 1446. The sense amplifier 1446 has a function of precharging the bit line pair, a function of amplifying a voltage difference between the bit line pair, and a function of retaining the voltage difference.

The switch array 1444 has a function of selecting a bit line pair and electrically connecting the selected bit line pair and a global bit line pair to each other.

Here, two bit lines that are compared simultaneously by the sense amplifier are collectively referred to as the bit line pair. Two global bit lines that are compared simultaneously by the global sense amplifier are collectively referred to as the global bit line pair. The bit line pair can be referred to as a pair of bit lines, and the global bit line pair can be referred to as a pair of global bit lines. Here, a bit line BLL and a bit line BLR form one bit line pair. A global bit line GBLL and a global bit line GBLR form one global bit line pair. In the description hereinafter, the expressions "bit line pair (BLL, BLR)" and "global bit line pair (GBLL, GBLR)" are also used.

(Controller 1405)

The controller 1405 has a function of controlling the overall operation of the DOSRAM 1400. The controller 1405 has a function of performing logic operation on a command signal that is input from the outside and determining an operation mode, a function of generating control signals for the row circuit 1410 and the column circuit 1415 so that the determined operation mode is executed, a function of retaining an address signal that is input from the outside, and a function of generating an internal address signal.

(Row Circuit 1410)

The row circuit 1410 has a function of driving the MC-SA array 1420. The decoder 1411 has a function of decoding an address signal. The word line driver circuit 1412 generates a selection signal for selecting the word line WL of a row that is to be accessed.

The column selector 1413 and the sense amplifier driver circuit 1414 are circuits for driving the sense amplifier array 1423. The column selector 1413 has a function of generating a selection signal for selecting the bit line of a column that is to be accessed. The selection signal from the column selector 1413 controls the switch array 1444 of each local sense amplifier array 1426. The control signal from the sense amplifier driver circuit 1414 drives each of the plurality of local sense amplifier arrays 1426 independently.

(Column Circuit 1415)

The column circuit 1415 has a function of controlling the input of data signals WDA[31:0], and a function of controlling the output of data signals RDA[31:0]. The data signals WDA[31:0] are write data signals, and the data signals RDA[31:0] are read data signals.

The global sense amplifier 1447 is electrically connected to the global bit line pair (GBLL, GBLR). The global sense amplifier 1447 has a function of amplifying a voltage difference between the global bit line pair (GBLL, GBLR), and a function of retaining the voltage difference. Data are written to and read from the global bit line pair (GBLL, GBLR) by the input/output circuit 1417.

A write operation of the DOSRAM 1400 is briefly described. Data are written to the global bit line pair by the input/output circuit 1417. The data of the global bit line pair are retained by the global sense amplifier array 1416. By the switch array 1444 of the local sense amplifier array 1426 specified by the address signal, the data of the global bit line pair are written to the bit line pair of the column where data are to be written. The local sense amplifier array 1426 amplifies the written data, and then retains the amplified data. In the specified local memory cell array 1425, the word line WL of the row where data are to be written is selected by the row circuit 1410, and the data retained at the local sense amplifier array 1426 are written to the memory cell 1445 of the selected row.

A read operation of the DOSRAM 1400 is briefly described. One row of the local memory cell array 1425 is specified with the address signal. In the specified local memory cell array 1425, the word line WL of the row where data are to be read is selected, and data of the memory cell 1445 are written to the bit line. The local sense amplifier array 1426 detects a voltage difference between the bit line pair of each column as data, and retains the data. The switch array 1444 writes the data of a column specified by the address signal to the global bit line pair; the data are chosen from the data retained at the local sense amplifier array 1426. The global sense amplifier array 1416 detects and retains the data of the global bit line pair. The data retained at the global sense amplifier array 1416 are output to the input/output circuit 1417. Thus, the read operation is completed.

The DOSRAM 1400 has no limitations on the number of rewrites in principle and data can be read and written with low energy consumption, because data are rewritten by charging and discharging the capacitor CS1. Simple circuit configuration of the memory cell 1445 allows a high memory capacity.

The transistor MW1 is an OS transistor. The extremely low off-state current of the OS transistor can inhibit leakage of charge from the capacitor CS1. Therefore, the retention time of the DOSRAM 1400 is considerably longer than that of DRAM. This allows less frequent refresh, which can reduce power needed for refresh operations. For this reason, the DOSRAM 1400 used as the frame memory can reduce the power consumption of the display controller IC and the source driver IC.

Since the MC-SA array 1420 has a stacked-layer structure, the bit line can be shortened to a length that is close to the length of the local sense amplifier array 1426. A shorter bit line results in smaller bit line capacitance, which allows the storage capacitance of the memory cell 1445 to be reduced. In addition, providing the switch array 1444 in the local sense amplifier array 1426 allows the number of long bit lines to be reduced. For the reasons described above, a load to be driven during access to the DOSRAM 1400 is reduced, enabling a reduction in the energy consumption of the display controller IC and the source driver IC.

<<Stacked-Layer Structure of DOSRAM>>

Figure 27:
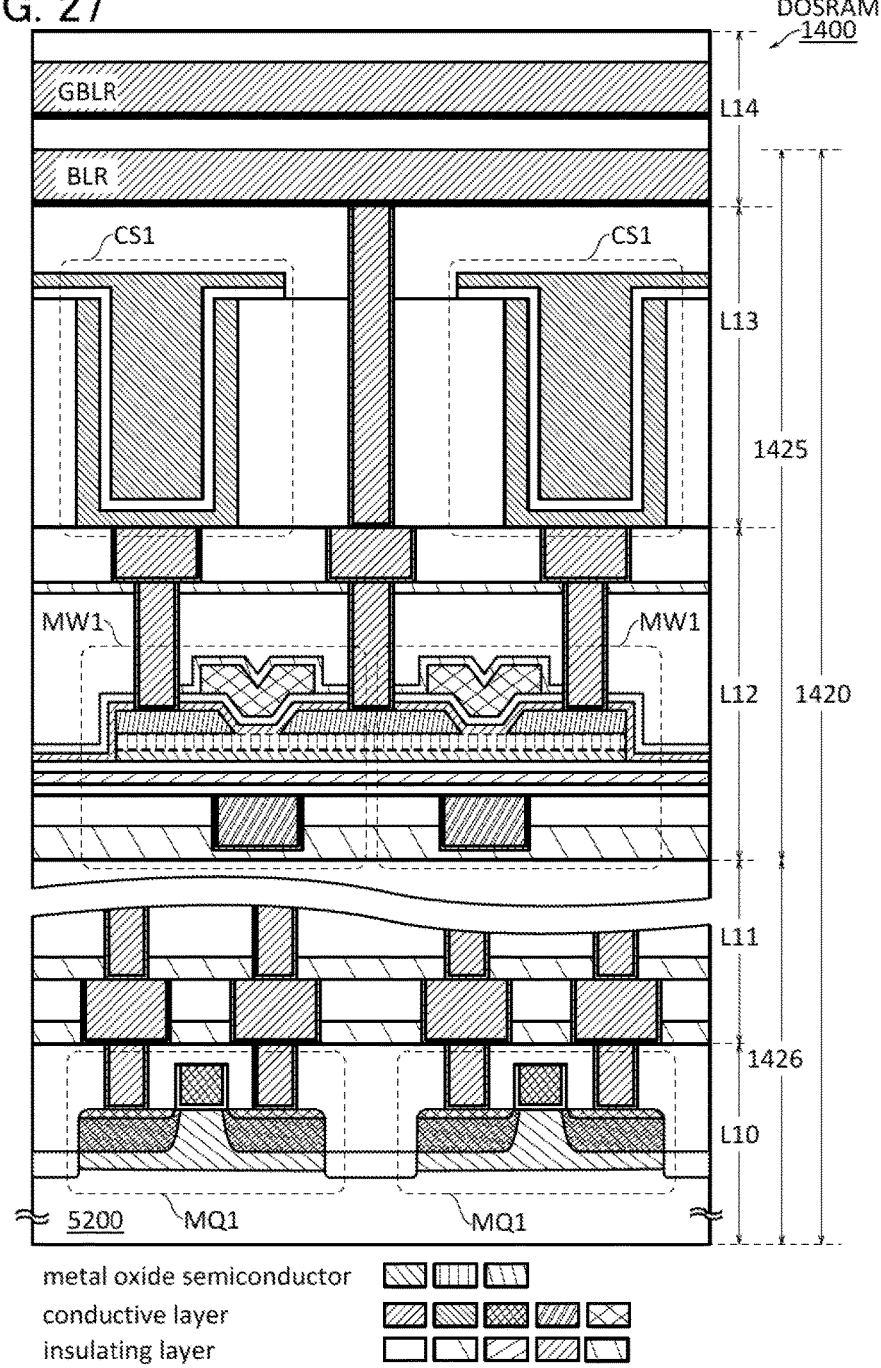
FIG. 27 is a cross-sectional view illustrating a structural example of a DOSRAM.

FIG. 27 is a cross-sectional view illustrating an example of the stacked-layer structure of the DOSRAM 1400. The DOSRAM 1400 includes stacked layers L10 to L14. The local sense amplifier array 1426 is provided in the layers L10 and L11. The local memory cell array 1425 is provided in the layers L12 to L14 so as to overlap with the local sense amplifier array 1426.

Si transistors included in the DOSRAM 1400 are provided in the layer L10. The layer L10 includes wirings, plugs, and the like. Active layers of the Si transistors are formed in a single crystal silicon wafer 5200. Transistors MQ1 illustrated in FIG. 27 are transistors of the local sense amplifier array 1426. The layer L11 includes wirings, plugs, and the like. In the stacked layers L10 and L11, a circuit configured with Si, such as the local sense amplifier array 1426, is provided.

OS transistors, wirings (e.g., the word line), plugs, and the like are provided in the layer L12. The structure of the transistors MW1 illustrated in FIG. 27 is similar to the structure of OS transistor 5001 to be described later (see FIG. 28A). The layer L13 is a capacitor layer in which storage capacitors (the capacitors CS1) of the DOSRAM 1400 are provided. A plug for electrically connecting the capacitor CS1 and transistor MW1 to each other and the like are also provided in the layer L13. Wirings (e.g., the bit lines BLL and BLR and the global bit lines GBLL and GBLR), plugs, and the like are provided in the layer L14.

Structural examples of OS transistors used in OS memories or the like are described below.

<<OS Transistor Structural Example 1>>

Figure 28A:
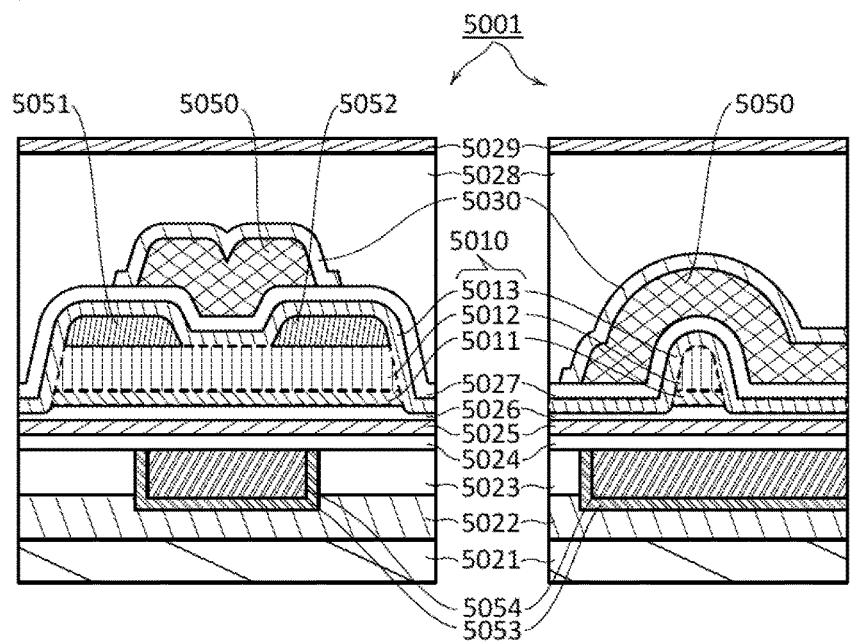
FIGS. 28A and 28B are cross-sectional views each illustrating a structural example of a transistor.

FIG. 28A illustrates a structural example of an OS transistor. The OS transistor 5001 illustrated in FIG. 28A is a metal oxide transistor. A cross-sectional view of the OS transistor 5001 in the channel length direction is illustrated on the left side of FIG. 28A, and a cross-sectional view of the OS transistor 5001 in the channel width direction is illustrated on the right side of FIG. 28A.

The OS transistor 5001 is formed over an insulating surface. Here, the OS transistor 5001 is formed over an insulating layer 5021. The OS transistor 5001 is covered with insulating layers 5028 and 5029. The OS transistor 5001 includes insulating layers 5022 to 5027 and 5030, metal oxide layers 5011 to 5013, and conductive layers 5050 to 5054.

Note that an insulating layer, a metal oxide layer, a conductor, and the like in a drawing may have a single-layer structure or a stacked-layer structure. These layers can be formed by any of a variety of deposition methods such as a sputtering method, a molecular beam epitaxy (MBE) method, a pulsed laser deposition (PLD) method, a CVD method, and an atomic layer deposition (ALD) method. Examples of the CVD method include a plasma CVD method, a thermal CVD method, and a metal organic CVD method.

The metal oxide layers 5011 to 5013 are collectively referred to as an oxide layer 5010. As illustrated in FIG. 28A, the oxide layer 5010 includes a portion where the metal oxide layer 5011, the metal oxide layer 5012, and the metal oxide layer 5013 are stacked in that order. When the OS transistor 5001 is on, a channel is mainly formed in the metal oxide layer 5012 of the oxide layer 5010.

A gate electrode of the OS transistor 5001 is constituted by the conductive layer 5050. A pair of electrodes that function as a source electrode and a drain electrode of the OS transistor 5001 is constituted by the conductive layers 5051 and 5052. A back gate electrode of the OS transistor 5001 is constituted by a stack of the conductive layers 5053 and 5054. The OS transistor 5001 does not necessarily include a back gate electrode. The same applies to an OS transistor 5002 to be described later.

A gate insulating layer on a gate (front gate) side is constituted by the insulating layer 5027. A gate insulating layer on a back gate side is constituted by a stack of the insulating layers 5024 to 5026. The insulating layer 5028 is an interlayer insulating layer. The insulating layer 5029 is a barrier layer.

The metal oxide layer 5013 covers a stack of the metal oxide layers 5011 and 5012 and the conductive layers 5051 and 5052. The insulating layer 5027 covers the metal oxide layer 5013. The conductive layers 5051 and 5052 each include a region that overlaps with the conductive layer 5050 with the metal oxide layer 5013 and the insulating layer 5027 positioned therebetween.

Examples of a conductive material used for the conductive layers 5050 to 5054 include a semiconductor typified by polycrystalline silicon doped with an impurity element such as phosphorus; silicide such as nickel silicide; a metal such as molybdenum, titanium, tantalum, tungsten, aluminum, copper, chromium, neodymium, or scandium; and a metal nitride containing any of the above metals as its component (tantalum nitride, titanium nitride, molybdenum nitride, or tungsten nitride). A conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added, can be used.

For example, the conductive layer 5050 is a single layer of tantalum nitride or tungsten. Alternatively, in the case where the conductive layer 5050 has a two-layer structure or a three-layer structure, the following combinations can be used (the conductor written first is used for a layer on the insulating layer 5027 side): aluminum and titanium; titanium nitride and titanium; titanium nitride and tungsten; tantalum nitride and tungsten; tungsten nitride and tungsten; titanium, aluminum, and titanium; titanium nitride, aluminum, and titanium; and titanium nitride, aluminum, and titanium nitride.

The conductive layers 5051 and 5052 have the same layer structure. For example, in the case where the conductive layer 5051 is a single layer, any of metals such as aluminum, titanium, chromium, nickel, copper, yttrium, zirconium, molybdenum, silver, tantalum, and tungsten, or an alloy containing any of these metals as its main component may be used. In the case where the conductive layer 5051 has a two-layer structure or a three-layer structure, the following combinations can be used (the conductor written first is used for a layer on the insulating layer 5027 side): titanium and aluminum; tungsten and aluminum; tungsten and copper; a copper-magnesium-aluminum alloy and copper; titanium and copper; titanium or titanium nitride, aluminum or copper, and titanium or titanium nitride; and molybdenum or molybdenum nitride, aluminum or copper, and molybdenum or molybdenum nitride.

For example, it is preferable that the conductive layer 5053 be a conductive layer that has a hydrogen barrier property (e.g., a tantalum nitride layer) and that the conductive layer 5054 be a conductive layer that has higher conductivity than the conductive layer 5053 (e.g., a tungsten layer). With such a structure, the stack of the conductive layers 5053 and 5054 functions as a wiring and has a function of suppressing diffusion of hydrogen into the oxide layer 5010.

Examples of an insulating material used for the insulating layers 5021 to 5030 include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. The insulating layers 5021 to 5030 are each formed using a single-layer structure or a stacked-layer structure of these insulating materials. The layers used for the insulating layers 5021 to 5030 may include a plurality of insulating materials.

Note that in this specification and the like, an oxynitride refers to a compound that contains more oxygen than nitrogen, and a nitride oxide refers to a compound that contains more nitrogen than oxygen.

In the OS transistor 5001, the oxide layer 5010 is preferably surrounded by an insulating layer with oxygen and hydrogen barrier properties (hereinafter such an insulating layer is referred to as a barrier layer). With such a structure, it is possible to suppress the release of oxygen from the oxide layer 5010 and entry of hydrogen into the oxide layer 5010; thus, the reliability and electrical characteristics of the OS transistor 5001 can be improved.

For example, the insulating layer 5029 may function as a barrier layer and at least one of the insulating layers 5021, 5022, and 5024 may function as a barrier layer. The barrier layer can be formed using a material such as aluminum oxide, aluminum oxynitride, gallium oxide, gallium oxynitride, yttrium oxide, yttrium oxynitride, hafnium oxide, hafnium oxynitride, or silicon nitride. Another barrier layer may be provided between the oxide layer 5010 and the conductive layer 5050. Alternatively, a metal oxide layer that has oxygen and hydrogen barrier properties may be provided as the metal oxide layer 5013.

The insulating layer 5030 is preferably a barrier layer that prevents the conductive layer 5050 from becoming oxidized. When the insulating layer 5030 has an oxygen barrier property, oxidation of the conductive layer 5050 due to oxygen released from the insulating layer 5028 or the like can be suppressed. For example, the insulating layer 5030 can be formed using a metal oxide such as aluminum oxide.

A structural example of the insulating layers 5021 to 5030 is described. In this example, each of the insulating layers 5021, 5022, 5025, 5029, and 5030 functions as a barrier layer. The insulating layers 5026 to 5028 are oxide layers containing excess oxygen. The insulating layer 5021 is formed using silicon nitride. The insulating layer 5022 is formed using aluminum oxide. The insulating layer 5023 is formed using silicon oxynitride. The gate insulating layers (5024 to 5026) on the back gate side are formed using a stack of silicon oxide, aluminum oxide, and silicon oxide. The gate insulating layer (5027) on the front gate side is formed using silicon oxynitride. The interlayer insulating layer (5028) is formed using silicon oxide. The insulating layers 5029 and 5030 are formed using aluminum oxide.

FIG. 28A illustrates an example in which the oxide layer 5010 has a three-layer structure; however, one embodiment of the present invention is not limited thereto. For example, the oxide layer 5010 may have a two-layer structure without the metal oxide layer 5011 or 5013, or may be constituted by any one of the metal oxide layers 5011 to 5013. Alternatively, the oxide layer 5010 may be constituted by four or more metal oxide layers.

<<OS Transistor Structural Example 2>>

Figure 28B:
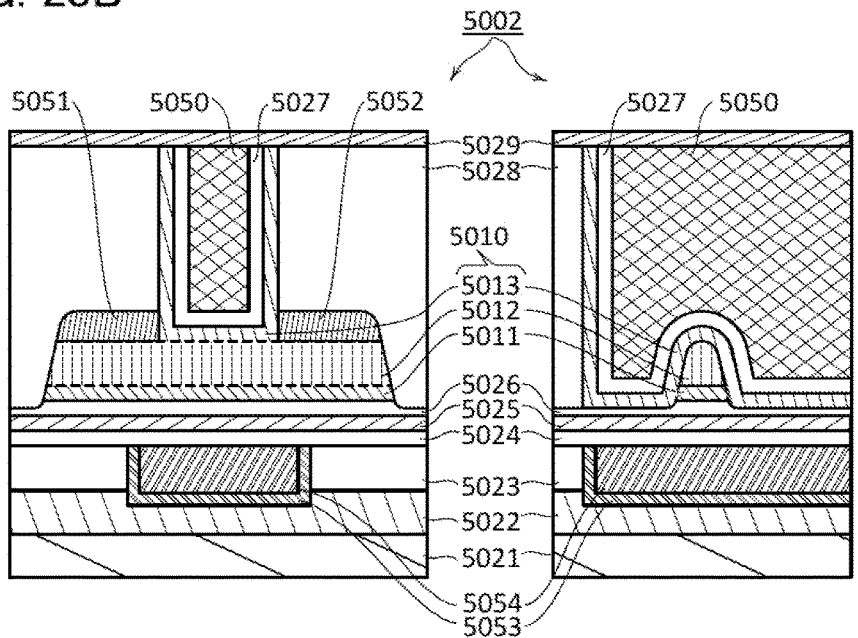

FIG. 28B illustrates a structural example of an OS transistor. The OS transistor 5002 in FIG. 28B is a modification example of the OS transistor 5001. The OS transistor 5002 differs from the OS transistor 5001 mainly in the structure of the gate electrode. A cross-sectional view of the OS transistor 5002 in the channel length direction is illustrated on the left side of FIG. 28B, and a cross-sectional view of the OS transistor 5002 in the channel width direction is illustrated on the right side of FIG. 28B.

The metal oxide layer 5013, the insulating layer 5027, and the conductive layer 5050 are provided in an opening portion formed in the insulating layer 5028. In other words, a gate electrode is formed in a self-aligned manner by using the opening portion in the insulating layer 5028. Thus, in the OS transistor 5002, the gate electrode (5050) does not include a region that overlaps with the source electrode or the drain electrode (5051 or 5052) with the gate insulating layer (5017) positioned therebetween. Accordingly, gate-source parasitic capacitance and gate-drain parasitic capacitance can be reduced and frequency characteristics can be improved. Furthermore, the gate electrode width can be controlled by the opening portion in the insulating layer 5028; thus, it is easy to fabricate an OS transistor with a short channel length.

Embodiment 4

In this embodiment, a hybrid display device is described.
<<Hybrid Display Device>>

Figure 29:
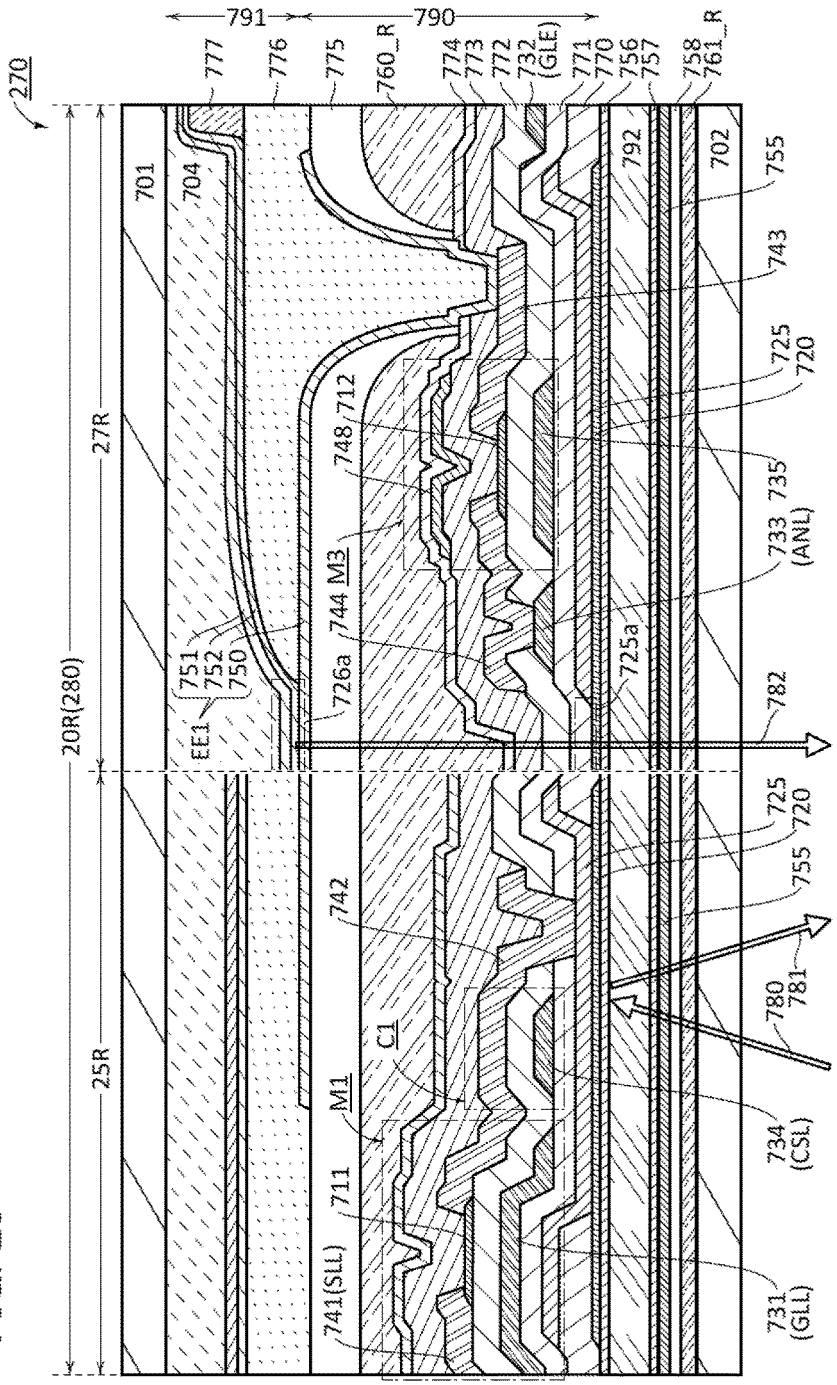
FIG. 29 is a cross-sectional view illustrating a structural example of a display device.
Figure 30:
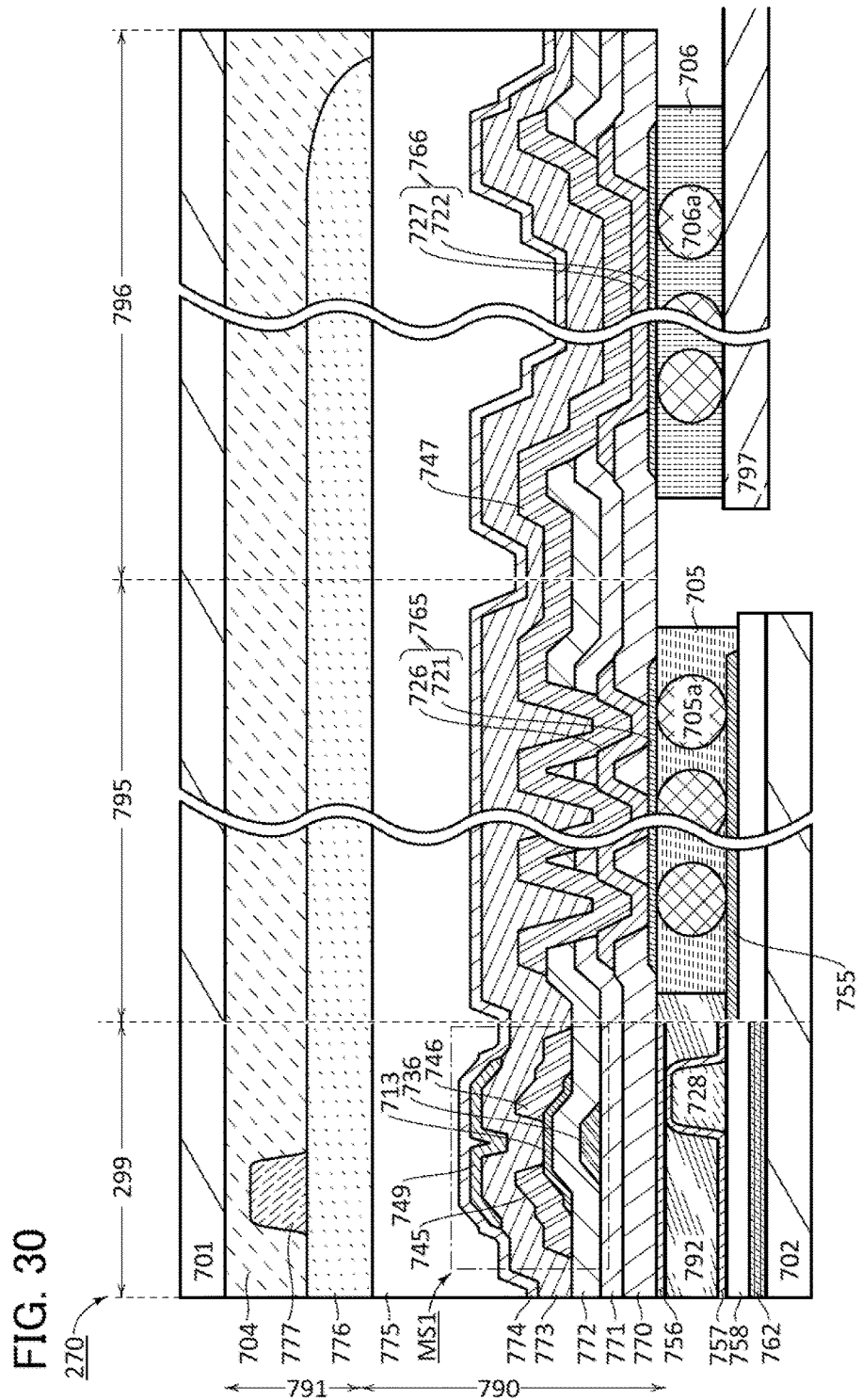
FIG. 30 is a cross-sectional view illustrating a structural example of a display device.

FIG. 29 illustrates a cross-sectional structure of the subpixel 20R (see FIG. 11A). The subpixels 20G and 20B have a similar cross-sectional structure to that of the subpixel 20R. A main part of the subpixel 25R is illustrated on the left side of FIG. 29, and a main part of the subpixel 27R is illustrated on the right side of FIG. 29. The gate driver circuits 290A and 290B and the switch arrays 295 and 296, together with the pixel array 280, are formed. Here, the gate driver circuits 290A and 290B and the switch arrays 295 and 296 are collectively referred to as a peripheral circuit 299. FIG. 30 illustrates a cross-sectional structure of the transistor MS1 of the switch array 295 (see FIGS. 17A and 17B) typically as the peripheral circuit 299. In addition, FIG. 30 illustrates a cross-sectional structure of a common contact portion 795 and a terminal portion 796.

The display device 270 includes substrates 701 and 702, sealants 704 and 705, alignment films 756 and 757, a transistor layer 790, an EL element layer 791, and a liquid crystal layer 792.

To fabricate the transistor layer 790 and the EL element layer 791, a substrate for fabricating transistors that is different from the substrate 702 (here this substrate is referred to as temporary substrate) is used. As the temporary substrate, mother glass for manufacturing EL display panels can be used, for example. A separation layer is formed over the temporary substrate, the transistor layer 790 is formed over the separation layer, and the EL element layer 791 is formed over the transistor layer 790. The substrate 701 is fixed above the EL element layer 791 by the sealant 704. Then, the temporary substrate together with the separation layer is separated from the transistor layer 790. Next, a cell process similar to that in the process for manufacturing liquid crystal display panels is performed. The alignment film 756 is formed on a surface of the transistor layer 790 that is exposed by the separation step.

The substrate 702 provided with the alignment film 757 and the like is prepared. The liquid crystal layer 792 is sealed between the transistor layer 790 and the substrate 702 with the sealant 705.

<Transistor Layer 790>

The transistor layer 790 includes semiconductor layers 711 to 713, conductive layers 720 to 722, 725 to 727, 731 to 736, and 741 to 749, insulating layers 770 to 775, and a color filter layer 760_R.

There is no particular limitation on device structures of various elements (such as transistors, capacitors, and resistors) provided in the transistor layer 790. Device structures are selected to be suited for the functions of the pixel array 280, the gate driver circuits 290A and 290B, and the switch arrays 295 and 296. Examples of the device structures of a transistor are a top-gate structure, a bottom-gate structure, a dual-gate structure provided with both a gate (front gate) and a bottom gate, and a multi-gate structure including a plurality of gate electrodes for one semiconductor layer. There is no particular limitation on types (e.g., a composition and a crystal structure) of a semiconductor contained in a channel formation region (active layer) of a transistor. A semiconductor used for the active layer is roughly divided into a single crystal semiconductor and a non-single-crystal semiconductor. Examples of the non-single-crystal semiconductor include a polycrystalline semiconductor, a microcrystalline semiconductor, and an amorphous semiconductor. Examples of semiconductor materials include a semiconductor containing one or more kinds of Group 14 elements such as Si, Ge, or C (e.g., silicon, silicon germanium, and silicon carbide), an oxide semiconductor, and a compound semiconductor such as gallium nitride.

In the example shown here, the pixel array 280 and the peripheral circuit 299 include transistors with the same conductivity type; the transistors provided in the transistor layer 790 are n-channel transistors and OS transistors.

The insulating layer 770 functions as a passivation film for the transistor layer 790. The insulating layer 771 functions as a base insulating layer of the transistors of the pixel array 280 and the peripheral circuit 299. The conductive layer 725 is the pixel electrode of the LC element RE1 and has an opening 725a.

The conductive layers 720 to 722 function as etching stop layers in a step of etching the insulating layer 770 to form openings. The conductive layers 720 to 722 can prevent the separation layer from being damaged in the etching step.

The conductive layers 731 to 736 are provided over the insulating layer 771. The conductive layer 731 constitutes the wiring GLL and has a region functioning as a gate electrode of the transistor M1. The conductive layer 732 constitutes the wiring GLE and has a region functioning as a gate electrode of the transistor M2. The conductive layers 733 and 734 constitute the wirings ANL and CSL, respectively.

The semiconductor layers 711 to 713 are provide over the insulating layer 772. The insulating layer 772 constitutes gate insulating layers of the transistors of the pixel array 280 and the peripheral circuit 299. The semiconductor layers 711, 712, and 713 are semiconductor layers of the transistors M1, M3, and MS1, respectively. Here, the semiconductor layers 711 to 713 are formed using a metal oxide.

The conductive layers 741 to 747 are provided over the insulating layer 772. The conductive layer 741 constitutes the wiring SLL and has a region functioning as one of a source electrode and a drain electrode of the transistor M1. The conductive layer 742 constitutes the other of the source electrode and the drain electrode of the transistor M1 and is electrically connected to the conductive layer 725. The conductive layers 743 and 744 constitute a source electrode and a drain electrode of the transistor M3. The conductive layer 744 is electrically connected to the conductive layer 733. The conductive layers 745 and 746 constitute a source electrode and a drain electrode of the transistor MS1.

A region where the conductive layer 734, the insulating layer 772, and the conductive layer 742 overlap functions as the capacitor C1.

The common contact portion 795 includes a terminal 765, and the terminal portion 796 includes a terminal 766. The terminal 765 includes the conductive layers 721 and 726, and the terminal 766 includes the conductive layers 722 and 727. The conductive layer 747 constitutes a lead wiring. In the example of FIG. 30, the terminal 765 and the terminal 766 are electrically connected to each other through the conductive layer 747.

The insulating layers 773 and 774 function as passivation films for the transistors of the pixel array 280 and the peripheral circuit 299. The conductive layers 748 and 749 are provided over the insulating layer 773. The conductive layer 748 constitutes a back gate electrode of the transistor M3, and the conductive layer 749 constitutes a back gate electrode of the transistor MS1.

The color filter layer 760_R is provided to cover the insulating layer 773. The color filter layer 760_R is a red color filter layer corresponding to the color of the subpixel 20R. Green and blue color filter layers are provided for the subpixels 20G and 20B, respectively.

The color filter layer for the EL element EE1 can be provided as appropriate. The insulating layer 775 is provided to cover the color filter layers. The insulating layer 775 functions as a planarization film. Thus, the insulating layer 775 is preferably formed using a resin such as a polyimide resin or an acrylic resin.

<EL Element Layer 791>

The EL element layer 791 includes conductive layers 750 and 751, an EL layer 752, and insulating layers 776 and 777.

The conductive layer 750 is the pixel electrode of the EL element EE1. The conductive layer 750 is electrically connected to the conductive layer 743. The insulating layer 776 is provided to cover the conductive layer 750. The insulating layer 777 is provided over the insulating layer 776. The insulating layer 777 functions as a spacer for maintaining a space between the substrate 701 and the EL element layer 791. The EL layer 752 and the conductive layer 751 are stacked over the insulating layers 775 and 776. The conductive layer 751 is the common electrode of the EL element EE1. The insulating layer 776 has an opening 726a in a region overlapping with the opening 725a in the conductive layer 725. The conductive layer 750 is exposed at the opening 726a. A stack of the conductive layer 750, the EL layer 752, and the conductive layer 751 that is formed in the opening 726a constitutes a light-emitting region of the EL element EE1.

The EL layer 752 contains at least a light-emitting material capable of emitting light by recombination of holes and electrons. The EL layer 752 may include a functional layer such as a hole-injection layer, a hole-transport layer, an electron-transport layer, or an electron-injection layer. Here, the EL layer 752 emits light with the color of the subpixel 20. Alternatively, all the subpixels 20 may be provided with the EL layer 752 that emits white light. Providing the EL layer 752 that emits light with the color of the subpixel 20 leads to lower power consumption because light 782 from the EL element EE1 can be efficiently extracted through the substrate 702. Furthermore, the display quality (contrast and color reproducibility) of the display device 270 can be improved.

<Substrate 702 (Counter Substrate)>

The substrate 702 corresponds to a counter substrate of a liquid crystal display panel. The substrate 702 is provided with an insulating layer 728, a conductive layer 755, the alignment film 757, an overcoat layer 758, a color filter layer 761_R, and a light-blocking layer 762.

The insulating layer 728 functions as a spacer for maintaining a space between the substrate 702 and the substrate 701 (the transistor layer 790). The conductive layer 755 is the common electrode of the LC element RE1. The color filter layer 761_R is a color filter layer for the LC element RE1 and is a red color filter layer. The substrate 702 is provided with color filter layers corresponding to the colors of the subpixels 20. Here, red, green, and blue color filter layers are arranged in a stripe pattern. The light-blocking layer 762 shields a region that does not contribute to display, from light. The peripheral circuit 299 is covered with the light-blocking layer 762. In the pixel array 280, regions between adjacent pixel electrodes (conductive layers 725) are covered with the light-blocking layer 762.

The sealant 705 includes conductive particles 705a. The liquid crystal layer 792 is sealed with the sealant 705 including the conductive particles 705a; thus, the conductive layer 755 can be electrically connected to the terminal 765 in the common contact portion 795. Note that the conductive particles 705a may be provided in the sealant 705 only in and around the common contact portion 795.

An FPC 797 is electrically connected to the terminal 766 through an anisotropic conductive film (ACF) 706 including conductive particles 706a. That is, the common electrode (the conductive layer 755) provided over the substrate 702 is electrically connected to the FPC 797 through the terminal 765, the lead wiring (the conductive layer 747), and the terminal 766.

The display principles of the display device 270 are described in Embodiment 1 (see FIG. 11B). External light 780 that enters through the substrate 702 passes through the color filter layer 761_R, the conductive layer 755, the liquid crystal layer 792, and the like and is reflected by the conductive layer 725. Light 781 reflected by the conductive layer 725 passes through the color filter 761_R, the liquid crystal layer 792, the conductive layer 755, and the like again and exits through the substrate 702. The light 782 from the EL element EE1 is reflected by the conductive layer 751 and transmitted through the conductive layer 750, the color filter layer 760_R, the opening 725a in the conductive layer 725, the color filter layer 761_R, and the like, and exits through the substrate 702.

Each of the layers included in the display device 270 may have a single-layer structure or a stacked-layer structure. Examples of conductive materials used for the conductive layers include metals such as aluminum, chromium, copper, silver, gold, platinum, tantalum, nickel, titanium, molybdenum, tungsten, hafnium, vanadium, niobium, manganese, magnesium, zirconium, and beryllium, and alloys and compounds of such metals. Other examples are polycrystalline silicon containing an impurity element such as phosphorus, and a light-transmitting conductor containing a metal oxide. Examples of light-transmitting conductors include metal oxides such as indium oxide containing tungsten oxide, indium zinc oxide containing tungsten oxide, indium oxide containing titanium oxide, indium tin oxide containing titanium oxide, indium tin oxide (referred to as ITO), indium zinc oxide, and indium tin oxide to which silicon oxide is added.

Examples of insulating materials used for the insulating layers in the display device 270 include aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Other examples are resin materials such as an acrylic resin, a polyimide resin, a benzocyclobutene-based resin, a siloxane-based resin, a polyamide resin, and an epoxy resin. Note that in this specification, an oxynitride refers to a compound that contains more oxygen than nitrogen, and a nitride oxide refers to a compound that contains more nitrogen than oxygen.

Example 1

The operations of the receiver 141 of Embodiment 1 (see FIG. 3) and a receiver of a comparative example are checked by circuit simulation.

Figure 34:
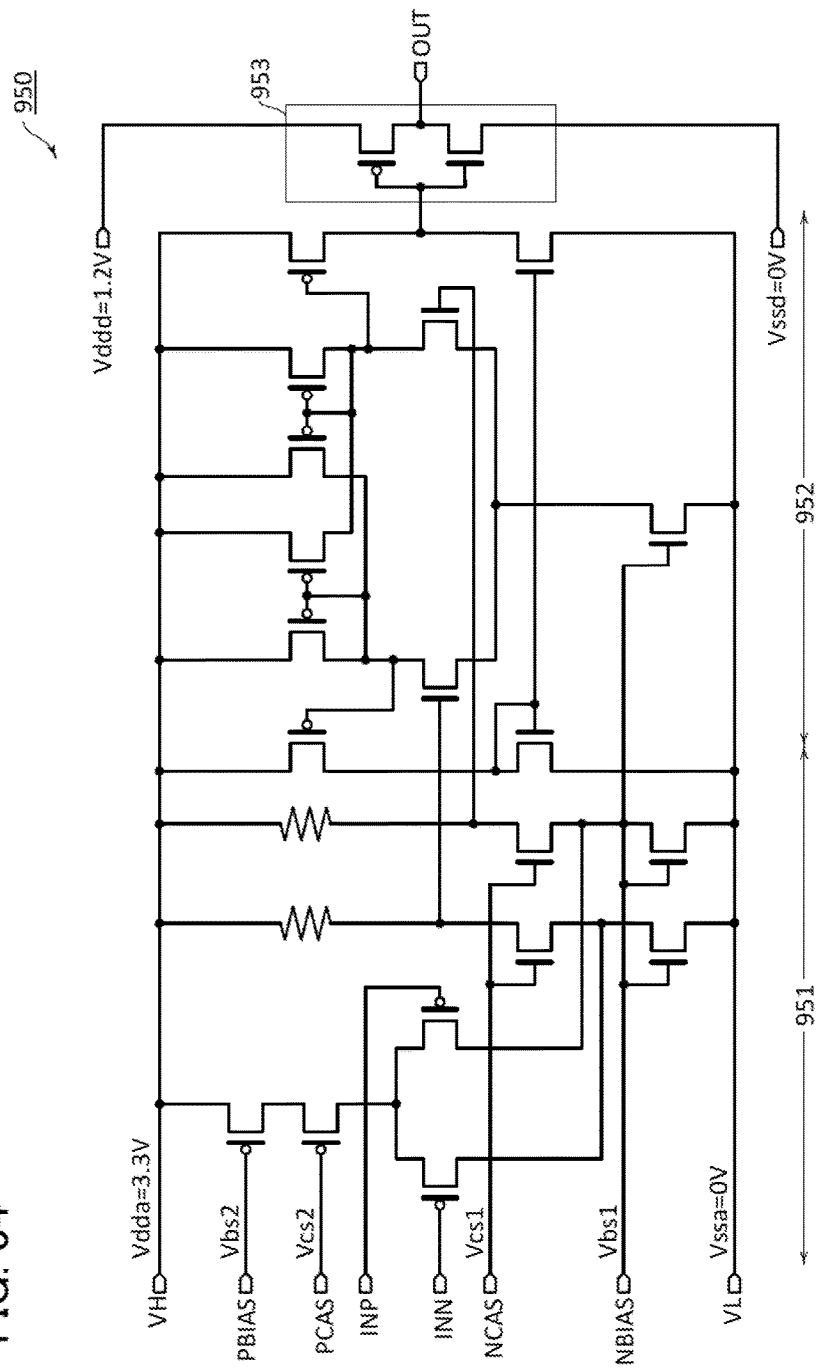
FIG. 34 is a circuit diagram illustrating a configuration example of a receiver of a comparative example.

FIG. 34 illustrates a circuit diagram of the receiver of the comparative example for the simulation. A receiver 950 includes amplifier circuits 951 and 952 and a level shifter 953. All transistors in the receiver 950 are MV devices. The amplifier circuits 951 and 952 correspond to circuits obtained by changing NMOSs and PMOSs of the amplifier circuits 150 and 160 (FIG. 2) to PMOSs and NMOSs. The level shifter 953 is constituted by a CMOS inverter circuit.

Power supply voltages Vdda and Vssa are input to the amplifier circuits 951 and 952, and power supply voltages Vddd and Vssd are input to the level shifter 953. The level shifter 953 is provided to decrease the MV level of a signal that is output from the amplifier circuit 952 to the LV level.

In the simulation, the power supply voltages and bias voltages for the receivers 141 and 950 are set to the following values: Vddd=1.2V, Vssd=0 V, Vdda=3.3 V, Vssa=0 V, Vcs1=0.573 V, Vbs1=0.756 V, Vcs2=0.466 V, and Vbs2=0.623 V.

Whether NMOSs or PMOSs, the MV devices have an equivalent oxide thickness (Tox) of 14.3 nm. The LV NMOS devices have Tox of 2.6 nm, and the LV PMOS devices have Tox of 2.75 nm.

FIGS. 31A to 32C show results of the circuit simulation. SPICE was used as a simulator. By the circuit simulation, the operations of the receivers 141 and 950 with an input of differential clock signals with frequencies of 300 MHz and 750 MHz have been checked.

(Transmission Delay Time)

Figures 31A, 31B, 31C:
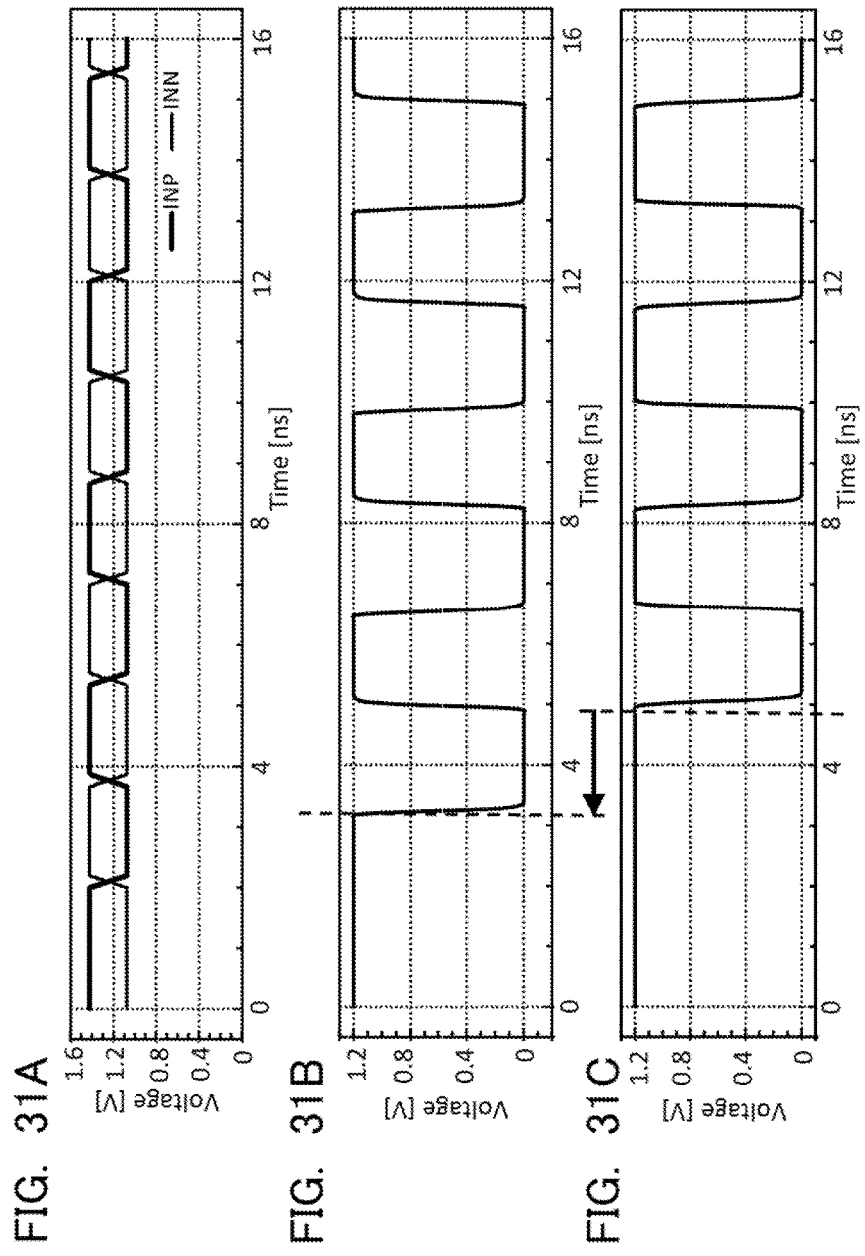
FIGS. 31A to 31C show simulation results.

FIG. 31A shows the waveforms of 300 MHz differential clock signals that are input to the terminals INP and INN of the receivers 141 and 950. The maximum voltage of the terminals INP and INN is 1.425 V, and the minimum voltage thereof is 1.075 V. FIG. 31B shows the waveform of an output signal of the receiver 141 with an input of 300 MHz differential clock signals, and FIG. 31C shows the output waveform of the receiver 950. It can be confirmed that both the receivers 141 and 950 operate normally in response to the input of 300 MHz differential clock signals and that the transmission delay time of the receiver 141 is shorter than that of the receiver 950.

(Operating Frequency)

FIG. 32A shows the waveforms of 750 MHz differential clock signals that are input to the terminals INP and INN of the receivers 141 and 950. The maximum and minimum voltages of the terminals INP and INN are the same as those in FIG. 31A. FIG. 32B shows the waveform of an output signal of the receiver 141 with an input of 750 MHz differential clock signals, and FIG. 32C shows the output waveform of the receiver 950.

As shown in FIG. 32B, in response to the input of the 750 MHz differential clock signals, the receiver 141 outputs a single-ended clock signal and operates normally. In contrast, FIG. 32C shows that the receiver 950 does not operate normally. In other words, it can be confirmed that the receiver 141 has a higher maximum operating frequency than the receiver 950.

This example confirms that the transmission delay time of a receiver can be reduced and the operating frequency thereof can be increased when the receiver is constituted by a circuit which does not require a level shifter in an output stage.

REFERENCE NUMERALS

5: external light, 20, 20R, 20G, 20B, 20W, 21, 22, 23, 25, 25R, 27, 27R, 27G, 27B, 27a, 27b, 27c, 27d, 28, 28a, 28b, 28c, 28d: subpixel, 90: differential transmission system, 100: receiver, 102: interface circuit, 103: internal circuit, 105: transmitter, 106: interface circuit, 108: transmission medium, 110: amplifier circuit, 111: differential pair, 112: current source, 113: load circuit, 120: amplifier circuit, 140, 141, 142, 143, 144: receiver, 150, 151, 160, 161: amplifier circuit, 172: pull-up circuit, 173: pull-down circuit, 174: latch circuit, 175, 176: clocked inverter, 177, 178: inverter, 180: bias voltage generation circuit, 200, 201: LVDS receiver IC, 210: receiver, 212: bias voltage generation circuit, 213: reference current generation circuit, 215: logic circuit, 220: serial-parallel converter circuit, 221: phase locked loop (PLL) circuit, 240, 241, 242: display system, 250: processing unit, 251: execution unit, 252: memory device, 254: power supply circuit, 255: sensor unit, 256: optical sensor device, 257: tilt sensor device, 258: open/close sensor device, 260: touch sensor device, 261: sensor array, 262: touch sensor controller IC, 263, 264: interface circuit, 265: controller circuit unit, 266: driver circuit unit, 267: sense circuit unit, 270, 271: display device, 280, 281, 282, 283: pixel array, 290A, 290B: gate driver circuit, 295: switch array, 295a, 295b: switch circuit, 296: switch array, 296a: switch circuit, 300, 301: display controller IC, 303: source driver IC, 310: interface circuit, 312: LVDS receiver unit, 313: receiver, 314: bias voltage generation circuit, 315: controller unit, 317: driver circuit unit, 318, 320: interface circuit, 322: LVDS receiver unit, 325: controller unit, 327: interface circuit, 328: LVDS transceiver unit, 330: controller, 332: clock generation circuit, 333: timing controller, 334: register, 335: frame memory, 336: line memory, 338: decoder, 340: image processing unit, 341: gamma correction circuit, 342: dimming circuit, 343: toning circuit, 344: EL correction circuit, 351: control logic circuit, 352: shift register, 353: latch circuit, 354: level shifter, 355: digital-analog converter circuit (DAC), 356: amplifier circuit, 360: current detection circuit, 361: control logic circuit, 362: integrator circuit, 363: analog-digital converter circuit (ADC), 364: parallel-serial converter circuit, 372, 373: bias voltage generation circuit, 375: level shifter, 380: interface circuit, 382: LVDS receiver unit, 385: driver circuit unit, 387: interface circuit, 401, 402: substrate, 405: sealant, 406: FPC, 410: transistor layer, 411: EL element layer, 412: LC layer, 415: pixel electrode, 415a: opening, 416: pixel electrode, 417: terminal portion, 418, 419: common electrode, 420: color filter, 424: external light, 425, 426: light, 701, 702: substrate, 704, 705: sealant, 705a, 706a: conductive particle, 706: anisotropic conductive film (ACF), 711, 712, 713: semiconductor layer, 720, 721, 722, 725, 726, 727, 731, 732, 733, 734, 741, 742, 743, 744, 745, 746, 747, 748, 749, 750, 751, 755: conductive layer, 725a, 726a: opening, 752: EL layer, 756, 757: alignment film, 758: overcoat layer, 760_R, 761_R: color filter layer, 762: light-blocking layer, 765, 766: terminal, 728, 770, 771, 772, 773, 774, 775, 776, 777: insulating layer, 780: external light, 781, 782: light, 790: transistor layer, 791: EL element layer, 792: liquid crystal layer, 795: common contact portion, 796: terminal portion, 797: FPC, 900, 950: receiver, 902: interface circuit, 903: internal circuit, 910, 920, 951, 952: amplifier circuit, 911: differential pair, 912: current source, 930, 953: level shifter, 1400: DOSRAM, 1405: controller, 1410: row circuit, 1411: decoder, 1412: word line driver circuit, 1413: column collector, 1414: sense amplifier driver circuit, 1415: column circuit, 1416: global sense amplifier array, 1417: input/output circuit, 1420: memory cell and sense amplifier (MC-SA) array, 1422: memory cell array, 1423: sense amplifier array, 1425: local memory cell array, 1426: local sense amplifier array, 1444: switch array, 1445: memory cell, 1446: sense amplifier, 1447: global sense amplifier, 2010, 2030, 2050, 2070: information terminal, 2011, 2031, 2051, 2071, 2072, 2101, 2121, 2131, 2133, 2171, 2221, 2231, 2251, 2261: housing, 2012, 2032, 2052, 2073, 2074, 2102, 2122, 2132, 2172, 2223, 2232, 2252, 2262: display portion, 2013: operation button, 2014: external connection port, 2015: speaker, 2016: microphone, 2020: wireless signal, 2033: winding crown, 2034: belt, 2035: sensing unit, 2110: display device, 2134: operation key, 2136: joint, 2173:

operation button, 2053: hinge, 2103, 2263: support base, 2120: notebook personal computer, 2123: keyboard, 2124: pointing device, 2130: video camera, 2135: lens, 2170: HMD, 2174: fixing band, 2200: automobile, 2210: navigation system, 2220: rearview monitor, 2222: joint, 2230: rear seat monitor, 2235: headrest, 2250, 2260: medical display device, 2253: support, 5001, 5002: OS transistor, 5010: oxide layer, 5011, 5012, 5013: metal oxide layer, 5021, 5022, 5023, 5024, 5025, 5026, 5027, 5028, 5029, 5030: insulating layer, 5050, 5051, 5052, 5053, 5054: conductive layer, 5200: single crystal silicon wafer, R11, R12: resistor, Rt: resistor, Rd1, Rd2: load, C1, C2, C3, CS1: capacitor, EE1: electroluminescent (EL) element, RE1: liquid crystal (LC) element, NL13, NL14, NL24, NL25, NL26, NL27, NL28, NL29, NL31, NL32, NL33, NL34, NL42, NL51, NL52, NL53, NL54, NM1, NM2, NM11, NM12, M1, M2, M3, M4, M5, M6, MQ1, MS1, MS2, MS3, MS4, MS5, MS6, MS11, MS12, MS13, MS14, MS15, MS16, MS31, MS32, MS33, MS34, MS35, MS36, MW1, PL11, PL12, PL13, PL14, PL21, PL22, PL23, PL24, PL25, PL31, PL32, PL33, PL42: transistor, PM1, PM2, B1, B2, INN1, INN2, INN, INP1, INP2, INP, NBIAS, NCAS, OUT2, OUTN1, OUTP1, OUT, PBIAS, PCAS, STBY, VH, VL: terminal, CE, CKINN, CKINP, M, P1, P2, RCKO, RINN1, RINN2, RINN3, RINN4, RINP1, RINP2, RINP3, RINP4, ROT1, ROT2, ROT3, ROT4, S, VH1, VL1: pin, ANL, CSL, DRL, GLE, GLE1, GLE2, GLL, ML, SLE, SLE1, SLE2, SLL, SNL: wiring, and L10, L11, L12, L13, L14: layer.

This application is based on Japanese Patent Application Serial No. 2016-167915 filed with Japan Patent Office on Aug. 30, 2016, the entire contents of which are hereby incorporated by reference.

The invention claimed is:

1. A receiver configured to receive a first differential signal and output a first single-ended signal, the receiver comprising:
a first input terminal;
a second input terminal;
a first output terminal;
a first amplifier circuit; and
a second amplifier circuit,
wherein the first input terminal and the second input terminal are input terminals for the first differential signal,
wherein the first output terminal is an output terminal for the first single-ended signal,
wherein the first amplifier circuit is a differential input, differential output amplifier circuit,
wherein the second amplifier circuit is a differential input, single-ended output amplifier circuit,
wherein one of two input terminals of the first amplifier circuit is electrically connected to the first input terminal, and the other thereof is electrically connected to the second input terminal,
wherein one of two output terminals of the first amplifier circuit is electrically connected to one of two input terminals of the second amplifier circuit, and the other thereof is electrically connected to the other input terminal of the second amplifier circuit,
wherein an output terminal of the second amplifier circuit is electrically connected to the first output terminal,
wherein a differential pair of the first amplifier circuit comprises a first transistor and a second transistor,
wherein a differential pair of the second amplifier circuit comprises a third transistor and a fourth transistor, and
wherein a withstand voltage of the first transistor and the second transistor is higher than a withstand voltage of the third transistor and the fourth transistor.

2. The receiver according to claim 1,
wherein the first transistor and the second transistor are n-channel transistors, and
wherein the third transistor and the fourth transistor are p-channel transistors.

3. The receiver according to claim 1,
wherein a first power supply voltage is the same as a high-level power supply voltage for a circuit to which the first single-ended signal is input, and
wherein a second power supply voltage is the same as a low-level power supply voltage for the circuit.

4. The receiver according to claim 1,
wherein the first amplifier circuit comprises a fifth transistor and a sixth transistor,
wherein the second amplifier circuit comprises a seventh transistor and an eighth transistor,
wherein the fifth transistor is configured to generate a first bias current to be supplied to the differential pair of the first amplifier circuit,
wherein the sixth transistor is configured to turn off the fifth transistor,
wherein the seventh transistor is configured to generate a second bias current to be supplied to the differential pair of the second amplifier circuit, and
wherein the eighth transistor is configured to turn off the seventh transistor.

5. The receiver according to claim 4,
wherein the first output terminal is electrically connected to a pull-up circuit, and
wherein the pull-up circuit is active when the fifth transistor and the seventh transistor are off.

6. The receiver according to claim 4,
wherein the first output terminal is electrically connected to a pull-down circuit, and
wherein the pull-down circuit is active when the fifth transistor and the seventh transistor are off.

7. The receiver according to claim 4,
wherein the first output terminal is electrically connected to a latch circuit, and
wherein the latch circuit is active when the fifth transistor and the seventh transistor are off.

8. The receiver according to claim 1, wherein the first amplifier circuit is a folded cascode operational amplifier.

9. The receiver according to claim 1, wherein the second amplifier circuit is a buffer operational amplifier.

10. A display device comprising:
a pixel array;
a gate driver circuit; and
a driver IC comprising an interface circuit configured to receive an image signal,
wherein the interface circuit comprises the receiver according claim 1, and
wherein the gate driver circuit and the driver IC are electrically connected to the pixel array.

11. A receiver configured to receive a first differential signal and output a first single-ended signal, the receiver comprising:
a first input terminal;
a second input terminal;
a first output terminal;
a first amplifier circuit; and
a second amplifier circuit, wherein the first input terminal and the second input terminal are input terminals for the first differential signal, wherein the first output terminal is an output terminal for the first single-ended signal, wherein the first amplifier circuit is a differential input, differential output amplifier circuit, wherein the second amplifier circuit is a differential input, single-ended output amplifier circuit, wherein one of two input terminals of the first amplifier circuit is electrically connected to the first input terminal, and the other thereof is electrically connected to the second input terminal, wherein one of two output terminals of the first amplifier circuit is electrically connected to one of two input terminals of the second amplifier circuit, and the other thereof is electrically connected to the other input terminal of the second amplifier circuit, wherein an output terminal of the second amplifier circuit is electrically connected to the first output terminal, wherein a differential pair of the first amplifier circuit comprises a first transistor and a second transistor, wherein a differential pair of the second amplifier circuit comprises a third transistor and a fourth transistor, and wherein a gate insulating layer of each of the first transistor and the second transistor is thicker than a gate insulating layer of each of the third transistor and the fourth transistor.

12. The receiver according to claim 11,
wherein the first transistor and the second transistor are n-channel transistors, and
wherein the third transistor and the fourth transistor are p-channel transistors.

13. The receiver according to claim 11,
wherein a first power supply voltage is the same as a high-level power supply voltage for a circuit to which the first single-ended signal is input, and
wherein a second power supply voltage is the same as a low-level power supply voltage for the circuit.

14. The receiver according to claim 11,
wherein the first amplifier circuit comprises a fifth transistor and a sixth transistor, wherein the second amplifier circuit comprises a seventh transistor and an eighth transistor, wherein the fifth transistor is configured to generate a first bias current to be supplied to the differential pair of the first amplifier circuit, wherein the sixth transistor is configured to turn off the fifth transistor, wherein the seventh transistor is configured to generate a second bias current to be supplied to the differential pair of the second amplifier circuit, and wherein the eighth transistor is configured to turn off the seventh transistor.

15. The receiver according to claim 14,
wherein the first output terminal is electrically connected to a pull-up circuit, and
wherein the pull-up circuit is active when the fifth transistor and the seventh transistor are off.

16. The receiver according to claim 14,
wherein the first output terminal is electrically connected to a pull-down circuit, and
wherein the pull-down circuit is active when the fifth transistor and the seventh transistor are off.

17. The receiver according to claim 14,
wherein the first output terminal is electrically connected to a latch circuit, and
wherein the latch circuit is active when the fifth transistor and the seventh transistor are off.

18. The receiver according to claim 11, wherein the first amplifier circuit is a folded cascode operational amplifier.

19. The receiver according to claim 11, wherein the second amplifier circuit is a buffer operational amplifier.

20. A display device comprising:
a pixel array;
a gate driver circuit; and
a driver IC comprising an interface circuit configured to receive an image signal,
wherein the interface circuit comprises the receiver according claim 11, and
wherein the gate driver circuit and the driver IC are electrically connected to the pixel array.

* * * * *